US012512342B2

(12) United States Patent
Sawashima et al.

(10) Patent No.: US 12,512,342 B2
(45) Date of Patent: Dec. 30, 2025

(54) SUBSTRATE TREATING APPARATUS

(71) Applicant: SCREEN Holdings Co., Ltd., Kyoto (JP)

(72) Inventors: Jun Sawashima, Kyoto (JP); Takahiro Yamaguchi, Kyoto (JP); Saki Miyagawa, Kyoto (JP); Kenji Kobayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 451 days.

(21) Appl. No.: 17/182,535

(22) Filed: Feb. 23, 2021

(65) Prior Publication Data

US 2021/0265177 A1    Aug. 26, 2021

(30) Foreign Application Priority Data

Feb. 26, 2020 (JP) .................................. 2020-030382
Nov. 19, 2020 (JP) .................................. 2020-192413

(51) Int. Cl.
*H01L 21/67* (2006.01)

(52) U.S. Cl.
CPC .... *H01L 21/6715* (2013.01); *H01L 21/67017* (2013.01); *H01L 21/67178* (2013.01); *H01L 21/6719* (2013.01); *H01L 21/67253* (2013.01)

(58) Field of Classification Search
CPC ....................... H01L 21/6715; H01L 21/67253
See application file for complete search history.

(56) References Cited

U.S. PATENT DOCUMENTS 4,160,407 A * 7/1979 Duym .................. B08B 15/023
126/299 R
2008/0023049 A1* 1/2008 Matsumoto ......... H01L 21/6708
134/61

(Continued)

FOREIGN PATENT DOCUMENTS

CN         102315142 A      1/2012
JP         2000-114229 A    4/2000

(Continued)

OTHER PUBLICATIONS

Office Action dated Feb. 7, 2022 for corresponding Taiwan Patent Application No. 110106454.

(Continued)

*Primary Examiner* — Parviz Hassanzadeh
*Assistant Examiner* — Margaret Klunk
(74) *Attorney, Agent, or Firm* — OSTROLENK FABER LLP

(57) ABSTRACT

A substrate treating apparatus includes a treatment housing, a holder, and a liquid supplying unit. The holder is accommodated in the treatment housing. The holder holds a substrate. The liquid supplying unit is accommodated in the treatment housing. The liquid supplying unit supplies a treating liquid to the substrate held by the holder. The substrate treating apparatus further includes two exhaust pipes. The exhaust pipes are each located on a lateral side of the treatment housing. The exhaust pipes each exhaust gas. The substrate treating apparatus includes a switching mechanism. The switching mechanism is located at a level equal to that of the treatment housing. The switching mechanism switches an exhaust path of the treatment housing to one of the two exhaust pipes.

19 Claims, 21 Drawing Sheets

(56) References Cited

U.S. PATENT DOCUMENTS

| | | | |
|---|---|---|---|
| 2011/0308626 A1 | 12/2011 | Ogata et al. ................. 137/2 |
| 2012/0145074 A1* | 6/2012 | Fukutomi ......... H01L 21/67161 |
| | | | 118/58 |
| 2012/0160279 A1 | 6/2012 | Konishi et al. ............. 134/99.1 |
| 2012/0227768 A1* | 9/2012 | Morita ............. H01L 21/67028 |
| | | | 134/18 |
| 2014/0137893 A1* | 5/2014 | Otsuka ............. H01L 21/67028 |
| | | | 134/30 |
| 2015/0090305 A1 | 4/2015 | Wakiyama et al. .......... 134/153 |
| 2015/0252474 A1 | 9/2015 | Itatani et al. |
| 2015/0314338 A1* | 11/2015 | Morioka .................. G03F 7/30 |
| | | | 137/861 |
| 2016/0126112 A1* | 5/2016 | Minamida ........ H01L 21/67173 |
| | | | 134/94.1 |
| 2017/0008044 A1* | 1/2017 | Okumura .......... H01L 21/67028 |
| 2017/0028450 A1* | 2/2017 | Goda ................. H01L 21/6708 |
| 2017/0084470 A1* | 3/2017 | Suzuki ...................... F26B 3/04 |
| 2018/0090352 A1 | 3/2018 | Sotoku et al. |
| 2019/0201949 A1 | 7/2019 | Okita et al. |
| 2019/0295863 A1* | 9/2019 | Inagaki ............. H01L 21/67742 |

FOREIGN PATENT DOCUMENTS

| | | | |
|---|---|---|---|
| JP | 2002-057135 A | 2/2002 | |
| JP | 2002198343 A * | 7/2002 | |
| JP | 2010-065617 A | 3/2010 | |
| JP | 2012-038968 A | 2/2012 | |
| JP | 2012-190823 A | 10/2012 | |
| JP | 2015-088734 A | 5/2015 | |
| JP | 2015-181149 A | 10/2015 | |
| JP | 2016-092143 A | 5/2016 | |
| JP | 2017-022197 A | 1/2017 | |
| JP | 2017-033988 A | 2/2017 | |
| JP | 2019-016818 A | 1/2019 | |
| JP | 2019-169681 A | 10/2019 | |
| JP | 2020-043158 A | 3/2020 | |
| KR | 10-1332599 B1 | 11/2013 | |
| KR | 2015039063 A * | 4/2015 | ......... H01L 21/0273 |
| KR | 10-2015-0102998 A | 9/2015 | |
| KR | 10-2015-0105218 A | 9/2015 | |
| KR | 10-2016-0052346 A | 5/2016 | |
| KR | 10-2019-0112666 A | 10/2019 | |
| WO | WO 2014/103523 A1 | 7/2014 | |

OTHER PUBLICATIONS

Office Action dated Jul. 20, 2024 for corresponding Chinese Patent Application No. 202110220015.9.

Office Action dated Mar. 6, 2025 for corresponding Japanese Patent Application No. 2024-091671.

* cited by examiner

FIG. 3
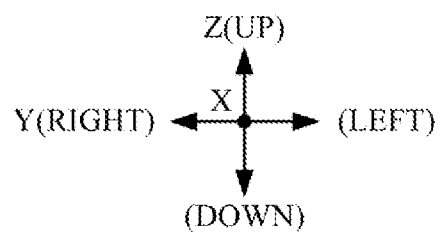
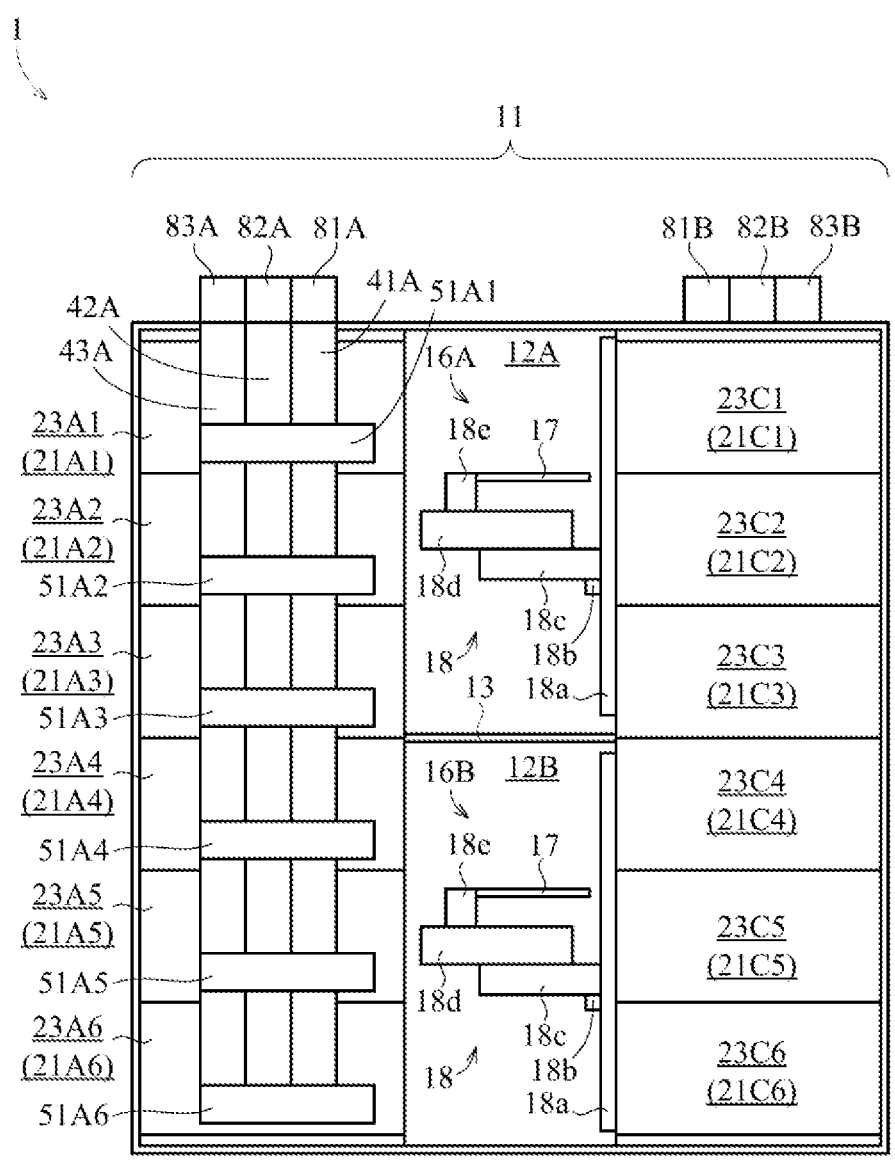

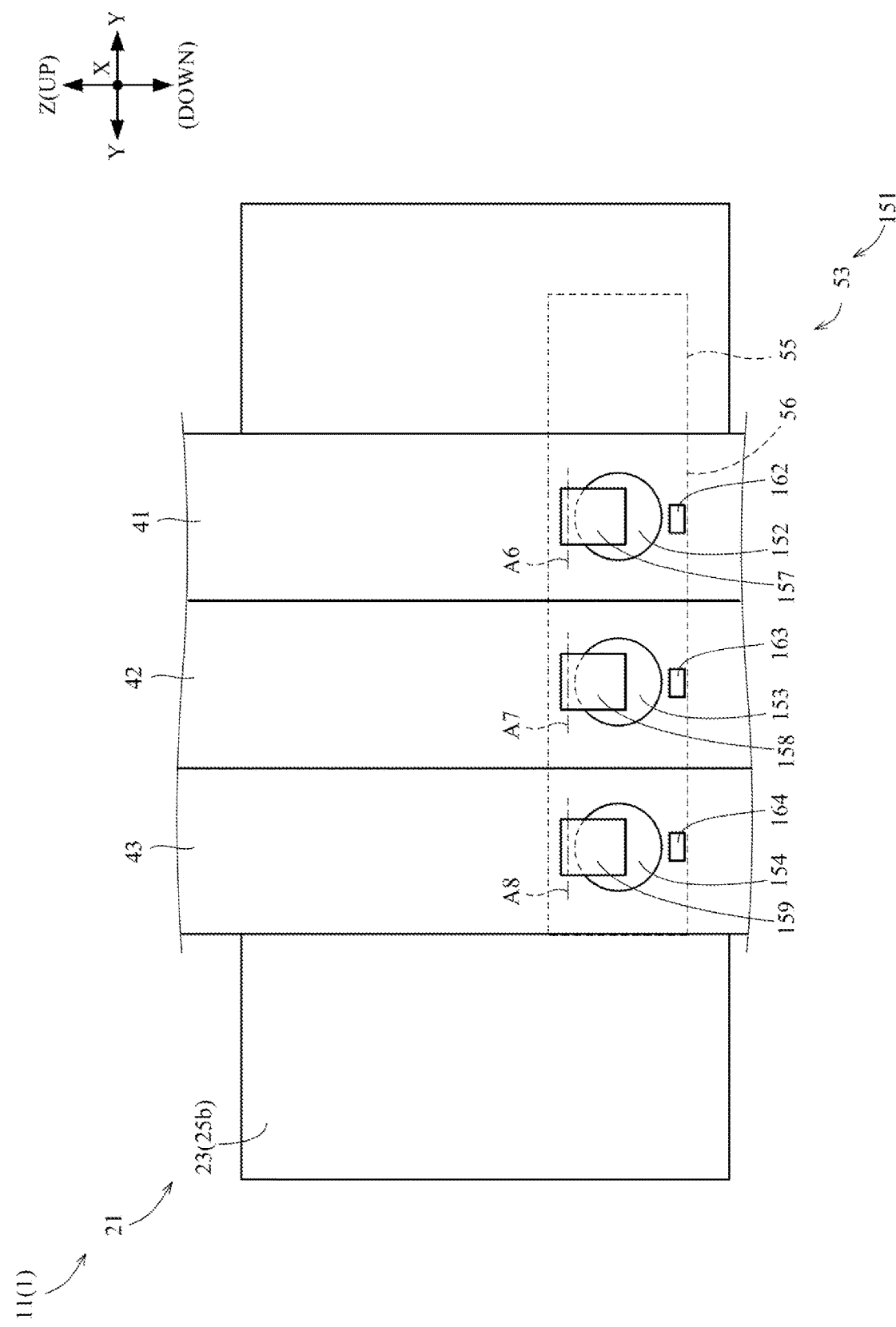

SUBSTRATE TREATING APPARATUS

CROSS-REFERENCE TO RELATED APPLICATIONS

This application claims priority to Japanese Patent Application No. 2020-030382 filed Feb. 26, 2020, and Japanese Patent Application No. 2020-192413 filed Nov. 19, 2020, the disclosure of which is hereby incorporated herein by reference in its entirety for all purposes.

BACKGROUND OF THE INVENTION

Field of the Invention

The present invention relates to a substrate treating apparatus that performs a treatment to substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

Description of the Related Art

Japanese Patent Publication No. 2019-16818A discloses a substrate treating system. Hereinunder, numerals in Japanese Patent Publication No. 2019-16818A are expressed in parentheses. The substrate treating system (1) includes a treating unit (16) for treating wafers (W). The treating unit (16) includes a chamber (20), a substrate holding mechanism (30), and a treating fluid supplying unit (40). The chamber (20) is a treatment housing. The substrate holding mechanism (30) and the treating fluid supplying unit (40) are arranged inside of the chamber (20). The substrate holding mechanism (30) holds a wafer W. The treating fluid supplying unit (40) supplies treating fluid to the wafer W held by the substrate holding mechanism (30). Examples of the treating fluid include an alkaline treating liquid, an acid treating liquid, and an organic treating liquid.

The substrate treating system (1) includes a second exhaust pipe (200), an exhaust switching unit (300), and three separated exhaust pipes (101, 102, 103). The second exhaust pipe (200) connects the chamber (20) to the exhaust switching unit (300). The second exhaust pipe (200) includes a horizontal member (201) and an ascending member (202). The horizontal member (201) is connected to the chamber (20). The horizontal member (201) extends horizontally from the chamber (20). The ascending member (202) extends upward from the horizontal member (201). The ascending member (202) has an upper end. The upper end of the ascending member (202) is connected to the exhaust switching unit (300). The exhaust switching unit (300) is also connected to the three separated exhaust pipes (101, 102, 103). The exhaust switching unit (300) causes the second exhaust pipe (200) to be in communication with one of the three separated exhaust pipes (101, 102, 103). Gas within the chamber (20) flows into the one of the three separated exhaust pipes (101, 102, 103) via the second exhaust pipe (200).

When the treating fluid supplying unit (40) supplies an alkaline treating liquid, for example, the exhaust switching unit (300) causes the second exhaust pipe (200) to be in communication with the separated exhaust pipe (101). When the treating fluid supplying unit (40) supplies an acid treating liquid, the exhaust switching unit (300) causes the second exhaust pipe (200) to be in communication with the separated exhaust pipe (102). When the treating fluid supplying unit (40) supplies an organic treating liquid, the exhaust switching unit (300) causes the second exhaust pipe (200) to be in communication with the separated exhaust pipe (103). As a result, when the alkaline treating liquid is used within the chamber (20), the separated exhaust pipe (101) exhausts gas in the chamber (20). When the acid treating liquid is used within the chamber (20), the separated exhaust pipe (102) exhausts gas in the chamber (20). When the organic treating liquid is used within the chamber (20), the separated exhaust pipe (103) exhausts gas in the chamber (20).

The exhaust switching unit (300) is positioned higher than the treating unit (16). The ascending member (202) of the second exhaust pipe (200) extends to a position higher than the treating unit (16). Accordingly, mist contained in the gas is unlikely to move upward through the ascending member (202). The mist is unlikely to move upward to the exhaust switching unit (300). This can protect the exhaust switching unit (300) from the mist.

As described above, the exhaust switching unit (300) is positioned higher than the treating unit (16). Accordingly, the separated exhaust pipes (101, 102, 103) are also positioned higher than the treating unit (16).

SUMMARY OF THE INVENTION

However, the substrate treating system (1) disclosed in Japanese Patent Publication No. 2019-16818A possesses the following drawbacks. The chamber (20) is connected to the exhaust switching unit (300) via the second exhaust pipe (200). Since the exhaust switching unit (300) is positioned higher than the treating unit (16), the second exhaust pipe (200) includes the ascending member (202). Accordingly, the second exhaust pipe (200) is relatively long.

Gas within the chamber (20) always flows into the second exhaust pipe (200). Even when any one of the alkaline treating liquid, the acid treating liquid, and the organic treating liquid is used within the chamber (20), for example, the second exhaust pipe (200) exhausts gas in the chamber (20).

As described above, the second exhaust pipe (200) is relatively long and exhausts various types of gas, leading to easy contamination and damages on the second exhaust pipe (200). For example, crystals (salt) is generated easily within the second exhaust pipe (200). For example, crystals (salt) is accumulated easily within the second exhaust pipe (200).

If the second exhaust pipe (200) is contaminated and damaged, gas does not flow smoothly in the second exhaust pipe (200). That is, the second exhaust pipe (200) cannot exhaust gas in the chamber (20) smoothly. Accordingly, regular maintenance of the second exhaust pipe (200) is necessarily performed. Examples of the maintenance of the second exhaust pipe (200) include cleaning of the second exhaust pipe (200) and exchange of the second exhaust pipe (200).

The treating unit (16) cannot treat any wafer (W) while the maintenance of the second exhaust pipe (200) is performed. The substrate treating system (1) stops a treatment of the wafer (W) when the maintenance of the second exhaust pipe (200) is performed. This leads to decreased throughput of the substrate treating system (1).

The present invention has been made regarding the state of the art noted above, and its one object is to provide a substrate treating apparatus that can exhaust gas within a treatment housing suitably.

To achieve the object, the present invention provides a configuration as follows. One aspect of the present invention provides a substrate treating apparatus. The substrate treating apparatus includes a first treatment housing, a first holder arranged inside of the first treatment housing and configured to hold a substrate, a first liquid supplying unit arranged inside of the first treatment housing and configured to supply a treating liquid to the substrate held by the first holder, a first exhaust pipe arranged laterally of the first treatment housing and configured to exhaust gas, a second exhaust pipe arranged laterally of the first treatment housing and configured to exhaust gas, and a first switching mechanism positioned at a level equal to that of the first treatment housing and configured to switch an exhaust path of the first treatment housing to either the first exhaust pipe or the second exhaust pipe.

The substrate treating apparatus includes the first treatment housing, the first holder, and the first liquid supplying unit. The substrate treating apparatus supplies a treating liquid to a substrate within the first treatment housing. That is, the substrate treating apparatus performs a liquid treatment to a substrate within the first treatment housing.

The substrate treating apparatus includes the first exhaust pipe, the second exhaust pipe, and the first switching mechanism. The first switching mechanism switches the exhaust path of the first treatment housing to either the first exhaust pipe or the second exhaust pipe. Specifically, the first switching mechanism switches between a first state and a second state. In the first state, the first treatment housing is in communication with the first exhaust pipe, and the first treatment housing is blocked from the second exhaust pipe. In the second state, the first treatment housing is in communication with the second exhaust pipe, and the first treatment housing is blocked from the first exhaust pipe. If the exhaust path of the first treatment housing is the first exhaust pipe, gas is exhausted from the first treatment housing through the first exhaust pipe, and thus no gas is exhausted from the first treatment housing through the second exhaust pipe. If the exhaust path of the first treatment housing is the second exhaust pipe, gas is exhausted from the first treatment housing through the second exhaust pipe, and thus no gas is exhausted from the first treatment housing through the first exhaust pipe.

The first switching mechanism is located at a level equal to that of the first treatment housing. Accordingly, a channel between the first treatment housing and the first switching mechanism can be shortened appropriately. This achieves suitable suppression of contamination and damages on the channel between the first treatment housing and the first switching mechanism. Consequently, gas flows smoothly from the first treatment housing to the first switching mechanism. As a result, gas in the first treatment housing can be exhausted suitably.

The first exhaust pipe is located laterally of the first treatment housing. Accordingly, the first switching mechanism can be connected to the first exhaust pipe easily. The second exhaust pipe is located laterally of the first treatment housing. Accordingly, the first switching mechanism can be connected to the second exhaust pipe easily.

As described above, the substrate treating apparatus according to this aspect can exhaust gas in the first treatment housing suitably.

It is preferred in the substrate treating apparatus described above that the first switching mechanism is positioned at a level equal to or lower than an upper end of the first holder. The first switching mechanism has a relatively small size. This can suppress upsizing of the substrate treating apparatus suitably.

It is preferred in the substrate treating apparatus described above that the first switching mechanism is positioned so as not to overlap the first holder in plan view. This can avoid interference between the first switching mechanism and the first holder easily.

It is preferred in the substrate treating apparatus described above that the first exhaust pipe extends in a vertical direction and the second exhaust pipe extends in the vertical direction. This can achieve reduction of installation spaces of the first exhaust pipe and the second exhaust pipe in plan view suitably.

It is preferred that the substrate treating apparatus described above further includes a transportation space extending in a first horizontal direction and located adjacent to the first treatment housing, a transport mechanism arranged in the transportation space and configured to transport a substrate to the first holder, and a first piping space located adjacent to the first treatment housing and configured to accommodate the first exhaust pipe and the second exhaust pipe, the first treatment housing and the first piping space align in the first direction, and the first exhaust pipe and the second exhaust pipe align in a second horizontal direction orthogonal to the first direction. The substrate treating apparatus incudes the transportation space and the transport mechanism. The transportation space is located adjacent to the first treatment housing. Accordingly, the transport mechanism can transport a substrate to the first holder easily. The substrate treating apparatus includes the first piping space. This can arrange the first exhaust pipe and the second exhaust pipe suitably. The first piping space is located adjacent to the first treatment housing. This can arrange the first exhaust pipe and the second exhaust pipe to positions close to the first treatment housing. The transportation space extends in the first direction. The first treatment housing and the first piping space align in the first direction. Accordingly, the transportation space, adjacent to the first treatment housing, and the first piping space, adjacent to the first treatment housing, can be located suitably. This can prevent interference of the transport mechanism with the first exhaust pipe and the second exhaust pipe suitably. The first piping space and the first treatment housing align in the first direction. The first exhaust pipe and the second exhaust pipe align in the second direction. This can arrange the first exhaust pipe and the second exhaust pipe to positions close to the first treatment housing.

It is preferred in the substrate treating apparatus described above that at least part of the first switching mechanism is arranged in the first piping space. This can arrange the first switching mechanism close to the first treatment housing.

It is preferred in the substrate treating apparatus described above that the first switching mechanism includes a first opening and closing portion and a second opening and closing portion. The first opening and closing portion is movable between a position to communicate the first treatment housing with the first exhaust pipe and a position to block the first treatment housing from the first exhaust pipe. The second opening and closing portion is movable independently of the first opening and closing portion between a position to communicate the first treatment housing with the second exhaust pipe and a position to block the first treatment housing from the second exhaust pipe. The first opening and closing portion and the second opening and closing portion are movable independently. Accordingly, the first switching mechanism can bring the first exhaust pipe and the second exhaust pipe individually into communication with the first treatment housing. The switching mechanism can block the first exhaust pipe and the second exhaust pipe individually from the first treatment housing.

It is preferred in the substrate treating apparatus described above that the first switching mechanism includes a switch housing that is connected to the first treatment housing and accommodates the first opening and closing portion and the second opening and closing portion. The switch housing can suitably form a channel between the first treatment housing and the first and second opening and closing portions.

It is preferred in the substrate treating apparatus described above that the switch housing includes an introducing portion and a distributing portion. The introducing portion is connected to the first treatment housing, and extends in the first direction. The distributing portion is connected to the introducing portion, extends in the second direction, is connected to both the first exhaust pipe and the second exhaust pipe, and accommodates both the first opening and closing portion and the second opening and closing portion. The introducing portion is connected to the first treatment housing. Accordingly, gas can be introduced easily from the first treatment housing to the switch housing. The introducing portion extends in the first direction. As described above, the transportation space extends in the first direction. Accordingly, the transportation space, adjacent to the first treatment housing, and the introducing portion, connected to the first treatment housing, can be located suitably. This can prevent interference of the transport mechanism with the introducing portion suitably. The distributing portion is connected to the introducing portion. The distributing portion is connected to the first exhaust pipe and the second exhaust pipe. Accordingly, gas can be exhausted easily from the switch housing to the first exhaust pipe or second exhaust pipe easily. The distributing portion accommodates both the first opening and closing portion and the second opening and closing portion. Accordingly, the first switching mechanism can easily switch the exhaust path of the first treatment housing to either the first exhaust pipe or the second exhaust pipe. The distributing portion extends in the second direction. As described above, the first exhaust pipe and the second exhaust pipe align in the second direction. Accordingly, the distributing portion can be connected to the first exhaust pipe and the second exhaust pipe easily.

It is preferred in the substrate treating apparatus described above that a separation distance between the introducing portion and the transportation is smaller than a separation distance between the first holder and the transportation space in plan view. The introducing portion is positioned relatively adjacent to the transportation space. Accordingly, gas can be introduced smoothly from the first treatment housing to the switch housing.

It is preferred that the substrate treating apparatus described above further includes a gas supply pipe configured to supply gas to the first treatment housing, and a second piping space adjacent to the first treatment housing and configured to accommodate the gas supply pipe, and that the first piping space, the first treatment housing, and the second piping space align in this order in the first direction. The substrate treating apparatus includes the gas supply pipe and the second piping space. The second piping space is located adjacent to the first treatment housing. Accordingly, the gas supply pipe can supply gas to the first treatment housing easily. The first piping space, the first treatment housing, and the second piping space align in this order in the first direction. Accordingly, the first piping space and the second piping space are spaced apart from each other by the first treatment housing. Consequently, the gas supply pipe provides no limitation in arrangement of the first exhaust pipe and the second exhaust pipe. That is, enhanced flexibility of the arrangement of first exhaust pipe and the second exhaust pipe can be obtained suitably.

It is preferred that the substrate treating apparatus further includes a second treatment housing located below the first treatment housing, a second holder arranged inside of the second treatment housing and configured to hold a substrate, a second liquid supplying unit arranged inside of the second treatment housing and configured to supply a treating liquid to the substrate held by the second holder, and a second switching mechanism positioned at a level equal to that of the second treatment housing and configured to switch an exhaust path of the second treatment housing to either the first exhaust pipe or the second exhaust pipe.

The substrate treating apparatus includes the second treatment housing, the second holder, and the second liquid supplying unit. Consequently, a liquid treatment can be performed to a substrate within the second treatment housing. This achieves suitably enhanced throughput of the substrate treating apparatus.

The second treatment housing is located below the first treatment housing. This can suppress increase in footprint of the substrate treating apparatus suitably.

The substrate treating apparatus includes the second switching mechanism. The second switching mechanism switches the exhaust path of the second treatment housing to either the first exhaust pipe or the second exhaust pipe. Specifically, the second switching mechanism switches between a third state and a fourth state. In the third state, the second treatment housing is in communication with the first exhaust pipe, and the second treatment housing is blocked from the second exhaust pipe. In the fourth state, the second treatment housing is in communication with the second exhaust pipe, and the second treatment housing is blocked from the first exhaust pipe. If the exhaust path of the second treatment housing is the first exhaust pipe, gas is exhausted from the second treatment housing through the first exhaust pipe, and thus no gas is exhausted from the second treatment housing through the second exhaust pipe. If the exhaust path of the second treatment housing is the second exhaust pipe, gas is exhausted from the second treatment housing through the second exhaust pipe, and thus no gas is exhausted from the second treatment housing through the first exhaust pipe. Consequently, the first exhaust pipe exhausts gas from the second treatment housing in addition to the gas from the first treatment housing. The second exhaust pipe also exhausts gas from the second treatment housing in addition to the gas from the first treatment housing. This achieves a simplified configuration of the substrate treating apparatus.

The second switching mechanism is located at a level equal to that of the second treatment housing. Accordingly, a channel between the second treatment housing and the second switching mechanism can be shortened suitably. This achieves suitable suppression of contamination and damages on the channel between the second treatment housing and the second switching mechanism. Consequently, gas flows smoothly from the second treatment housing to the second switching mechanism. As a result, gas in the second treatment housing can be exhausted suitably.

As described above, the substrate treating apparatus according to this aspect can exhaust gas in the second treatment housing suitably in addition to the gas from the first treatment housing.

It is preferred in the substrate treating apparatus described above that the second treatment housing is located at a position equal to that of the first treatment housing in plan view, the second switching mechanism is located at a position equal to that of the first switching mechanism in plan view, the first exhaust pipe extends in a vertical direction, and the second exhaust pipe extends in the vertical direction. The second treatment housing is located at the position equal to that of the first treatment housing in plan view. The second switching mechanism is located at the position equal to that of the first switching mechanism in plan view. Accordingly, a relative position between the second treatment housing and the second switching mechanism is substantially the same as a relative position between the first treatment housing and the first switching mechanism. Consequently, a condition of exhausting gas can be made common easily between the first treatment housing and the second treatment housing. This results in equal quality of treatments to substrates between the first treatment housing and the second treatment housing suitably. The first exhaust pipe extends in the vertical direction. Accordingly, the first switching mechanism and the second switching mechanism can each be connected to the first exhaust pipe easily. The second exhaust pipe extends in the vertical direction. Accordingly, the first switching mechanism and the second switching mechanism can each be connected to the second exhaust pipe easily.

It is preferred that the substrate treating apparatus described above includes a third treatment housing positioned at a level equal to that of the first treatment housing, a third holder arranged inside of the third treatment housing and configured to hold a substrate, a third liquid supplying unit arranged inside of the third treatment housing and configured to supply a treating liquid to the substrate held by the third holder, a third exhaust pipe arranged laterally of the third treatment housing and configured to exhaust gas, a fourth exhaust pipe arranged laterally of the third treatment housing and configured to exhaust gas, and a third switching mechanism positioned at a level equal to that of the third treatment housing and configured to switch an exhaust path of the third treatment housing to either the third exhaust pipe or the fourth exhaust pipe.

The substrate treating apparatus includes the third treatment housing, the third holder, and the third liquid supplying unit. Consequently, a liquid treatment can be performed to a substrate within the third treatment housing. This achieves suitably enhanced throughput of the substrate treating apparatus.

The third treatment housing is located at the level equal to that of the first treatment housing. The substrate treating apparatus includes the third switching mechanism, the third exhaust pipe, and the fourth exhaust pipe. The third switching mechanism switches the exhaust path of the third treatment housing to either the third exhaust pipe or the fourth exhaust pipe. Specifically, the third switching mechanism switches between a fifth state and a sixth state. In the fifth state, the third treatment housing is in communication with the third exhaust pipe, and the third treatment housing is blocked from the fourth exhaust pipe. In the sixth state, the third treatment housing is in communication with the fourth exhaust pipe, and the third treatment housing is blocked from the third exhaust pipe. If the exhaust path of the third treatment housing is the third exhaust pipe, gas is exhausted from the third treatment housing through the third exhaust pipe, and thus no gas is exhausted from the third treatment housing through the fourth exhaust pipe. If the exhaust path of the third treatment housing is the fourth exhaust pipe, gas is exhausted from the third treatment housing through the fourth exhaust pipe, and thus no gas is exhausted from the third treatment housing through the third exhaust pipe.

The third switching mechanism is located at a level equal to that of the third treatment housing. Accordingly, a channel between the third treatment housing and the third switching mechanism can be shortened suitably. This achieves suitable suppression of contamination and damages on the channel between the third treatment housing and the third switching mechanism. Consequently, gas flows smoothly from the third treatment housing to the third switching mechanism. As a result, gas in the third treatment housing can be exhausted suitably.

The third exhaust pipe is located laterally of the third treatment housing. Accordingly, the third switching mechanism can be connected to the third exhaust pipe easily. The fourth exhaust pipe is located laterally of the third treatment housing. Accordingly, the third switching mechanism can be connected to the fourth exhaust pipe easily.

As described above, the substrate treating apparatus according to this aspect can exhaust gas in the third treatment housing suitably.

It is preferred that the substrate treating apparatus described above includes a first pressure sensor configured to measure pressure of gas on a primary side of the first switching mechanism, a first pressure adjustment mechanism configured to adjust the pressure of gas on the primary side of the first switching mechanism in accordance with a detection result by the first pressure sensor, a third pressure sensor configured to measure pressure of gas on a primary side of the third switching mechanism, and a third pressure adjustment mechanism configured to adjust the pressure of gas on the primary side of the third switching mechanism in accordance with a detection result by the third pressure sensor. The substrate treating apparatus includes the first pressure sensor and the first pressure adjustment mechanism. Accordingly, the pressure of gas on the primary side of the first switching mechanism can be adjusted suitably. Likewise, the substrate treating apparatus includes the third pressure sensor and the third pressure adjustment mechanism. Accordingly, the pressure on the primary side of the third switching mechanism can be adjusted suitably.

It is preferred in the substrate treating apparatus described above that the first pressure adjustment mechanism and the third pressure adjustment mechanism adjust the pressure of gas on the primary side of the first switching mechanism to be equal to the pressure of gas on the primary side of the third switching mechanism. This achieves equal quality of treatments to substrates between the first treatment housing and the third treatment housing suitably.

It is preferred that the substrate treating apparatus described above includes a fifth exhaust pipe and a sixth exhaust pipe. The fifth exhaust pipe is connected to the first exhaust pipe and the third exhaust pipe, and is configured to exhaust gas in the first exhaust pipe and gas in the third exhaust pipe. The sixth exhaust pipe is connected to the second exhaust pipe and the fourth exhaust pipe, and is configured to exhaust gas in the second exhaust pipe and gas in the fourth exhaust pipe. This achieves a simplified configuration of the substrate treating apparatus.

It is preferred that the substrate treating apparatus described above includes a fifth pressure sensor configured to measure pressure of gas in the fifth exhaust pipe, a fifth pressure adjustment mechanism configured to adjust the pressure of gas in the fifth exhaust pipe in accordance with a detection result by the fifth pressure sensor, a sixth pressure sensor configured to measure pressure of gas in the sixth exhaust pipe, and a sixth pressure adjustment mechanism configured to adjust the pressure of gas in the sixth exhaust pipe in accordance with a detection result by the sixth pressure sensor. The substrate treating apparatus includes the fifth pressure sensor and the fifth pressure adjustment mechanism. Accordingly, the pressure in the fifth exhaust pipe can be adjusted suitably. Likewise, the substrate treating apparatus includes the sixth pressure sensor and the sixth pressure adjustment mechanism. Accordingly, the pressure in the sixth exhaust pipe can be adjusted suitably.

It is preferred in the substrate treating apparatus described above that the fifth pressure sensor is arranged downstream of a connecting position of the first exhaust pipe and the fifth exhaust pipe, and a connecting position of the third exhaust pipe and the fifth exhaust pipe, and the sixth pressure sensor is arranged downstream of a connecting position of the second exhaust pipe and the sixth exhaust pipe, and a connecting position of the fourth exhaust pipe and the sixth exhaust pipe. The fifth pressure sensor can detect entire exhaust pressure of the first exhaust pipe and the third exhaust pipe suitably. The sixth pressure sensor can detect entire exhaust pressure of the second exhaust pipe and the fourth exhaust pipe suitably.

It is preferred in the substrate treating apparatus described above that the first liquid supplying unit is capable of supplying a first treating liquid and a second treating liquid, the first switching mechanism switches the exhaust path of the first treatment housing to the first exhaust pipe when the first liquid supplying unit supplies the first treating liquid, and the first switching mechanism switches the exhaust path of the first treatment housing to the second exhaust pipe when the first liquid supplying unit supplies the second treating liquid. When the first liquid supplying unit supplies the first treating liquid, the first exhaust pipe exhausts gas in the first treatment housing. When the first liquid supplying unit supplies the second treating liquid, the first exhaust pipe does not exhaust gas in the first treatment housing. Consequently, contamination and damages in the first exhaust pipe can be suppressed suitably. Likewise, when the first liquid supplying unit supplies the second treating liquid, the second exhaust pipe exhausts gas in the first treatment housing. When the first liquid supplying unit supplies the first treating liquid, the second exhaust pipe does not exhaust gas in the first treatment housing. Consequently, contamination and damages in the second exhaust pipe can be suppressed suitably. As a result, gas in the first treatment housing can be exhausted more suitably.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 3 is a front view of a treating block.

FIG. 18 is a front view of a switching mechanism according to the modification.

DESCRIPTION OF EMBODIMENTS

The following describes a substrate treating apparatus of the present invention with reference to the drawings.

Outline of Substrate Treating Apparatus

Figure 1:
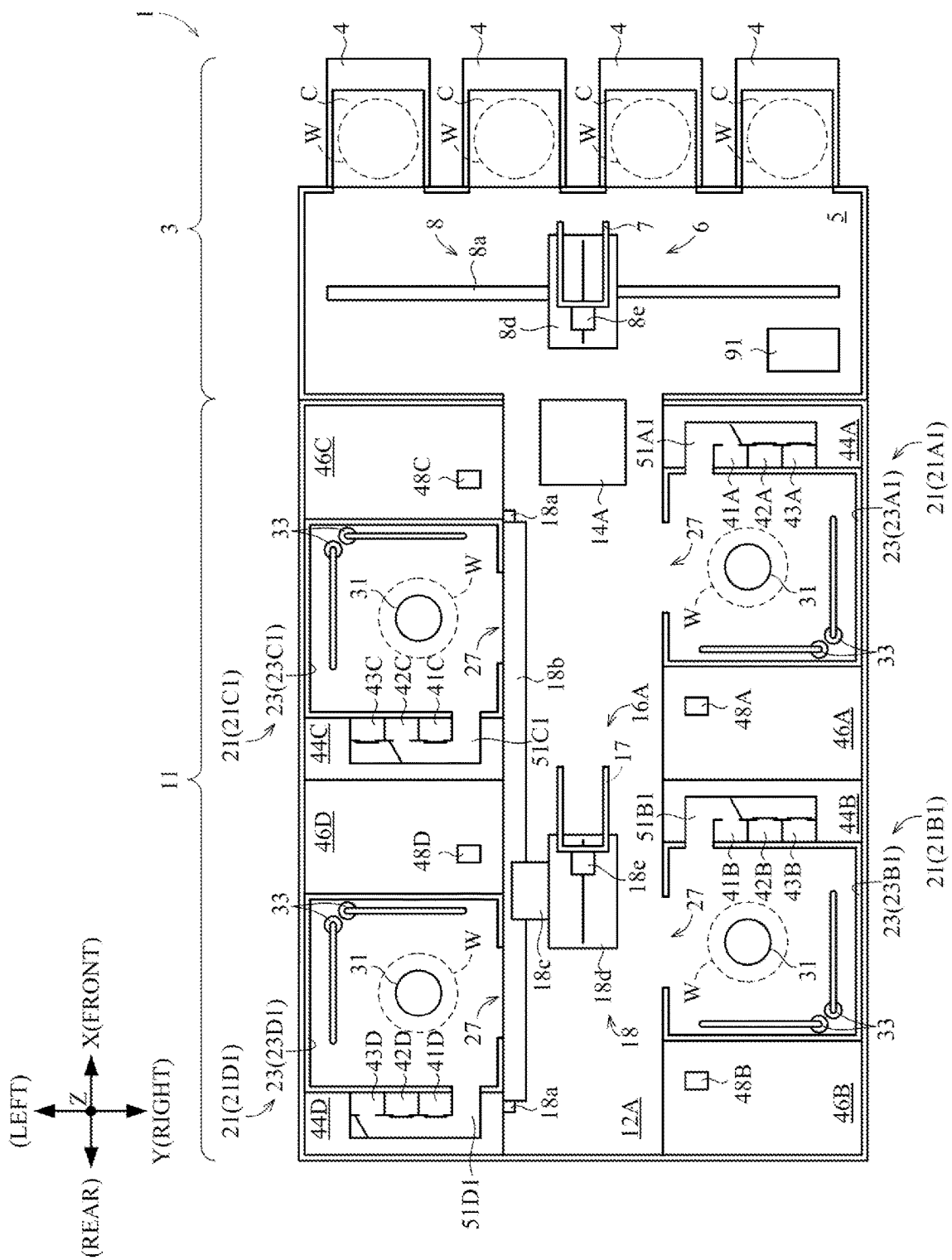
FIG. 1 is a plan view of an interior of a substrate treating apparatus according to one embodiment.

FIG. 1 is a plan view of an interior of a substrate treating apparatus according to one embodiment. A substrate treating apparatus 1 performs a treatment to substrates (e.g., semiconductor wafers) W.

Examples of the substrate W include a semiconductor wafer, a substrate for liquid crystal display, a substrate organic electroluminescence (EL), a substrate for flat panel display (FPD), a substrate for optical display, a magnetic disk substrate, an optical disk substrate, a magneto-optical disk substrate, a substrate for photomask, and a solar cell substrate. The substrate W has a thin and flat plate shape. The substrate W has a substantially circular shape in plan view.

The substrate treating apparatus 1 includes an indexer 3, and a treating block 11. The treating block 11 is connected to the indexer 3. The indexer 3 and the treating block 11 are arranged side by side in a horizontal direction. The indexer 3 supplies a substrate W to the treating block 11. The treating block 11 performs a treatment to the substrate W. The indexer 3 collects the substrate W from the treating block 11.

In this specification, the horizontal direction in which the indexer 3 and the treating block 11 are arranged is referred to as a "front-back direction X" for convenience. One direction of the front-back direction X from the treating block 11 to the indexer 3 is referred to as "forward". The direction opposite to the forward direction is referred to as "rearward". A horizontal direction orthogonal to the front-back direction X is referred to as a "width direction Y". Moreover, one direction of the width direction Y is referred to as "rightward", as appropriate. The direction opposite to rightward is referred to as "leftward". The perpendicular direction relative to the horizontal direction is referred to as a "vertical direction Z". For reference, the drawings show front, rear, right, left, up, and down, as appropriate.

When no distinction is particularly made among "frontward", "rearward", "rightward", and "leftward", a simple term "lateral" is to be described.

The indexer 3 includes a plurality of (e.g., four) carrier platforms 4. The carrier platforms 4 are arranged side by side in the width direction Y. The carrier platforms 4 each include one carrier C placed thereon. The carrier C accommodates a plurality of substrates W. The carrier C is, for example, a front opening unified pod (FOUP).

The indexer 3 includes a transportation space 5. The transportation space 5 is located rearward of the carrier platforms 4. The transportation space 5 extends in the width direction Y.

The indexer 3 includes a transport mechanism 6. The transport mechanism 6 is arranged in the transportation space 5. The transport mechanism 6 is located rearward of the carrier platforms 4. The transport mechanism 6 transports substrates W. The transport mechanism 6 is accessible to the carriers C placed on the carrier platforms 4, respectively.

The treating block 11 includes a transportation space 12A. The transportation space 12A is located at the middle part of the treating block 11 in the width direction Y. The transportation space 12A extends in the front-back direction X. A front part of the transportation space 12A is in connection with the transportation space 5 of the indexer 3.

The treating block 11 includes a substrate platform 14A. The substrate platform 14A is arranged in the transportation space 12A. The substrate platform 14A is located in the front part of the transportation space 12A. The transport mechanism 6 of the indexer 3 is also accessible to the substrate platform 14A. The substrate platform 14A places the substrates W thereon.

The treating block 11 includes a transport mechanism 16A. The transport mechanism 16A is arranged in the transportation space 12A. The transport mechanism 16A transports substrates W. The transport mechanism 16A is accessible to the substrate platform 14A.

The treating block 11 includes treating units 21A1, 21B1, 21C1, and 21D1. The treating units 21A1 and 21B1 are located rightward of the transportation space 12A. The treating units 21A1 and 21B1 align in the front-back direction X. The treating unit 21B1 is located rearward of the treating unit 21A1. The treating units 21C1 and 21D1 are located leftward of the transportation space 12A. The treating units 21C1 and 21D1 align in the front-back direction X. The treating unit 21D1 is located rearward of the treating unit 21C1.

When no distinction is made among the treating units 21A1, 21B1, 21C1, and 21D1, they are each referred to as a treating unit 21. The treating units 21 each perform a treatment to a substrate W individually.

The treating units 21 perform the same treatment.

The following describes a configuration of the treating units 21 briefly. The treating units 21 each includes a treatment housing 23.

The treating units 21 each include a holder 31. The holder 31 is arranged inside of the treatment housing 23. The holder 31 holds a substrate W. FIG. 1 shows the substrate W held by the holder 31 by dotted lines.

The treating unit 21 includes a liquid supplying unit 33. The liquid supplying unit 33 is arranged inside of the treatment housing 23. The liquid supplying unit 33 supplies a treating liquid to the substrate W held by the holder 31.

The transport mechanism 16A is accessible to the treating units 21 individually. Specifically, the transport mechanism 16A is accessible to the holder 31 of each of the treating units 21.

Hereinafter, a treatment housing 23 of the treating unit 21A1 is referred to as a treatment housing 23A1 appropriately. Likewise, treatment housings 23 of the treating units 21B1, 21C1, and 21D1 are called treatment housings 23B1, 23C1, and 23D1, respectively, appropriately. The treatment housings 23A1, 23B1, 23C1, and 23D1 are located at the same level.

The treating block 11 includes exhaust pipes 41A, 42A, and 43A. The exhaust pipes 41A, 42A, and 43A are all arranged outside of the treatment housing 23. The exhaust pipes 41A to 43A are each arranged on a lateral side of the treatment housing 23A1. The exhaust pipes 41A to 43A each pass laterally of the treatment housing 23A1. The exhaust pipes 41A to 43A each exhaust gas. The exhaust pipes 41A to 43A are not in communication with one another. The exhaust pipes 41A to 43A have exhaust paths separated from one another.

Likewise, the treating block 11 includes exhaust pipes 41B to 43B, 41C to 43C, and 41D to 43D. The exhaust pipes 41B to 43B, 41C to 43C, and 41D to 43D are arranged on lateral sides of the treatment housing 23B1, 23C1, and 23D1, respectively. The exhaust pipes 41B to 43B, 41C to 43C, and 41D to 43D each exhaust gas.

The treating block 11 includes switching mechanisms 51A1, 51B1, 51C1, and 51D1. The switching mechanism 51A1 is positioned at substantially the same level as that of the treatment housing 23A1. Likewise, the switching mechanisms 51B1, 51C1, and 51D1 are positioned at substantially the same level as those of the treatment housings 23B1, 23C1, and 23D1, respectively.

The switching mechanism 51A1 switches an exhaust path of the treatment housing 23A1 to one of the exhaust pipes 41A to 43A. The switching mechanism 51A1 switches an exhaust path of gas from the treatment housing 23A1 among the exhaust pipes 41A to 43A.

Specifically, the switching mechanism 51A1 performs switch among a first state, a second state, and a third state. In the first state, the switching mechanism 51A1 causes the treatment housing 23A1 to be in communication with the exhaust pipe 41A and to be blocked from the exhaust pipes 42A and 43A. In the second state, the switching mechanism 51A1 causes the treatment housing 23A1 to be in communication with the exhaust pipe 42A and to be blocked from the exhaust pipes 41A and 43A. In the third state, the switching mechanism 51A1 causes the treatment housing 23A1 to be in communication with the exhaust pipe 43A and to be blocked from the exhaust pipes 41A and 42A. In such a manner as above, the switching mechanism 51A1 causes the exhaust pipes 41A to 43A to be in communication with the treatment housing 23A1 individually, and to be blocked from treatment housing 23A1 individually.

Likewise, the switching mechanism 51B1 switches an exhaust path of the treatment housing 23B1 to one of the exhaust pipes 41B to 43B. The switching mechanism 51C1 switches an exhaust path of the treatment housing 23C1 to one of the exhaust pipes 41C to 43C. The switching mechanism 51D1 switches an exhaust path of the treatment housing 23D1 to one of the exhaust pipes 41D to 43D.

In FIG. 1, the switching mechanism 51A1 switches the exhaust path of the treatment housing 23A1 to the exhaust pipe 41A. The switching mechanism 51B1 switches the exhaust path of the treatment housing 23B1 to the exhaust pipe 41B. The switching mechanism 51C1 switches the exhaust path of the treatment housing 23C1 to the exhaust pipe 42C. The switching mechanism 51D1 switches the exhaust path of the treatment housing 23D1 to the exhaust pipe 43D.

Specifically, the switching mechanism 51A1 causes the treatment housing 23A1 to be in communication with the exhaust pipe 41A and to be blocked from the exhaust pipes 42A and 43A. The exhaust pipe 41A exhausts gas from the treatment housing 23A1. The exhaust pipes 42A and 43A each exhaust no gas from the treatment housing 23A1.

The switching mechanism 51B1 causes the treatment housing 23B1 to be in communication with the exhaust pipe 41B and to be blocked from the exhaust pipes 42B and 43B. The exhaust pipe 41B exhausts gas from the treatment housing 23B1. The exhaust pipes 42B and 43B each exhaust no gas from the treatment housing 23B1.

The switching mechanism 51C1 causes the treatment housing 23C1 to be in communication with the exhaust pipe 42C and to be blocked from the exhaust pipes 41C and 43C. The exhaust pipe 42C exhausts gas from the treatment housing 23C1. The exhaust pipes 41C and 43C each exhaust no gas from the treatment housing 23C1.

The switching mechanism 51D1 causes the treatment housing 23D1 to be in communication with the exhaust pipe 43D and to be blocked from the exhaust pipes 41D and 42D. The exhaust pipe 43D exhausts gas from the treatment housing 23D1. The exhaust pipes 41D and 42D each exhaust no gas from the treatment housing 23D1.

Here, the treatment housing 23A1 is one example of the first treatment housing in the present invention. The holder 31 of the treating unit 21A1 is one example of the first holder in the present invention. The liquid supplying unit 33 of the treating unit 21A1 is one example of the first liquid supplying unit in the present invention. The exhaust pipe 41A is one example of the first exhaust pipe in the present invention. The exhaust pipe 42A is one example of the second exhaust pipe in the present invention. The switching mechanism 51A1 is one example of the first switching mechanism in the present invention.

The treatment housing 23B1 is one example of the third treatment housing in the present invention. The holder 31 of the treating unit 21B1 is one example of the third holder in the present invention. The liquid supplying unit 33 of the treating unit 21B1 is one example of the third liquid supplying unit in the present invention. The exhaust pipe 41B is one example of the third exhaust pipe in the present invention. The exhaust pipe 42B is one example of the fourth exhaust pipe in the present invention. The switching mechanism 51B1 is one example of the third switching mechanism in the present invention.

The substrate treating apparatus 1 operates as under. The transport mechanism 6 transports a substrate W from a carrier C on the carrier platform 4 to the substrate platform 14A. The transport mechanism 16A transports the substrate W from the substrate platform 14A to the treating unit 21. Specifically, the transport mechanism 16A places the substrate W on the holder 31. The treating unit 21 performs a liquid treatment to the substrate W within the treatment housing 23. The treating units 21 each perform a treatment to one substrate W at one time. Specifically, the liquid supplying unit 33 supplies a treating liquid to the substrate W held by the holder 31. After the substrate W is treated, the transport mechanism 16A transports the substrate W from the treating unit 21 to the substrate platform 14A. The transport mechanism 6 transports the substrate W from the substrate platform 14A to a carrier C on the carrier platform 4.

When one of the treating units 21 performs a treatment to a substrate W, another of the treating units 21 may perform a treatment to another substrate W. The number of treating units 21 to which each of the substrates W is transported is, for example, one.

When a substrate W is treated within the treatment housing 23, the switching mechanism 51 switches the exhaust path of the treatment housing 23. For example, when a substrate W is treated, the switching mechanism 51A1 switches the exhaust path one or more times. For example, a period of time when a treatment is performed on one substrate W in one treatment housing 23 may include two or more periods selected from a first period, a second period, and a third period. Here, the first period is one when the first exhaust pipe exhausts gas within the treatment housing 23. The second period is one when the second exhaust pipe exhausts gas within the treatment housing 23. The third period is one when the third exhaust pipe exhausts gas within the treatment housing 23.

The substrate treating apparatus 1 described above can obtain the following effects. Specifically, the switching mechanism 51A1 is positioned at a level substantially equal to that of the treatment housing 23A1. Accordingly, a channel between the treatment housing 23A1 and the switching mechanism 51A1 can be shortened suitably.

Moreover, the treatment housing 23A1 is connected to the switching mechanism 51A1 not via any pipe. Accordingly, the channel between the treatment housing 23A1 and the switching mechanism 51A1 can be shortened suitably.

The channel between the treatment housing 23A1 and the switching mechanism 51A1 can be shortened suitably, achieving suitable suppression of contamination and damages on the channel between the treatment housing 23A1 and the switching mechanism 51A1. Consequently, gas flows smoothly from the treatment housing 23A1 to the switching mechanism 51A1. As a result, gas in the treatment housing 23A1 can be exhausted suitably.

Now, a switching timing is determined, for example, from a gas change timing and a delay time. Here, the switching timing is one when the switching mechanism 51 switches the exhaust path. The gas change timing is one when constituents of gas within the treatment housing 23 change. The delay time is one required for gas to reach the switching mechanism 51 from the treatment housing 23. The delay time is shortened as the channel between the treatment housing 23 and the switching mechanism 51 is shorter. The delay time less varies as the channel between the treatment housing 23 and the switching mechanism 51 is shorter. With the substrate treating apparatus 1 as described above, the channel between the treatment housing 23A1 and the switching mechanism 51A1 can be shortened suitably. Accordingly, the delay time can be shortened suitably. Moreover, variation in the delay time can also be suppressed suitably. This can determine the switching timing accurately. Consequently, the switching mechanism 51A1 can switch the exhaust path of the treatment housing 23A1 at an accurate timing.

The switching mechanism 51A1 is positioned at substantially the same level as that of the treatment housing 23A1. Accordingly, the channel between the treatment housing 23A1 and the switching mechanism 51A1 extends substantially horizontally. Consequently, gas flows more smoothly from the treatment housing 23A1 to the switching mechanism 51A1. As a result, gas in the treatment housing 23A1 can be exhausted more suitably.

Likewise, the switching mechanisms 51B1, 51C1, and 51D1 are positioned at levels substantially equal to those of the treatment housings 23B1, 23C1, and 23D1, respectively. As a result, gas in the treatment housings 23A1, 23C1, and 23D1 can be exhausted suitably.

The exhaust pipe 41A is located laterally of the treatment housing 23A1. Accordingly, the switching mechanism 51A1 can be connected to the exhaust pipe 41A easily. The exhaust pipes 42A and 43A are also located laterally of the treatment housing 23A1. Accordingly, the switching mechanism 51A1 can be connected to the exhaust pipes 42A and 43A easily.

Likewise, the exhaust pipes 41B to 43B are located laterally of the treatment housing 23B1. Accordingly, the switching mechanism 51B1 can be connected to the exhaust pipes 41B to 43B easily. The exhaust pipes 41C to 43C are located laterally of the treatment housing 23C1. Accordingly, the switching mechanism 51C1 can be connected to the exhaust pipes 41C to 43C easily. The exhaust pipes 41D to 43D are located laterally of the treatment housing 23D1. Accordingly, the switching mechanism 51D1 can be connected to the exhaust pipes 41D to 43D easily.

The following describes the configuration of the substrate treating apparatus 1 in more detail.

Indexer 3

Figure 2:
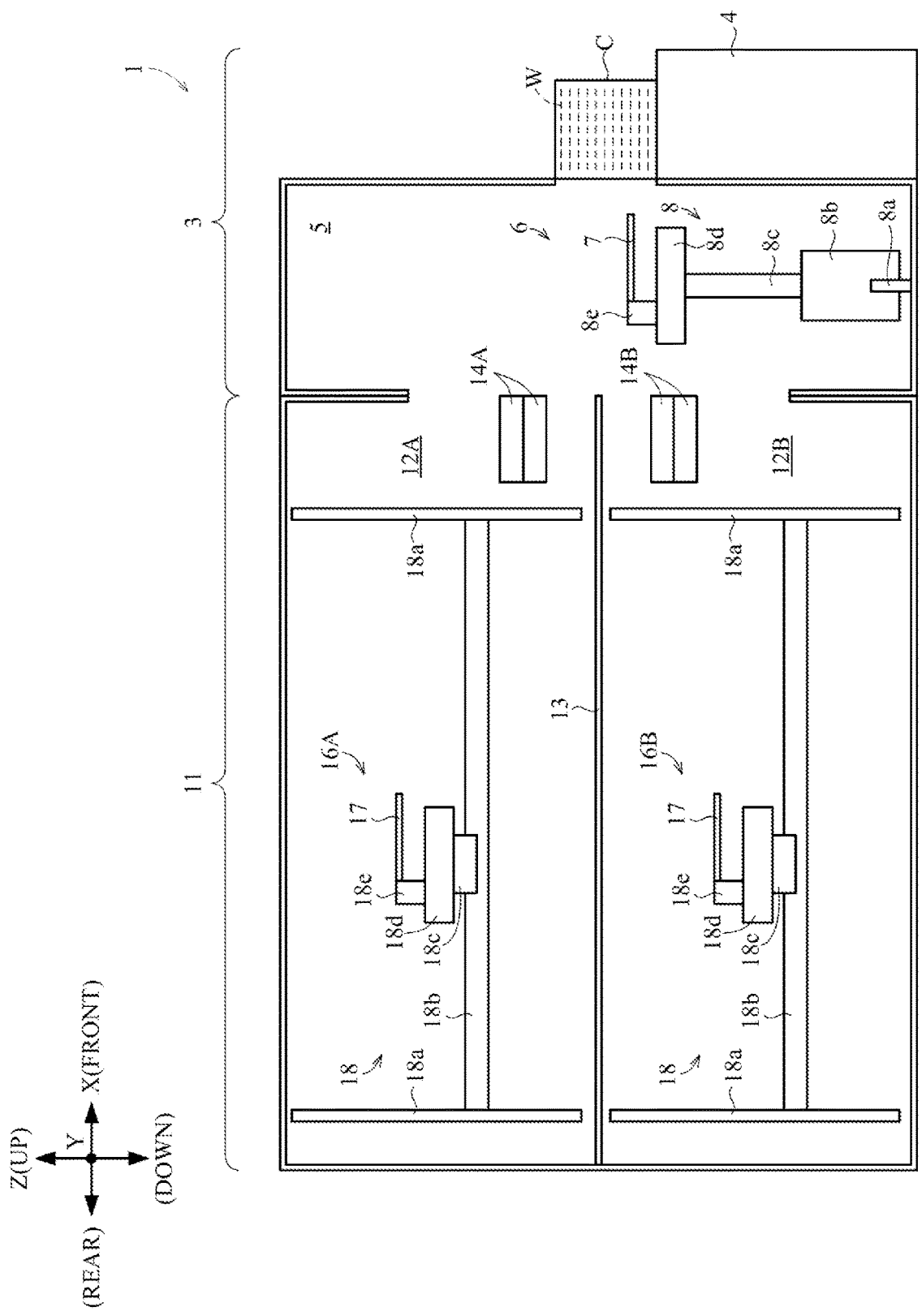
FIG. 2 is a right side view showing a central portion of the substrate treating apparatus in a width direction.

Reference is made to FIGS. 1 and 2. FIG. 2 is a right side view of a middle portion of the substrate treating apparatus 1 in the width direction Y. The following describes a configuration of the transport mechanism 6. The transport mechanism 6 includes a hand 7 and a hand driving unit 8. The hand 7 supports one substrate W in a horizontal posture. The hand driving unit 8 is coupled to the hand 7. The hand driving unit 8 moves the hand 7. The hand driving unit 8 moves the hand 7 in the front-back direction X, width direction Y, and vertical direction Z.

The following exemplarily describes a configuration of the hand driving unit 8. The hand driving unit 8 includes, for example, a rail 8a, a horizontally moving portion 8b, a vertically moving portion 8c, a rotator 8d, and an advancing/retreating portion 8e. The rail 8a is fixedly arranged. The rail 8a is located at the bottom of the transportation space 5. The rail 8a extends in the width direction Y. The horizontally moving portion 8b is supported by the rail 8a. The horizontally moving portion 8b moves in the width direction Y with respect to the rail 8a. The vertically moving portion 8c is supported by the horizontally moving portion 8b. The vertically moving portion 8c moves in the vertical direction Z with respect to the horizontally moving portion 8b. The rotator 8d is supported by the vertically moving portion 8c. The rotator 8d rotates with respect to the vertically moving portion 8c. The rotator 8d rotates around a rotation axis that is parallel to the vertical direction Z. The advancing/retreating portion 8e moves with respect to the rotator 8d. The advancing/retreating portion 8e reciprocates in a horizontal direction defined by the orientation of the rotator 8d. The advancing/retreating portion 8e is connected to the hand 7. The hand driving unit 8 with such a construction can move the hand 7 in parallel in the vertical direction Z. The hand 7 is movable in a direction parallel to any horizontal direction. The hand 7 is rotatable in a horizontal plane.

Outline of Treating Block 11

Reference is made to FIGS. 2 and 3. FIG. 3 is a front view of the treating block 11. FIG. 3 omits illustration of the substrate platform 14A and the like. The treating block 11 includes a transportation space 12B in addition to the transportation space 12A. The transportation space 12B is located below the transportation space 12A. The transportation space 12B is also in connection with the transportation space 5 of the indexer 3. The transportation space 12B is located at the same position as that of the transportation space 12A in plan view, which illustration is omitted.

When no distinction is made between the transportation spaces 12A and 12B, they are referred to as a transportation space 12.

The treating block 11 includes one partition 13. The partition 13 is located below the transportation space 12A and above the transportation space 12B. The partition 13 has a flat plate shape. The partition 13 separates the transportation space 12A and the transportation space 12B.

Reference is made to FIG. 2. The treating block 11 includes a substrate platform 14B in addition to the substrate platform 14A. The substrate platform 14B places the substrates W thereon. The substrate platform 14B is located below the substrate platform 14A. The substrate platform 14B is arranged in the transportation space 12B. The substrate platform 14B is located in a front part of the transportation space 12B. The transport mechanism 6 of the indexer 3 is also accessible to the substrate platform 14B. The transport mechanism 6 transports substrates W to the substrate platforms 14A and 14B alternately, for example.

The treating block 11 includes a transport mechanism 16B in addition to the transport mechanism 16A. The transport mechanism 16B is arranged in the transportation space 12B. The transport mechanism 16B transports substrates W. The transport mechanism 16B is accessible to the substrate platform 14B.

When no distinction is made between the transport mechanisms 16A and 16B, they are referred to as a transport mechanism 16.

Reference is made to FIGS. 1, 2, and 3. The following describes a configuration of the transport mechanism 16. The transport mechanism 16 includes a hand 17 and a hand driving unit 18. The hand 17 supports one substrate W in a horizontal posture. The hand driving unit 18 is coupled to the hand 17. The hand driving unit 18 moves the hand 17. The hand driving unit 18 moves the hand 17 in the front-back direction X, width direction Y, and vertical direction Z.

The following exemplarily describes a configuration of the hand driving unit 18. The hand driving unit 18 includes two struts 18a, a vertically moving portion 18b, a horizontally moving portion 18c, a rotator 18d, and an advancing/retreating portion 18e, for example. The struts 18a are fixedly arranged. The struts 18a are located on a lateral side of the transportation space 12. The two struts 18a align in the front-back direction X. The struts 18a each extend in the vertical direction Z. The vertically moving portion 18b is supported by the struts 18a. The vertically moving portion 18b extends between the two struts 18a in the front-back direction X. The vertically moving portion 18b moves in the vertical direction Z with respect to the struts 18a. The horizontally moving portion 18c is supported by the vertically moving portion 18b. The horizontally moving portion 18c moves in the front-back direction X with respect to the vertically moving portion 18b. The rotator 18d is supported on the horizontally moving portion 18c. The rotator 18d rotates with respect to the horizontally moving portion 18c. The rotator 18d rotates around a rotation axis that is parallel to the vertical direction Z. The advancing/retreating portion 18e moves with respect to the rotator 18d. The advancing/retreating portion 18e reciprocates in a horizontal direction defined by the orientation of the rotator 18d. The advancing/retreating portion 18e is connected to the hand 17. The hand driving unit 18 with such a construction can move the hand 17 in parallel in the vertical direction Z. The hand 7 is movable in a direction parallel to any horizontal direction. The hand 7 is rotatable in a horizontal plane.

Figure 4:
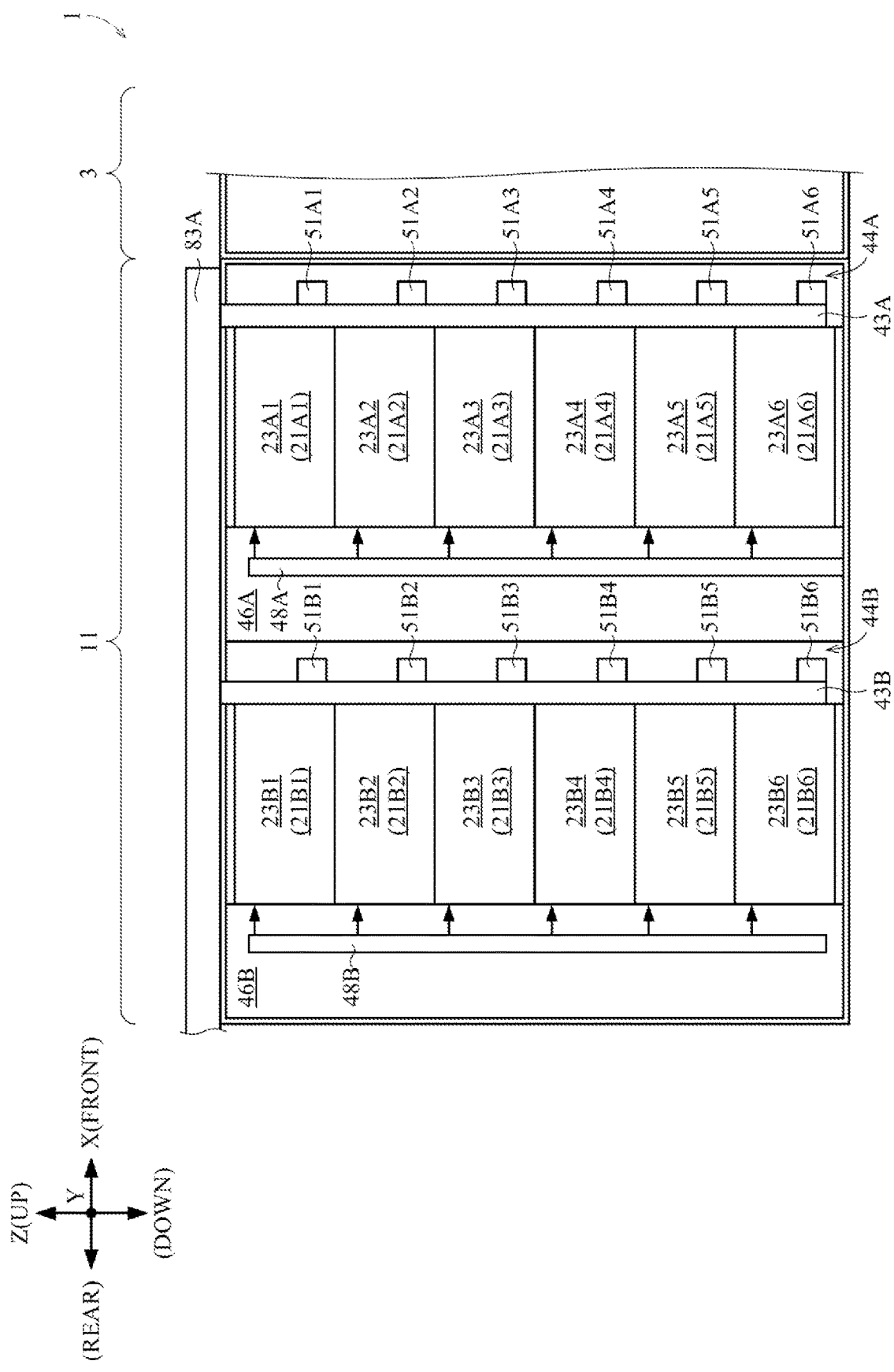
FIG. 4 is a right side view of a right part of the substrate treating apparatus.

FIG. 4 is a right side view of a right part of the substrate treating apparatus 1. The treating block 11 includes five treating units 21A2 to 21A6 in addition to the treating unit 21A1. The treating units 21A2 to 21A6 include treatment housings 23A2 to 23A6, respectively. The treatment housings 23A2 to 23A6 are located below the treatment housing 23A1. The treatment housings 23A1 to 23A6 align downward from the top. The treatment housings 23A1 to 23A6 align in line in the vertical direction Z. The treatment housings 23A2 to 23A6 are located at the position equal to that of the treatment housing 23A1 in plan view, which illustration is omitted. The treatment housings 23A1 to 23A6 are stacked one another.

Likewise, the treating block 11 includes treating units 21B2 to 21B6 in addition to the treating unit 21B1. The treating units 21B2 to 21B6 include treatment housings 23B2 to 23B6, respectively. Here, a relative position among the treatment housings 23B1 to 23B6 is substantially the same as a relative position among the treatment housings 23A1 to 23A6.

Figure 5:
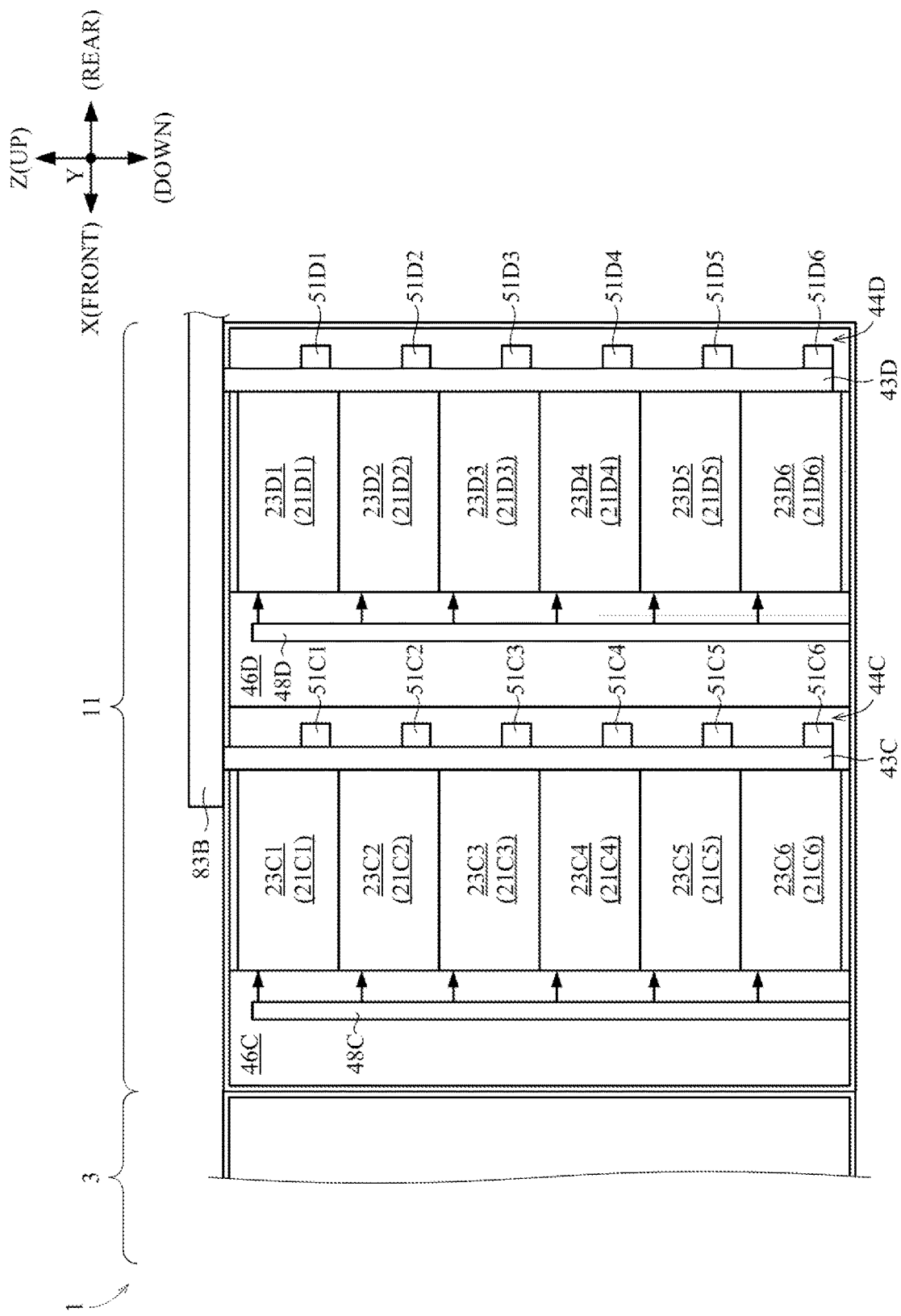
FIG. 5 is a left side view of a left part of the substrate treating apparatus.

FIG. 5 is a left side view of a left part of the substrate treating apparatus 1. The treating block 11 includes treating units 21C2 to 21C6 and 21D2 to 21D6 in addition to the treating units 21C1 and 21D1. The treating units 21C2 to 21C6 and 21D2 to 21D6 include treatment housings 23C2 to 23C6 and 23D2 to 23D6, respectively. The treatment housings 23C1 to 23C6 and 23D1 to 23D6 are arranged in the same manner as the treatment housings 23A1 to 23A6.

Reference is made to FIGS. 3, 4, and 5. As described above, the treatment housings 23A1, 23B1, 23C1, and 23D1 are located at the same level. The treatment housings 23A2 to 23A6, 23B2 to 23B6, 23C2 to 23C6, and 23D2 to 23D6 are arranged in the same manner as above. That is, the treatment housings 23An, 23Bn, 23Cn, and 23Dn are located at the same level. Note that the term "n" indicates an integer of 1 to 6.

Reference is made to FIG. 3. The treatment housings 23A1 to 23A3, 23B1 to 23B3, 23C1 to 23C3, and 23D1 to 23D3 are each located at the same level as that of the transportation space 12A. Accordingly, the transport mechanism 16A is accessible to the treatment housings 23A1 to 23A3, 23B1 to 23B3, 23C1 to 23C3, and 23D1 to 23D3.

The treatment housings 23A4 to 23A6, 23B4 to 23B6, 23C4 to 23C6, and 23D4 to 23D6 are each located at the same level as that of the transportation space 12B. Accordingly, the transport mechanism 16B is accessible to the treatment housings 23A4 to 23A6, 23B4 to 23B6, 23C4 to 23C6, and 23D4 to 23D6.

When no distinction is made among the treating units 21A1 to 21A6, they are each referred to as a treating unit 21A. When no distinction is made among the treating units 21B1 to 21B6, they are each referred to as a treating unit 21B. When no distinction is made among the treating units 21C1 to 21C6, they are each referred to as a treating unit 21C. When no distinction is made among the treating units 21D1 to 21D6, they are each referred to as a treating unit 21D. When no distinction is made among the treating units 21A, 21B, 21C, and 21D, they are each referred to as a treating unit 21.

When no distinction is made among the treatment housings 23A1 to 23A6, they are each referred to as a treatment housing 23A. When no distinction is made among the treatment housings 23B1 to 23B6, they are each referred to as a treatment housing 23B. When no distinction is made among the treatment housings 23C1 to 23C6, they are each referred to as a treatment housing 23C. When no distinction is made among the treatment housings 23D1 to 23D6, they are each referred to as a treatment housing 23D. When no distinction is made among the treatment housings 23A, 23B, 23C, and 23D, they are each referred to as a treatment housing 23.

Reference is made to FIG. 1. The treatment housings 23 are each located adjacent to the transportation space 12. The treatment housings 23A and 23B are located rightward of the transportation space 12. The treatment housings 23C and 23D are located leftward of the transportation space 12.

The treating block 11 includes first piping spaces 44A and 44B, and second piping spaces 46A and 46B. The first piping spaces 44A and 44B and the second piping spaces 46A and 46B are each located adjacent to the transportation space 12. The first piping spaces 44A and 44B and the second piping spaces 46A and 46B are each located rightward of the transportation space 12.

The first piping space 44A, the treatment housing 23A, and the second piping space 46A align in the front-back direction X. The first piping space 44A, the treatment housing 23A, and the second piping space 46A align in this order. The first piping space 44A is located forward of the treatment housing 23A. The first piping space 44A is located adjacent to the treatment housing 23A. The second piping space 46A is located rearward of the treatment housing 23A. The second piping space 46A is located adjacent to the treatment housing 23A.

A relative position among the treatment housing 23B, the first piping space 44B, and the second piping space 46B is substantially the same as a relative position among the treatment housing 23A, the first piping space 44A, and the second piping space 46A. The first piping space 44B is located rearward of the second piping space 46A. The first piping space 44B is located adjacent to the second piping space 46A.

The treating block 11 includes first piping spaces 44C and 44D, and second piping spaces 46C and 46D. The first piping spaces 44C and 44D and the second piping spaces 46C and 46D are each located adjacent to the transportation space 12. The first piping spaces 44C and 44D and the second piping spaces 46C and 46D are each located leftward of the transportation space 12. A relative position among the treatment housing 23C, the first piping space 44C, and the second piping space 46C is substantially the same as a relative position among the treatment housing 23A, the first piping space 44A, and the second piping space 46A except for their directions. The relative position among the treatment housing 23C, the first piping space 44C, and the second piping space 46C corresponds to one obtained by rotating the relative position among the treatment housing 23A, the first piping space 44A, and the second piping space 46A by 180 degrees around an axis parallel to the vertical direction Z. Accordingly, the first piping space 44C is located rearward of the treatment housing 23C. The second piping space 46C is located forward of the treatment housing 23C. As described above, the relative position among the treatment housing 23C, the first piping space 44C, and the second piping space 46C is the same as a relative position among the treatment housing 23A, the first piping space 44A, and the second piping space 46A. The treatment housing 23C, the first piping space 44C, and the second piping space 46C are configured in the same manner as the treatment housing 23A, the first piping space 44A, and the second piping space 46A except for their installation directions. The relative position among the treatment housing 23D, the first piping space 44D, and the second piping space 46D is also the same as the relative position among the treatment housing 23A, the first piping space 44A, and the second piping space 46A. The treatment housing 23D, the first piping space 44D, and the second piping space 46D are configured in the same manner as the treatment housing 23A, the first piping space 44A, and the second piping space 46A except for their installation directions.

The first piping space 44A accommodates the exhaust pipes 41A to 43A. In other words, the exhaust pipes 41A to 43A are arranged in the first piping space 44A. Likewise, the first piping space 44B accommodates the exhaust pipes 41B to 43B. The first piping space 44C accommodates the exhaust pipes 41C to 43C. The first piping space 44D accommodates the exhaust pipes 41D to 43D.

The exhaust pipes 41A to 43A are located forward of the treatment housing 23A. The exhaust pipes 41B to 43B are located forward of the treatment housing 23B. The exhaust pipes 41C to 43C are located rearward of the treatment housing 23C. The exhaust pipes 41D to 43D are located rearward of the treatment housing 23D.

The exhaust pipes 41A to 43A align in the width direction Y. The exhaust pipes 41A to 43A are each located adjacent to the treatment housing 23A. Likewise, the exhaust pipes 41B to 43B align in the width direction Y. The exhaust pipes 41B to 43B are each located adjacent to the treatment housing 23B. The exhaust pipes 41C to 43C align in the width direction Y. The exhaust pipes 41C to 43C are each located adjacent to the treatment housing 23C. The exhaust pipes 41D to 43D align in the width direction Y. The exhaust pipes 41D to 43D are each located adjacent to the treatment housing 23C.

The treating block 11 includes gas supply pipes 48A, 48B, 48C, and 48D. The gas supply pipe 48A is arranged in the second piping space 46A. The gas supply pipe 48A supplies gas (e.g., clean air) into the treatment housing 23A. Likewise, the gas supply pipes 48B, 48C, and 48D are accommodated in the second piping spaces 46B, 46C, and 46D, respectively. The gas supply pipes 48B, 48C, and 48D supply gas into the treatment housings 23B, 23C, and 23D, respectively.

Reference is made to FIGS. 3, 4, and 5. The exhaust pipes 41A to 43A each extend in the vertical direction Z. The exhaust pipes 41A to 43A each extend from a height position of the treatment housing 23A1 to a height position of the treatment housing 23A6. Likewise, the exhaust pipes 41B to 43B, 41C to 43C, and 41D to 43D each extend in the vertical direction Z.

Reference is made to FIGS. 4 and 5. The gas supply pipes 48A to 48D each extend in the vertical direction Z. The gas supply pipes 48A to 48D are arranged on lateral sides of the treatment housings 23A to 23D, respectively. The front-back direction X is one example of the first direction in the present invention. The width direction Y is one example of the second direction in the present invention.

When no distinction is made among the exhaust pipes 41A to 41D, they are each referred to as an exhaust pipe 41. When no distinction is made among the exhaust pipes 42A to 42D, they are each referred to as an exhaust pipe 42. When no distinction is made among the exhaust pipes 43A to 43D, they are each referred to as an exhaust pipe 43. When no distinction is made between the first piping spaces 44A, 44B, 44C, and 44D, they are each referred to as a first piping space 44. When no distinction is made between the second piping spaces 46A, 46B, 46C, and 46D, they are each referred to as a second piping space 46. When no distinction is made among the gas supply pipes 48A to 48D, they are each referred to as a gas supply pipe 48.

The first piping space 44 does not accommodate any pipes configured to supply gas into the treatment housing 23. The first piping space 44 does not accommodate a pipe configured to supply a treating liquid into the treating unit 21 (liquid supplying unit 33). The first piping space 44 does not accommodate a pipe configured to exhaust a treating liquid from the treating unit 21.

The second piping space 46 may accommodate, for example, a pipe configured to supply a treating liquid into the treating unit 21 (liquid supplying unit 33). The second piping space 46 may accommodate, for example, a pipe configured to exhaust a treating liquid from the treating unit 21.

Reference is made to FIGS. 3 and 4. As described above, the switching mechanism 51A1 is positioned at a level substantially equal to that of the treatment housing 23A1. The switching mechanism 51A1 overlaps the treatment housing 23A1 in front view. Specifically, the switching mechanism 51A1 entirely overlaps the treatment housing 23A1 in front view. A relative position between the switching mechanism 51B1 and the treatment housing 23B1 is equal to a relative position between the switching mechanism 51A1 and the treatment housing 23A1. Relative positions between the switching mechanisms 51C1 and 51D1 and the treatment housings 23C1 and 23D1, respectively, are equal to the relative position between the switching mechanism 51A1 and the treatment housing 23A1.

The treating block 11 includes switching mechanisms 51A2 to 51A6 in addition to the switching mechanism 51A1. A relative position between the switching mechanism 51A2 and the treatment housing 23A2 is equal to the relative position between the switching mechanism 51A1 and the treatment housing 23A1. Specifically, the switching mechanism 51A2 is positioned at a level substantially equal to that of the treatment housing 23A2. The switching mechanism 51A2 overlaps the treatment housing 23A2 in front view. Likewise, relative positions between the switching mechanisms 51A3 to 51A6 and the treatment housings 23A3 to 23A6, respectively, is equal to the relative position between the switching mechanism 51A1 and the treatment housing 23A1.

The switching mechanism 51A2 switches an exhaust path of the treatment housing 23A2 to one of the exhaust pipes 41A to 43A. Likewise, the switching mechanisms 51A3 to 51A6 switch exhaust paths of the treatment housings 23A3 to 23A6, respectively, to one of the exhaust pipes 41A to 43A. Accordingly, the exhaust pipes 41A to 43A exhaust gas from the treatment housings 23A1 to 23A6, respectively.

Reference is made to FIG. 4. The treating block 11 includes switching mechanisms 51B2 to 51B6 in addition to the switching mechanism 51B1. Here, relative positions between the switching mechanisms 51B2 to 51B6 and the treatment housings 23B2 to 23B6, respectively, are equal to a relative position between the switching mechanism 51B1 and the treatment housing 23B1. The switching mechanisms 51B2 to 51B6 switch exhaust paths of the treatment housing 23B2 to 23B6, respectively, to one of the exhaust pipes 41B to 43B. Accordingly, the exhaust pipes 41B to 43B exhaust gas from the treatment housings 23B1 to 23B6, respectively.

Reference is made to FIG. 5. The treating block 11 includes switching mechanisms 51C2 to 51C6 in addition to the switching mechanism 51C1. Here, relative positions between the switching mechanisms 51C2 to 51C6 and the treatment housings 23C2 to 23C6, respectively, are equal to a relative position between the switching mechanism 51C1 and the treatment housing 23C1. The switching mechanisms 51C2 to 51C6 switch exhaust paths of the treatment housing 23C2 to 23C6, respectively, to one of the exhaust pipes 41C to 43C. Accordingly, the exhaust pipes 41C to 43C exhaust gas from the treatment housings 23C1 to 23C6, respectively.

The treating block 11 includes switching mechanisms 51D2 to 51D6 in addition to the switching mechanism 51D1. Here, relative positions between the switching mechanisms 51D2 to 51D6 and the treatment housings 23D2 to 23D6, respectively, are equal to a relative position between the switching mechanism 51D1 and the treatment housing 23D1. The switching mechanisms 51D2 to 51D6 switch exhaust paths of the treatment housing 23D2 to 23D6, respectively, to one of the exhaust pipes 41D to 43D. Accordingly, the exhaust pipes 41D to 43D exhaust gas from the treatment housings 23D1 to 23D6, respectively.

The switching mechanisms 51A2 to 51A6 are each located at the position equal to that of the switching mechanism 51A1 in plan view, which illustration is omitted. Likewise, the switching mechanisms 51B2 to 51B6 are each located at the position equal to that of the switching mechanism 51B1 in plan view. The switching mechanisms 51C2 to 51C6 are each located at the position equal to that of the switching mechanism 51C1 in plan view. The switching mechanisms 51D2 to 51D6 are located at the position equal to that of the switching mechanism 51D1 in plan view.

When no distinction is made between the switching mechanisms 51A1 to 51A6, they are each referred to as a switching mechanism 51A. When no distinction is made between the switching mechanisms 51B1 to 51B6, they are each referred to as a switching mechanism 51B. When no distinction is made between the switching mechanisms 51C1 to 51C6, they are each referred to as a switching mechanism 51C. When no distinction is made between the switching mechanisms 51D1 to 51D6, they are each referred to as a switching mechanism 51D. When no distinction is made between the switching mechanisms 51A, 51B, 51C, and 51D, they are each referred to as a switching mechanism 51.

Reference is made to FIG. 1. The switching mechanism 51 is positioned so as not to overlap the holder 31 in plan view. At least part of the switching mechanism 51 is arranged outside of the treatment housing 23. At least part of the switching mechanism 51 is arranged laterally of the treatment housing 23. At least part of the switching mechanism 51 is arranged in the first piping space 44. At least part of the switching mechanism 51A is arranged in the first piping space 44A. At least part of the switching mechanism 51B is arranged in the first piping space 44B. At least part of the switching mechanism 51C is arranged in the first piping space 44C. At least part of the switching mechanism 51D is arranged in the first piping space 44D.

Configuration of Treating Unit 21

Figure 6:
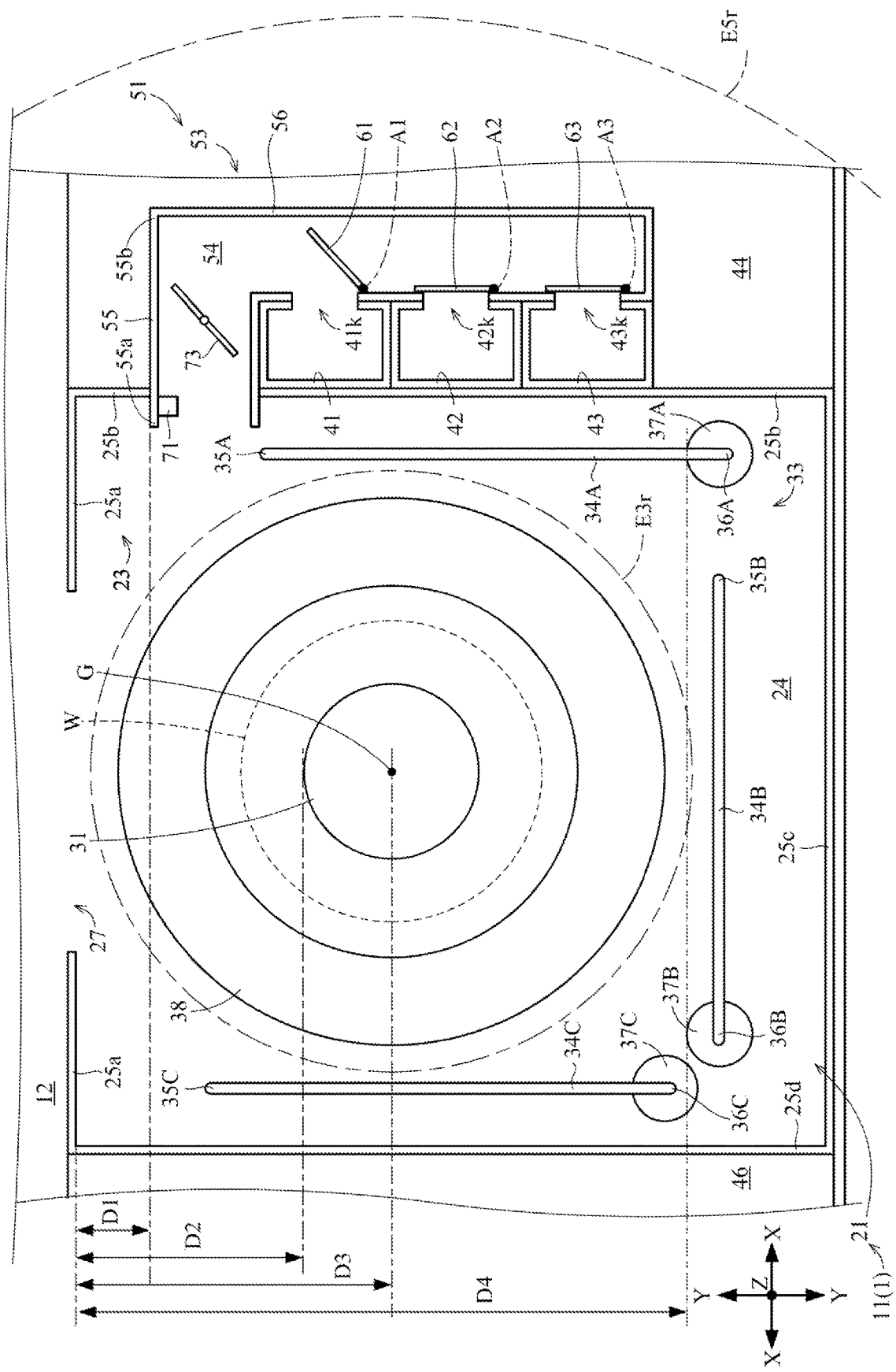
FIG. 6 is a plan view of a treating unit.
Figure 7:
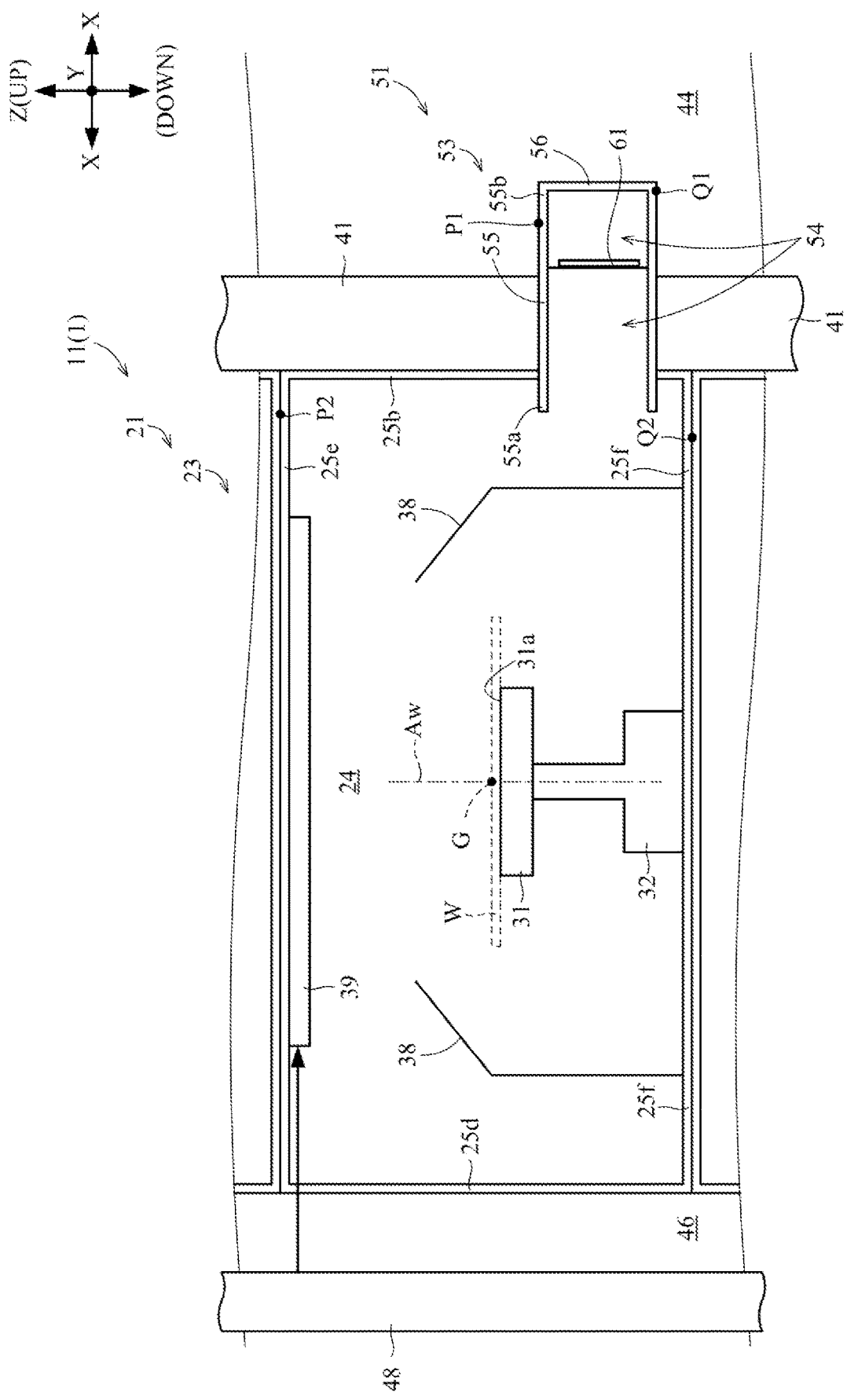
FIG. 7 is a side view of the treating unit.

FIG. 6 is a plan view of the treating unit 21. FIG. 7 is a side view of the treating unit 21. The treating units 21 each include the treatment housing 23, the holder 31, and the liquid supplying unit 33 as described above. Note that FIG. 1 schematically illustrates the liquid supplying unit 33 for convenience, and thus the liquid supplying unit 33 shown in FIG. 6 slightly differs from the liquid supplying unit 33 shown in FIG. 1.

The following describes a structure of the treatment housing 23. The treatment housing 23 has a substantial box shape. The treatment housing 23 is substantially rectangular in plan view, in front view, and in side view.

The treatment housing 23 includes four lateral walls 25a, 25b, 25c, and 25d, an upper board 25e, and a base board 25f.

The lateral walls 25a to 25d each have a flat plate shape substantially vertical. The upper board 25e and the base board 25f each have a flat plate shape substantially horizontal.

The treatment housing 23 includes therein a treating space 24. Substrates W are treated in the treating space 24. The treating space 24 is defined by the lateral walls 25a to 25d, the upper board 25e, and the base board 25f.

The lateral walls 25a and 25c extend in the front-back direction X in plan view. The lateral wall 25c is provided so as to face the lateral wall 25a. The lateral walls 25b and 25d extend in the width direction Y in plan view. The lateral walls 25b and 25d each extend from the lateral wall 25a to the lateral wall 25c. The lateral wall 25d is provided so as to face the lateral wall 25b.

The treatment housing 23B has the same configuration as the treatment housing 23A. The treatment housings 23C and 23D also have the same configuration as the treatment housing 23A. The treatment housings 23C and 23D are configured in the same manner as that of the treatment housing 23A except for their installation directions. The treatment housings 23C and 23D correspond to that made by turning the treatment housing 23A around an axis parallel to the vertical direction Z by 180 degrees. Accordingly, the lateral wall 25a contacts the transportation space 12 in each of the treatment housings 23A to 23D. The lateral wall 25b contacts the first piping space 44 in each of the treatment housings 23A to 23D. The lateral wall 25d contacts the second piping space 46 in each of the treatment housings 23A to 23D.

The treatment housing 23 has a substrate transportation port 27. The substrate transportation port 27 is formed in the lateral wall 25a. A substrate W can pass through the substrate transportation port 27. The substrate W moves between outside of the treatment housing 23 and inside of the treatment housing 23 via the substrate transportation port 27. Specifically, the substrate W moves between the transportation space 12 and the treating space 24 via the transportation port 27.

The treating unit 21 may have a shutter, not shown. The shutter is attached to the lateral wall 25a. The shutter opens and closes the substrate transportation port 27.

The holder 31 holds one substrate W horizontally. The holder 31 includes a top face 31a. The top face 31a is substantially horizontal. The substrate W is placed on the top face 31a.

FIGS. 6 and 7 each denote a central point G. The central point G is the center of a substrate W when the substrate W is held by the holder 31.

Reference is made to FIG. 7. The treating units 21 each further include a rotation driving unit 32. The rotation driving unit 32 is arranged inside of the treatment housing 23. The rotation driving unit 32 is coupled to the substrate holder 31. The rotation driving unit 32 rotates the holder 31. The substrate W held by the holder 31 rotates integrally with the holder 31. The holder 31 and the substrate W are rotated around a rotation axis Aw. The rotation axis Aw is an imaginary line parallel to the vertical direction Z, for example. The rotation axis Aw passes through the central point G, for example.

Reference is made to FIG. 6. The liquid supplying unit 33 supplies a first treating liquid, a second treating liquid, and a third treating liquid. The first treating liquid, the second treating liquid, and the third treating liquid differ from one another in type. That is, the liquid supplying unit 33 supplies a plurality of (three) types of treating liquids.

The first treating liquid is classified to an acid liquid, for example. The first treating liquid includes, for example, at least one selected from hydrofluoric acid, a hydrochloric acid/hydrogen peroxide solution, sulfuric acid, a sulfuric acid/hydrogen peroxide solution, fluoro-nitric acid (a mixed liquid of hydrofluoric acid and nitric acid), and hydrochloric acid.

The second treating liquid is classified to an alkaline liquid, for example. The second treating liquid includes, for example, at least one selected from ammonia/hydrogen peroxide solution (SC1), an ammonia water, an ammonium fluoride solution, and tetramethylammonium hydroxide (TMAH).

The third treating liquid is classified to an organic liquid, for example. The organic liquid includes at least one selected from isopropyl alcohol (IPA), methanol, ethanol, hydrofluoroether (HFE), and acetone.

The liquid supplying unit 33 includes nozzles 34A, 34B, and 34C. The nozzles 34A, 34B, and 34C each dispense a treating liquid. The nozzle 34A dispenses the first treating liquid, for example. The nozzle 34B dispenses the second treating liquid, for example. The nozzle 34C dispenses the third treating liquid, for example.

The nozzles 34A, 34B, and 34C each have a tubular shape extending linearly. The nozzles 34A, 34B, and 34C include distal ends 35A, 35B, and 35C, and proximal ends 36A, 36B, and 36C, respectively. The distal ends 35A, 35B, and 35C each include an outlet, not shown, through which the treating liquid is dispensed.

The liquid supplying unit 33 includes bases 37A, 37B, and 37C. The bases 37A, 37B, and 37C support the nozzles 34A, 34B, and 34C, respectively. Specifically, the bases 37A, 37B, and 37C are connected to the proximal ends 36A, 36B, and 36C, respectively.

The base 37A further moves the nozzle 34A. The base 37A rotates the nozzle 34A around a rotation axis that passes through the base 37A and is parallel to the vertical direction Z. Likewise, the bases 37B and 37C move the nozzles 34B and 34C, respectively.

The base 37A can cause the nozzle 34A to move between a treating position and a retreating position. When the nozzle 34A is in the treating position, the distal end 35A (outlet) is positioned above a substrate W held by the holder 31. When the nozzle 34A is in the treating position, the distal end 35A (outlet) overlaps the substrate W held by the holder 31 in plan view. When the nozzle 34A is in the retreating position, the nozzle 34A does not entirely overlap the substrate W held by the holder 31 in plan view. Likewise, the nozzles 34B and 34C can each be caused to move between a treating position and a retreating position. FIG. 6 illustrates the nozzles 34A, 34B, and 34C at the retreating position.

The bases 37A to 37C are each located close to the lateral wall 25c. The base 37A is located at a corner where the lateral walls 25c and 25b are connected. The bases 37B and 37C are each located at a corner where the lateral walls 25c and 25d are connected.

The treating unit 21 includes a cup 38. The cup 38 is located around the holder 31. The cup 38 surrounds laterally of a substrate W held by the holder 31. The cup 38 receives the treating liquid scattered from the substrate W held by the holder 31.

Reference is made to FIG. 7. The treating unit 21 includes a blowing unit 39. The blowing unit 39 supplies gas into the treating space 24. The blowing unit 39 is attached to the upper board 25e. The blowing unit 39 is located above the holder 31. The blowing unit 39 blows gas (e.g., clean air) downward.

The blowing unit 39 is connected to the gas supply pipe 48. The gas supply pipe 48 supplies gas into the blowing unit 39.

Here, a relative position among the treatment housing 23, the holder 31, and the liquid supplying unit 33 is same as that among the treating units 21A to 21D. The relative position among the treatment housing 23, the holder 31, and the liquid supplying unit 33 in each of the treating units 21C and 21D is same as that among the treatment housing 23, the holder 31, and the liquid supplying unit 33 in the treating unit 21A except for their directions.

Configuration of Switching Mechanism 51

Reference is made to FIGS. 6 and 7. The switching mechanism 51 includes a switch housing 53. The switch housing 53 has a smaller size than that of the treatment housing 23. The switch housing 53 is connected to the treatment housing 23. The switch housing 53 is also connected to the exhaust pipes 41 to 43. The switch housing 53 extends in the horizontal direction. The switch housing 53 bends in substantially an L-shape in plan view. The switch housing 53 includes therein a switching space 54.

The switch housing 53 includes an introducing portion 55. The introducing portion 55 is connected to the treatment housing 23. The introducing portion 55 is connected to the lateral wall 25b of the treatment housing 23.

The introducing portion 55 extends from the treatment housing 23 in the front-back direction X. The introducing portion 55 has a first end 55a and a second end 55b. The first end 55a corresponds to an upstream end of the switching space 54. The switching space 54 is opened at the first end 55a to the treating space 24. As described above, the switch housing 53 is in communication with the treatment housing 23 at the introducing portion 55. Gas flows from the treatment housing 23 to the switching space 54 through the first end 55a.

The introducing portion 55 penetrates the treatment housing 23. The first end 55a is located inside of the treatment housing 23. That is, the first end 55a is located in the treating space 24. The second end 55b is located outside of the treatment housing 23. Specifically, the second end 55b is located in the first piping space 44.

The introducing portion 55 is positioned relatively close to the lateral wall 25a. In contrast to this, the bases 37A to 37C are positioned relatively close to the lateral wall 25c. In other words, the introducing portion 55 is positioned near the transportation space 12. The bases 37A to 37C are positioned far from the transportation space 12.

The following describes a position of the introducing portion 55 and the like with respect to the lateral wall 25a. FIG. 6 shows distances D1, D2, D3, and D4. The distance D1 is a separation distance between the introducing portion 55 and the lateral wall 25a in plan view. The distance D2 is a separation distance between the holder 31 and the lateral wall 25a in plan view. The distance D3 is a separation distance between the central point G and the lateral wall 25a in plan view. The distance D4 is a separation distance between the base 37A and the lateral wall 25a in plan view. The distance D1 is smaller than the distance D2. The distance D2 is smaller than the distance D3. The distance D3 is smaller than the distance D4.

Here, the lateral wall 25a contacts the transportation space 12. Accordingly, the distances D1 to D4 described above are each approximate to a distance with respect to the transportation space 12. That is, the distance D1 is approximate to a separation distance between the introducing portion 55 and the transportation space 12 in plan view. The distance D2 is approximate to a separation distance between the holder 31 and the transportation space 12 in plan view. The distance D3 is approximate to a separation distance between the central point G and the transportation space 12 in plan view. The distance D4 is approximate to a separation distance between the base 37A and the transportation space 12 in plan view. Accordingly, the separation distance between the introducing portion 55 and the transportation space 12 is smaller than the separation distance between the holder 31 and the transportation space 12 in plan view. The separation distance between the holder 31 and the transportation space 12 is smaller than the separation distance between the central point G and the transportation space 12 in plan view. The separation distance between the central point G and the transportation space 12 are is smaller than the separation distance between the base 37A and the transportation space 12 in plan view.

The switch housing 53 includes a distributing portion 56. The distributing portion 56 is connected to the introducing portion 55. The distributing portion 56 is connected to the second end 55b of the introducing portion 55. The distributing portion 56 extends in the width direction Y.

The distributing portion 56 is located outside of the treatment housing 23. The distributing portion 56 is located in the first piping space 44. The distributing portion 56 is located close to the exhaust pipes 41 to 43.

The exhaust pipes 41 to 43 each contact the treatment housing 23. The exhaust pipes 41 to 43 are located between the treatment housing 23 and the distributing portion 56 in plan view. Specifically, the exhaust pipes 41 to 43 each contact the lateral wall 25b of the treatment housing 23. The exhaust pipes 41 to 43 are located between the lateral wall 25b and the distributing portion 56.

The distributing portion 56 is connected to the exhaust pipes 41 to 43. The distributing portion 56 is connected to outer faces of the exhaust pipes 41 to 43. The switch housing 53 is in communication with the exhaust pipes 41 to 43 at the distributing portion 56.

Specifically, the exhaust pipe 41 has an opening 41k. The opening 41k is formed in the outer face of the exhaust pipe 41. The opening 41k is in communication with a channel in the exhaust pipe 41. The distributing portion 56 is connected to a portion of the exhaust pipe 41 around the opening 41k. This causes the switching space 54 to be in communication with the channel in the exhaust pipe 41 through the opening 41k. Likewise, the exhaust pipes 42 and 43 have openings 42k and 43k, respectively. The distributing portion 56 is connected to portions of the exhaust pipes 42 and 43 around the openings 42k and 43k, respectively.

Figure 8:
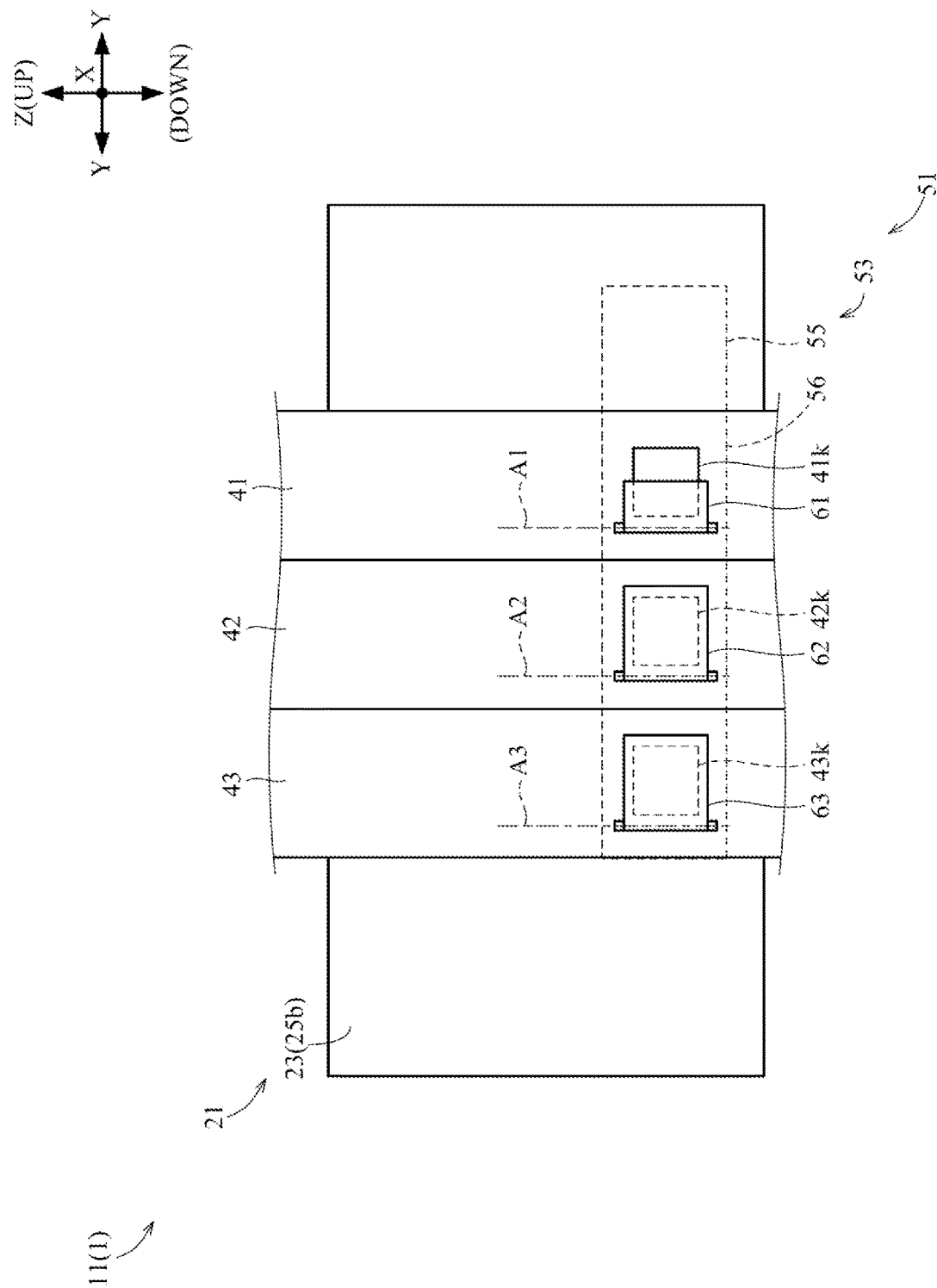
FIG. 8 is a front view of a switching mechanism.

Reference is made to FIGS. 6 and 8. FIG. 8 is a front view of the switching mechanism 51. FIG. 8 shows the switch housing 53 with dotted lines for convenience. The switch housing 53 includes three opening and closing portions 61, 62, and 63. The opening and closing portions 61 to 63 are each arranged inside of the switch housing 53. That is, the switch housing 53 accommodates the opening and closing portions 61 to 63. Specifically, the opening and closing portions 61 to 63 are each arranged inside of the distributing portion 56. The opening and closing portions 61 to 63 are arranged outside of the treatment housing 23. The opening and closing portions 61 to 63 are arranged in the first piping space 44. The opening and closing portions 61, 62, and 63 are positioned so as to face the openings 41k, 42k, and 43k, respectively. The opening and closing portions 61, 62, and 63 can move between a position to open the openings 41k, 42k, and 43k and a position to close the openings 41k, 42k, and 43k, respectively.

In FIGS. 6 and 8, the opening and closing portion 61 is located at a position to open the opening 41k, whereas the opening and closing portions 62 and 63 are located at positions to close the openings 42k and 43k, respectively.

When the opening and closing portion 61 opens the opening 41k, the exhaust pipe 41 is in communication with the treatment housing 23. When the opening and closing portion 61 closes the opening 41k, the exhaust pipe 41 is blocked from the treatment housing 23. As described above, the position of the opening and closing portion 61 that opens the opening 41k corresponds to the position of the opening and closing portion 61 that communicates the treatment housing 23 with the exhaust pipe 41. The position of the opening and closing portion 61 that closes the opening 41k corresponds to the position of the opening and closing portion 61 that blocks the treatment housing 23 from the exhaust pipe 41.

Likewise, when the opening and closing portions 62 and 63 open the openings 42k and 43k, respectively, the exhaust pipes 42 and 43 are each in communication with the treatment housing 23. When the opening and closing portions 62 and 63 close the openings 42k and 43k, respectively, the exhaust pipes 42 and 43 are each blocked from the treatment housing 23. As described above, the positions of the opening and closing portions 62 and 63 that open the openings 42k and 43k correspond to the positions of the opening and closing portion 62 and 63 that communicate the treatment housing 23 with the exhaust pipes 42 and 43, respectively. The positions of the opening and closing portions 62 and 63 that close the openings 42k and 43k correspond to the positions of the opening and closing portion 62 and 63 that block the treatment housings 23 from the exhaust pipes 42 and 43, respectively.

The opening and closing portions 61, 62, and 63 are movable independently. Accordingly, the exhaust pipes 41, 42, and 43 can be in communication with the treatment housing 23 individually. The exhaust pipes 41, 42, and 43 can be blocked from the treatment housing 23 individually.

The opening and closing portions 61, 62, and 63 each have the following configuration as under, for example. The opening and closing portion 61 has a flat plate shape substantially vertical. The opening and closing portion 61 is arranged to be swingable around a rotation axis A1. The rotation axis A1 is an imaginary line parallel to the vertical direction Z. The rotation axis A1 passes through a first end of the opening and closing portion 61. The opening and closing portion 61 swings around the rotation axis A1. The opening and closing portions 62 and 63 have the same configuration as that of the opening and closing portion 61. The opening and closing portion 62 and 63 swing around a rotation axes A2 and A3, respectively.

The opening and closing portions 61, 62, and 63 are each moved by a power source (e.g., electric motor), not shown. Here, the power source is not a component of the switching mechanism 51. The power source is an external component of the switching mechanism 51. The power source may be located, for example, outside of the switch housing 53.

The opening and closing portion 61 corresponds to one example of the first opening and closing portion in the present invention. The opening and closing portion 62 corresponds to one example of the second opening and closing portion in the present invention.

As described above, the switching mechanism 51 is positioned so as not to overlap the holder 31 in plan view. The following describes a position of the switching mechanism 51 in plan view in more detail.

FIG. 6 shows an imaginary circle E3r by alternate long and short dashed lines. The imaginary circle E3r has its center at the central point G. The imaginary circle E3r has a radius three times a radius of the substrate W. The switching mechanism 51 is located outside of the imaginary circle E3r in plan view. That is, a distance between the central point G and the switching mechanism 51 is larger than three times the radius of the substrate W in plan view.

FIG. 6 shows an imaginary circle E5r by alternate long and short dashed lines. The imaginary circle Er has its center at the central point G. The imaginary circle E5r has a radius five times a radius of the substrate W. The switching mechanism 51 is located inside of the imaginary circle E5r in plan view. That is, a distance between the central point G and the switching mechanism 51 is smaller than five times the radius of the substrate W in plan view.

As described above, the switching mechanism 51 is positioned at substantially the same level as that of the treatment housing 23. The following further describes a height position of the switching mechanism 51.

Reference is made to FIG. 7. The switching mechanism 51 has an upper end P1 and a lower end Q1. The upper end P1 and the lower end Q1 correspond to the upper end and the lower end of the switch housing 53, respectively. The treatment housing 23 has an upper end P2 and a lower end Q2. The upper end P2 corresponds to a top face of the upper board 25e. The lower end Q2 corresponds to a lower face of the base board 25f. The upper end P1 is located at a position equal to or lower than the upper end P2. Specifically, the upper end P1 is located at a position lower than the upper end P2. The lower end Q1 is located at a position equal to or higher than the lower end Q2. Specifically, the lower end Q1 is located at a position higher than the lower end Q2.

The switching mechanism 51 is located at a position equal to or lower than the top face 31a of the holder 31. That is, the upper end P1 is located at a position equal to or lower than the top face 31a. Specifically, the upper end P1 is located at a position lower than the top face 31a. Note that the top face 31a of the holder 31 is one example of the upper end of the holder 31 in the present invention.

Structure of Exhaust Path

Figure 9:
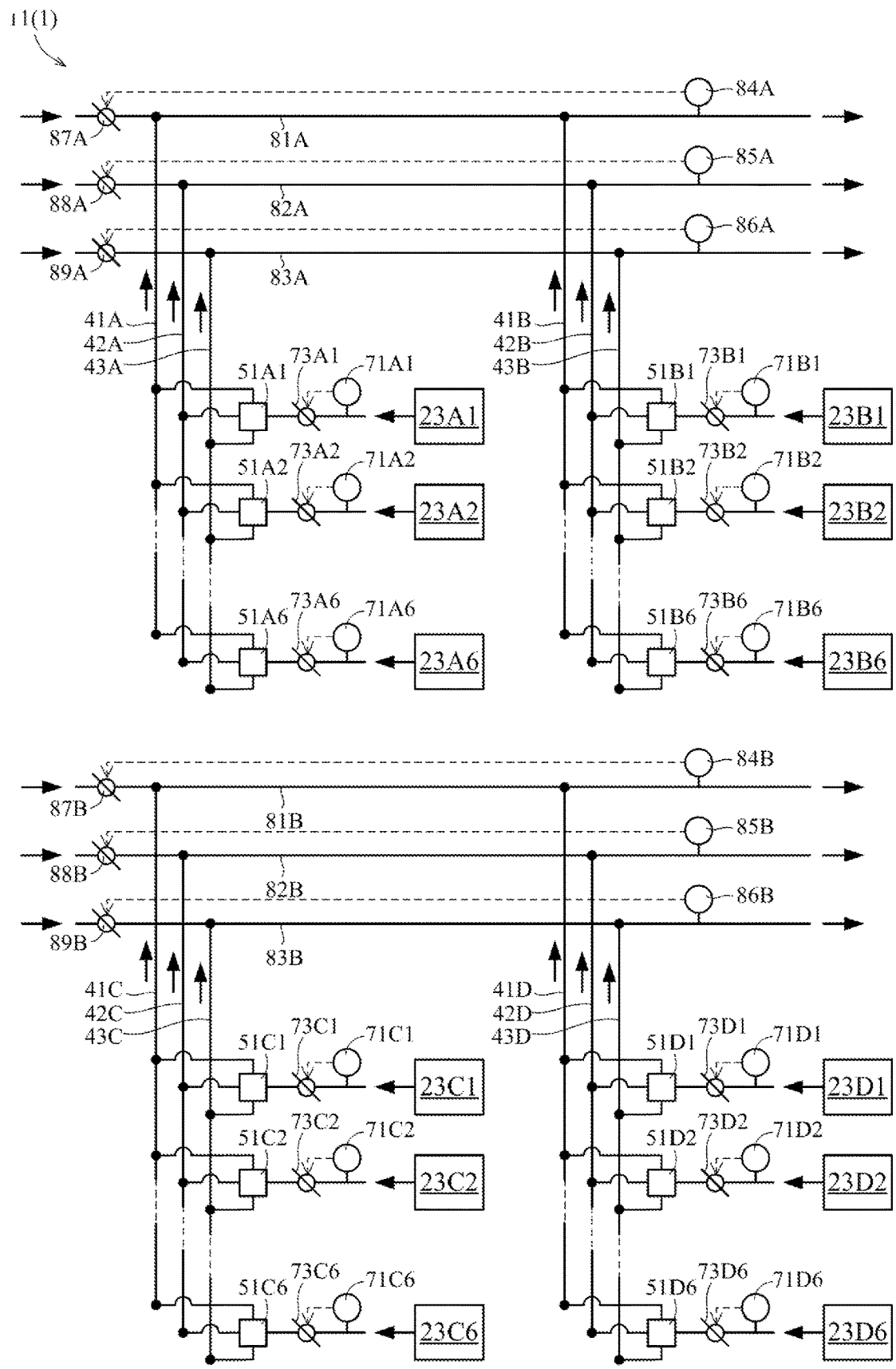
FIG. 9 is a systematic diagram of exhaust paths from treatment housings.

FIG. 9 is a systematic diagram of exhaust paths from treatment housings 23. The substrate treating apparatus 1 includes a pressure sensor 71A1. The pressure sensor 71A1 detects exhaust pressure. Specifically, the pressure sensor 71A1 measures pressure of gas on a primary side (upstream side) of the switching mechanism 51A1. The pressure sensor 71A1 measures pressure of gas that flows from the treatment housing 23A1 to the switching mechanism 51A1.

The substrate treating apparatus 1 includes a pressure adjustment mechanism 73A1. The pressure adjustment mechanism 73 adjusts exhaust pressure. Specifically, the pressure adjustment mechanism 73A1 adjusts pressure of gas on the primary side of the switching mechanism 51A1. More specifically, the pressure adjustment mechanism 73A1 adjusts pressure of gas on the primary side of the switching mechanism 51 in accordance with a detection result by the pressure sensor 71A1.

Likewise, the substrate treating apparatus 1 includes pressure sensors 71A2 to 71A6, 71B1 to 71B6, 71C1 to 71C6, and 71D1 to 71D6. When no distinction is made among the pressure sensors 71A1 to 71A6, 71B1 to 71B6, 71C1 to 71C6, and 71D1 to 71D6, they are each referred to as a pressure sensor 71. The pressure sensors 71 each detect exhaust pressure. Specifically, the pressure sensors 71 each measure pressure of gas on the primary side of the switching mechanisms 51.

The substrate treating apparatus 1 includes pressure adjustment mechanisms 73A2 to 73A6, 73B1 to 73B6, 73C1 to 73C6, and 73D1 to 73D6. When no distinction is made between the pressure adjustment mechanisms 73A1 to 73A6, 73B1 to 73B6, 73C1 to 73C6, and 73D1 to 73D6, they are referred to as a pressure adjustment mechanism 73. The pressure adjustment mechanisms 73 each adjust pressure on the primary side of the switching mechanisms 51 in accordance with a detection result by the pressure sensors 71.

The substrate treating apparatus 1 includes exhaust pipes 81A, 82A, and 83A. The exhaust pipe 81A is connected to the exhaust pipes 41A and 41B. The exhaust pipe 81A exhausts gas from the exhaust pipes 41A and 41B. The exhaust pipe 82A is connected to the exhaust pipes 42A and 42B. The exhaust pipe 82A exhausts gas from the exhaust pipes 42A and 42B. The exhaust pipe 83A is connected to the exhaust pipes 43A and 43B. The exhaust pipe 83A exhausts gas from the exhaust pipes 43A and 43B.

Likewise, the substrate treating apparatus 1 includes exhaust pipes 81B, 82B, and 83B. Here, connection relationships among the exhaust pipes 81B to 83B, the exhaust pipes 41C to 43C and 41D to 43D are same as connection relationships among the exhaust pipes 81A to 83A, the exhaust pipes 41A to 43A and 41B to 43B, respectively.

The substrate treating apparatus 1 includes a pressure sensor 84A. The pressure sensor 84A detects exhaust pressure. Specifically, the pressure sensor 84A measures pressure of gas within the exhaust pipe 81A.

The substrate treating apparatus 1 includes a pressure adjustment mechanism 87A. The pressure adjustment mechanism 87A adjusts exhaust pressure. Specifically, the pressure adjustment mechanism 87A adjusts pressure of gas within the exhaust pipe 81A. More specifically, the pressure adjustment mechanism 87A adjusts pressure of gas within the exhaust pipe 81A in accordance with a detection result by the pressure sensor 84A.

Likewise, the substrate treating apparatus 1 includes pressure sensors 85A, 86A, 84B, 85B, and 86B. The pressure sensors 85A to 86A and 84B to 86B each detect exhaust pressure. The pressure sensors 85A to 86A and 84B to 86B each measure pressure of gas within the exhaust pipes 82A to 83A and 81B to 83B, respectively.

The substrate treating apparatus 1 includes pressure adjustment mechanisms 88A, 89A, 87B, 88B, and 89B. The pressure adjustment mechanism 88A to 89A, 87B to 89B each adjust pressure of gas within the exhaust pipes 82A to 83A, 81B to 83B, respectively, in accordance with detection results by the pressure sensors 85A to 86A, 84B to 86B.

When no distinction is made among the exhaust pipes 81A and 81B, they are each referred to as an exhaust pipe 81. When no distinction is made among the exhaust pipes 82A and 82B, they are each referred to as an exhaust pipe 82. When no distinction is made among the exhaust pipes 83A and 83B, they are each referred to as an exhaust pipe 83. When no distinction is made among the pressure sensors 84A and 84B, they are each referred to as a pressure sensor 84. When no distinction is made among the pressure sensors 85A and 85B, they are each referred to as a pressure sensor 85. When no distinction is made among the pressure sensors 86A and 86B, they are each referred to as a pressure sensor 86. When no distinction is made between the pressure adjustment mechanisms 87A and 87B, they are referred to as a pressure adjustment mechanism 87. When no distinction is made between the pressure adjustment mechanisms 88A and 88B, they are referred to as a pressure adjustment mechanism 88. When no distinction is made between the pressure adjustment mechanisms 89A and 89B, they are referred to as a pressure adjustment mechanism 89.

Reference is made to FIG. 6. The pressure sensor 71 is arranged in the channel between the treatment housing 23 and the switching mechanism 51, for example. The pressure sensor 71 is arranged inside of the switch housing 53 (i.e., switching space 54), for example. The pressure sensor 71 is arranged in the introducing portion 55, for example. The pressure sensor 71 is arranged on a primary side of the distributing portion 56, for example. The pressure sensor 71 is arranged on a primary side of the opening and closing portions 61 to 63, for example.

The pressure adjustment mechanism 73 is arranged in the channel between the treatment housing 23 and the switching mechanism 51, for example. The pressure adjustment mechanism 73 is arranged inside of the switch housing 53 (i.e., switching space 54), for example. The pressure adjustment mechanism 73 is arranged in the introducing portion 55, for example. The pressure adjustment mechanism 73 is arranged on the primary side of the distributing portion 56, for example. The pressure adjustment mechanism 73 is arranged on the primary side of the opening and closing portions 61 to 63, for example. The pressure adjustment mechanism 73 is arranged close to the pressure sensor 71, for example. The pressure adjustment mechanism 73 is located on a secondary side (downstream side) of the pressure sensor 71, for example. The pressure adjustment mechanism 73 is located on a primary side of the pressure sensor 71, for example.

The pressure adjustment mechanism 73 may adjust pressure of gas by controlling a flow rate of gas, for example. Examples of the pressure adjustment mechanism 73 include at least one of a damper and a fan.

Here in FIG. 7, the illustration of pressure sensor 71 and the pressure adjustment mechanism 73 is omitted.

Reference is made to FIGS. 3, 4, and 5. The exhaust pipes 81 to 83 are each positioned higher than the treatment housings 23. The exhaust pipes 81 are each connected to the two exhaust pipes 41 at positions higher than the treatment housings 23. The exhaust pipes 82 are each connected to the two exhaust pipes 42 at positions higher than the treatment housings 23. The exhaust pipes 83 are each connected to the two exhaust pipes 43 at positions higher than the treatment housings 23.

The exhaust pipes 41 to 43 each extend to a position higher than the treatment housings 23. Gas flows upward within the exhaust pipes 41 to 43. The exhaust pipes 41 to 43 each have lower ends. The lower ends of the exhaust pipes 41 to 43 are each closed.

Reference is made to FIG. 3. The exhaust pipes 81A to 83A are located upward of the treatment housings 23A and 23B. The exhaust pipes 81A to 83A align in the width direction Y. The exhaust pipes 81A to 83A are located at the same height position. The exhaust pipes 81B to 83B are located upward of the treatment housings 23C and 23D. The exhaust pipes 81B to 83B align in the width direction Y. The exhaust pipes 81B to 83B are located at the same height position. The exhaust pipes 81B to 83B are located at the same height position as that of the exhaust pipes 81A and 83A.

Figure 10:
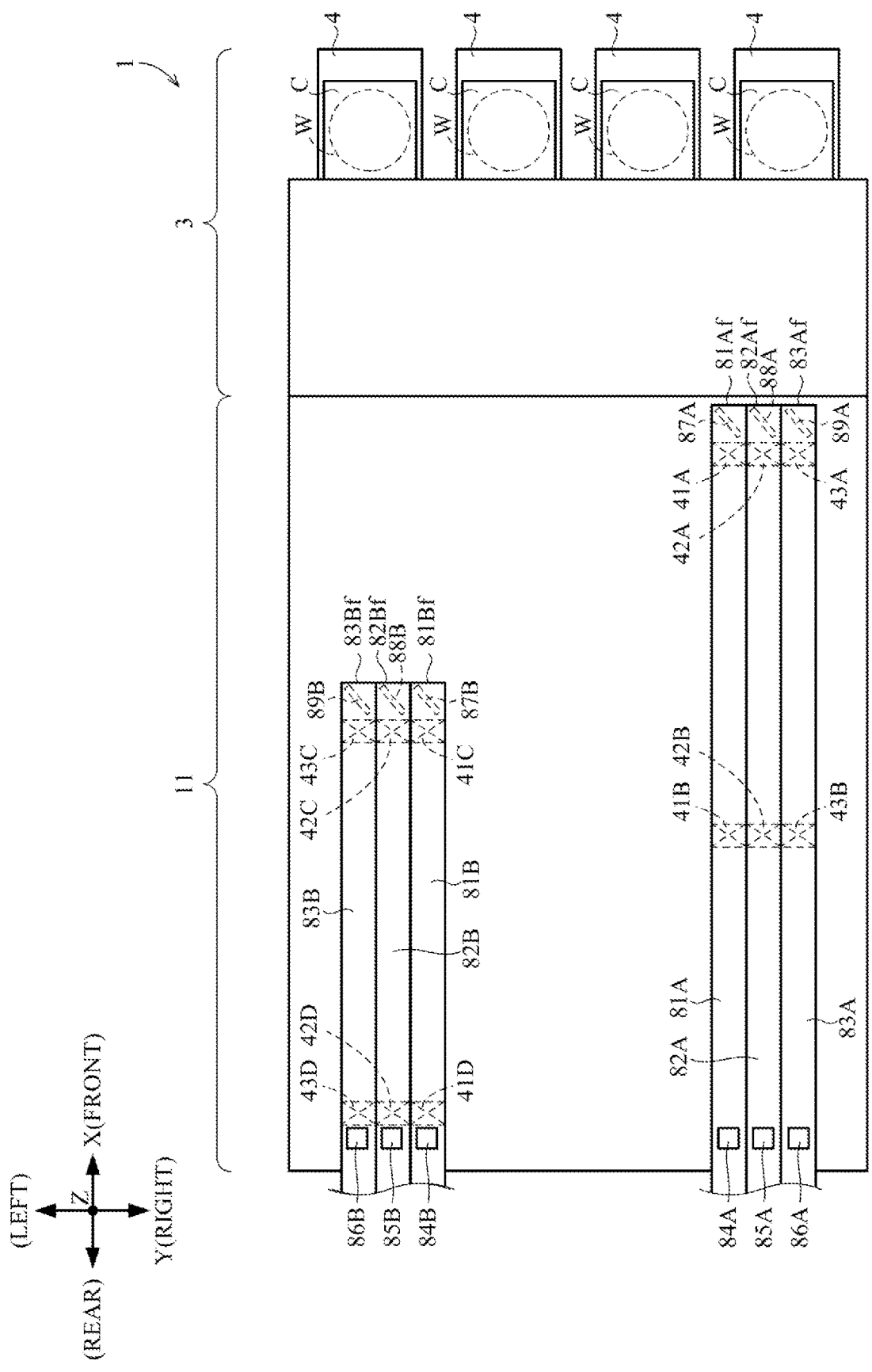
FIG. 10 is a plan view showing an upper part of the treating block.

FIG. 10 is a plan view showing an upper part of the treating block 11. The exhaust pipes 81A to 83A, and 81B to 83B each extend in the front-back direction X. The exhaust pipes 81A to 83A each have the same length. The exhaust pipes 81B to 83B each have the same length. The exhaust pipes 81B to 83B are shorter than the exhaust pipes 81A and 83A.

The exhaust pipes 81A, 82A, and 83A have front ends 81Af, 82Af, and 83Af, respectively. The exhaust pipes 81B, 82B, and 83B have front ends 81Bf, 82Bf, and 83Bf, respectively. The front ends 81Af to 83Af are located more forward than the front ends 81Bf to 83Bf. The front ends 81Af to 83Af are located more rearward than the indexer 3.

The exhaust pipe 81 extends to a position rearward of the treating block 11, and is brought into communication with a first exhaust treating system (not shown). The first exhaust treating system collects gas from the exhaust pipe 81. Likewise, the exhaust pipes 82 and 83 each extend to a position rearward of the treating block 11, and are brought into communication with second and third exhaust treating systems, respectively (not shown). The second and third exhaust treating systems collect gas from the exhaust pipes 82 and 83, respectively. The first to third exhaust treating systems are each an external component of the substrate treating apparatus 1. The first to third exhaust treating systems are provided in a factory where the substrate treating apparatus 1 is arranged, for example.

Gas flows rearward within the exhaust pipes 81 to 83. The front ends 81Af to 83Af and 81Bf to 83Bf correspond to upstream ends of the exhaust pipes 81A to 83A, and 81B to 83B, respectively.

The front ends 81Af to 83Af and 81Bf to 83Bf are open to the outside of the substrate treating apparatus 1. For example, the front ends 81Af to 83Af and 81Bf and 83Bf are opened to a clean room where the substrate treating apparatus 1 is arranged.

The pressure sensor 84 is arranged in the exhaust pipe 81. The pressure sensor 84 is arranged downstream of a connection position of the exhaust pipe 81 and the exhaust pipe 41. For example, the pressure sensor 84A is arranged downstream of a connection position of the exhaust pipe 81A and the exhaust pipe 41A and a connection position of the exhaust pipe 81A and the exhaust pipe 41B. The pressure sensor 84A is arranged more rearward than the connection position of the exhaust pipe 81A and the exhaust pipe 41A and the connection position of the exhaust pipe 81A and the exhaust pipe 41B.

Likewise, the pressure sensors 85 and 86 are arranged in the exhaust pipes 82 and 83, respectively.

The pressure adjustment mechanism 87 is arranged in the exhaust pipe 81. The pressure adjustment mechanism 87 is arranged more upstream of the pressure sensor 84. The pressure adjustment mechanism 87 is located upstream of the connection position of the exhaust pipe 81 and the exhaust pipe 41. For example, the pressure adjustment mechanism 87A is located upstream of the connection position of the exhaust pipe 81A and the exhaust pipe 41A and the connection position of the exhaust pipe 81A and the exhaust pipe 41B. The pressure adjustment mechanism 87A is arranged more forward than the connection position of the exhaust pipe 81A and the exhaust pipe 41A and the connection position of the exhaust pipe 81A and the exhaust pipe 41B. The pressure adjustment mechanism 87A is arranged at the front end 81Af of the exhaust pipe 81A. The pressure adjustment mechanism 87A adjusts a flow rate of gas flowing from the outside of the substrate treating apparatus 1 into the exhaust pipe 81A through the front end 81Af of the exhaust pipe 81A.

Likewise, the pressure adjustment mechanisms 88 and 89 are arranged in the exhaust pipes 82 and 83, respectively.

The pressure adjustment mechanisms 87 to 89 may adjust pressure of gas by controlling a flow rate of gas, for example. Examples of the pressure adjustment mechanisms 87 to 89 include at least one of a damper and a fan.

Control by Substrate Treating Apparatus 1

Reference is made to FIG. 1. The substrate treating apparatus 1 includes a controller 91. The controller 91 is arranged in the indexer 3, for example. The controller 91 controls the substrate treating apparatus 1.

Figure 11:
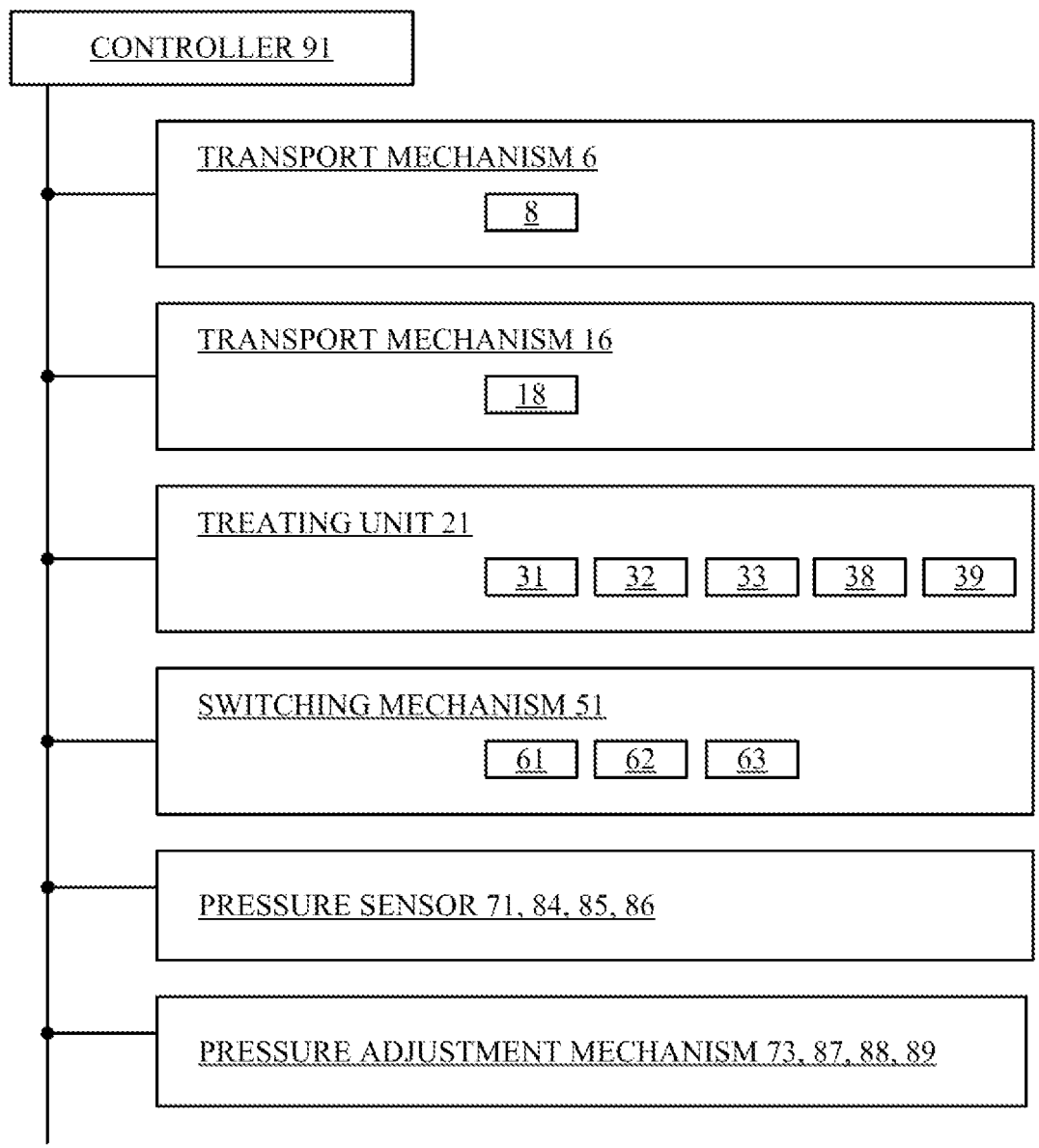
FIG. 11 is a control block diagram of the substrate treating apparatus.

FIG. 11 is a control block diagram of the substrate treating apparatus 1. The controller 91 controls the transport mechanisms 6 and 16. Specifically, the controller 91 controls the hand driving units 8 and 18. The controller 91 controls the treating unit 21. Specifically, the controller 91 controls the holder 31, the rotation driving unit 32, the liquid supplying unit 33, the cup 38, and the blowing unit 39. The controller 91 controls the switching mechanism 51. Specifically, the controller 91 controls the opening and closing portions 61 to 63. The controller 91 obtains detection results from the pressure sensors 71, 84, 85, and 86. The controller 91 controls the pressure adjustment mechanisms 73, 87, 88, and 89. The controller 91 is communicatively connected to these components.

The controller 91 is implemented by a central processing unit (CPU) that performs various processes, a random access memory (RAM) as a workspace of arithmetic processing, and a storage medium such as a fixed disk. The storage medium stores various kinds of information in advance. The storage medium stores, for example, information (treatment recipes) providing operating conditions about the treatments performed by the treating units 21. The storage medium stores, for example, information providing operating conditions about switching the exhaust paths by the switching mechanism 51. The storage medium stores information providing operating conditions about adjusting exhaust pressure by the pressure adjustment mechanisms 73, and 87 to 89.

Here, the treatment housing 23A2 is one example of the second treatment housing in the present invention. The holder 32 of the treating unit 21A2 is one example of the second holder in the present invention. The liquid supplying unit 33 of the treating unit 21A2 is one example of the second liquid supplying unit in the present invention. The switching mechanism 51A2 is one example of the second switching mechanism in the present invention.

The pressure sensor 71A1 is one example of the first pressure sensor in the present invention. The pressure sensor 71B1 is one example of the third pressure sensor in the present invention. The pressure adjustment mechanism 73A1 is one example of the first pressure adjustment mechanism in the present invention. The pressure adjustment mechanism 73B1 is one example of the third pressure adjustment mechanism in the present invention.

The exhaust pipe 81A is one example of the fifth exhaust pipe in the present invention. The exhaust pipe 82A is one example of the sixth exhaust pipe in the present invention. The pressure sensor 84A is one example of the fifth pressure sensor in the present invention. The pressure sensor 85A is one example of the sixth pressure sensor in the present invention. The pressure adjustment mechanism 87A is one example of the fifth pressure adjustment mechanism in the present invention. The pressure adjustment mechanism 88A is one example of the sixth pressure adjustment mechanism in the present invention.

Exemplary Operation of Substrate Treating Apparatus 1

Figure 12:
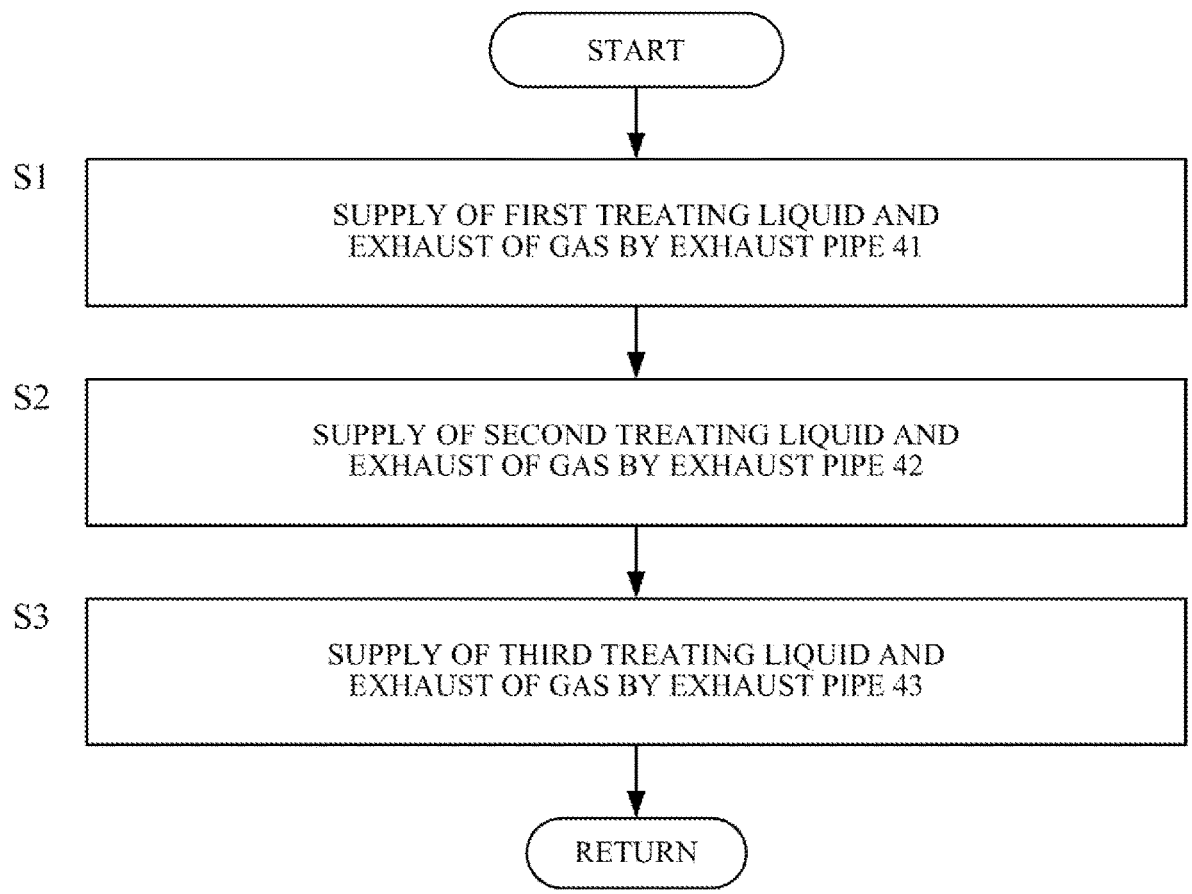
FIG. 12 is a flowchart showing procedures of treating a substrate.

FIG. 12 is a flowchart showing procedures of treating a substrate W. The following describes exemplary operation of one treating unit 21. It is assumed that the substrate W is already held by the holder 31. It is assumed that each component operates under control by the controller 91.

Step S1

The liquid supplying unit 33 supplies the first treating liquid. Specifically, the nozzle 34A is moved from the retreating position to the treating position. The nozzle 34A supplies the first treating liquid to the substrate W held by the holder 31. Gas within the treatment housing 23 contains ingredients derived from the first treating liquid.

The switching mechanism 51 switches the exhaust path of the treatment housing 23 to the exhaust pipe 41. Specifically, the switching mechanism 51 brings the treatment housing 23 in communication with the exhaust pipe 41. Gas flows from the treatment housing 23 through the switching mechanism 51 to the exhaust pipe 41. The exhaust pipe 41 exhausts gas from the treatment housing 23. Gas further flows from the exhaust pipe 41 to the exhaust pipe 81. The exhaust pipe 81 exhausts gas from the exhaust pipe 41.

Note that at least either the exhaust pipe 42 or 43 may exhaust gas within another treatment housing 23 during the step S1. The same is applicable to steps S2 and S3, which are to be mentioned later.

The pressure sensor 71 determines pressure of gas on the primary side of the switching mechanism 51. The pressure adjustment mechanism 73 adjusts pressure of gas on the primary side of the switching mechanism 51 in accordance with the detection result by the pressure sensor 71.

The following exemplarily describes more detailed operation of the pressure adjustment mechanism 73. The pressure adjustment mechanism 73 may perform the following exemplary operation also in the steps S2 and S3, which are to be mentioned later. The pressure adjustment mechanisms 73 each adjust the exhaust pressure to be constant, for example. The pressure adjustment mechanisms 73 each adjust the detection results from the pressure sensors 71 to be the constant, for example. The pressure adjustment mechanisms 73A1 and 73A2 adjust the pressure of gas on the primary side of the switching mechanism 51A1 to be equal to the pressure of gas on the primary side of the switching mechanism 51A2, for example. The pressure adjustment mechanisms 73A1 to 73A6 adjust the pressure of gas on the primary side of the switching mechanisms 51A1 to 51A6 to be equal to one another, for example. The pressure adjustment mechanisms 73A1 and 73B1 adjust the pressure of gas on the primary side of the switching mechanism 51A1 to be equal to the pressure of gas on the primary side of the switching mechanism 51B1, for example. The pressure adjustment mechanisms 73A1, 73B1, 73C1, and 73D1 adjust the pressure of gas on the primary side of the switching mechanisms 51A1, 51B1, 51C1, and 51D1, respectively, to be equal to one another, for example. The pressure adjustment mechanisms 73 adjust the pressure of gas on the primary side of the switching mechanisms 51 to be equal to one another, for example.

The pressure sensors 84 to 86 each determine pressure of gas within the exhaust pipes 81 to 83, respectively. The pressure adjustment mechanisms 87 to 89 each adjust pressure of gas within the exhaust pipes 81 to 83, respectively, in accordance with the detection results by the pressure sensors 84 to 86.

The following exemplarily describes more detailed operation of the pressure adjustment mechanisms 87 to 89. Note that the pressure adjustment mechanisms 87 to 89 may perform the following exemplary operation also in the steps S2 and S3, which are to be mentioned later. The pressure adjustment mechanisms 87 to 89 each adjust the exhaust pressure to be constant, for example. The pressure adjustment mechanism 87A adjusts a detection result from the pressure sensor 84A to be constant, for example. The pressure adjustment mechanisms 87A to 89A adjust the pressure of gas within the exhaust pipe 81A to be equal to the pressure of gas within the exhaust pipe 82B and the pressure of gas within the exhaust pipe 83A, for example. The pressure adjustment mechanisms 87A and 87B adjust the pressure of gas within the exhaust pipe 81A to be equal to the pressure of gas within the exhaust pipe 81B, for example. The pressure adjustment mechanisms 87A to 89A, and 87B to 89B adjust the pressure of gas within the exhaust pipes 81A to 83A and 81B to 83B to be equal to one another, for example.

Step S2

The liquid supplying unit 33 supplies the second treating liquid. Specifically, the nozzle 34A is moved from the treating position to the retreating position, and the nozzle 34B is moved from the retreating position to the treating position. The nozzle 34B supplies the second treating liquid to the substrate W held by the holder 31. Gas within the treatment housing 23 contains ingredients derived from the second treating liquid.

The switching mechanism 51 switches the exhaust path of the treatment housing 23 to the exhaust pipe 42. Specifically, the switching mechanism 51 brings the treatment housing 23 in communication with the exhaust pipe 42. Gas flows from the treatment housing 23 through the switching mechanism 51 to the exhaust pipe 42. The exhaust pipe 42 exhausts gas from the treatment housing 23. Gas further flows from the exhaust pipe 42 to the exhaust pipe 82. The exhaust pipe 82 exhausts gas from the exhaust pipe 42.

The pressure sensor 71 determines pressure of gas on the primary side of the switching mechanism 51. The pressure adjustment mechanism 73 adjusts pressure of gas on the primary side of the switching mechanism 51 in accordance with the detection result by the pressure sensor 71.

The pressure sensors 84 to 86 each determine pressure of gas within the exhaust pipes 81 to 83, respectively. The pressure adjustment mechanisms 87 to 89 each adjust pressure of gas within the exhaust pipes 81 to 83, respectively, in accordance with the detection results by the pressure sensors 84 to 86.

Step S3

The liquid supplying unit 33 supplies the third treating liquid. Specifically, the nozzle 34B is moved from the treating position to the retreating position, and the nozzle 34C is moved from the retreating position to the treating position. The nozzle 34C supplies the third treating liquid to the substrate W held by the holder 31. Gas within the treatment housing 23 contains ingredients derived from the third treating liquid.

The switching mechanism 51 switches the exhaust path of the treatment housing 23 to the exhaust pipe 43. Specifically, the switching mechanism 51 brings the treatment housing 23 in communication with the exhaust pipe 43. Gas flows from the treatment housing 23 through the switching mechanism 51 to the exhaust pipe 43. The exhaust pipe 43 exhausts gas from the treatment housing 23. Gas further flows from the exhaust pipe 43 to the exhaust pipe 83. The exhaust pipe 83 exhausts gas from the exhaust pipe 43.

The pressure sensor 71 determines pressure of gas on the primary side of the switching mechanism 51. The pressure adjustment mechanism 73 adjusts pressure on the primary side of the switching mechanism 51 in accordance with the detection result by the pressure sensor 71.

The pressure sensors 84 to 86 each determine pressure of gas within the exhaust pipes 81 to 83, respectively. The pressure adjustment mechanisms 87 to 89 each adjust pressure of gas within the exhaust pipes 81 to 83, respectively, in accordance with the detection results by the pressure sensors 84 to 86.

EFFECT OF EMBODIMENTS

As described above, in the substrate treating apparatus 1, the switching mechanism 51 is located at the position substantially equal in level to the treatment housing 23, achieving to the shortened channel between the switching mechanism 51 and the treatment housing 23 suitably. As a result, gas from the treatment housing 23 can be exhausted suitably.

Moreover, the substrate treating apparatus 1 can obtain the following effects.

At least part of the switching mechanism 51 is located laterally of the treatment housing 23. Accordingly, a total height of the treatment housing 23 and the switching mechanism 51 can be suppressed. This can reduce the height of the substrate treating apparatus 1. Moreover, the number of treatment housings 23 that align in the vertical direction Z can be increased easily. This achieves suitably enhanced throughput of the substrate treating apparatus 1 while suppressing upsizing of the substrate treating apparatus 1. Here, the ""height" corresponds to a length in the vertical direction Z.

The upper end P1 of the switching mechanism 51 is equal to or lower in level than the upper end P2 of the treatment housing 23. The lower end Q1 of the switching mechanism 51 is equal to or higher in level than the lower end Q2 of the treatment housing 23. In such a manner as above, the switching mechanism 51 is entirely located at a position equal to or lower in level than the upper end P2 and equal to or higher in level than the lower end Q2. Accordingly, the channel between the switching mechanism 51 and the treatment housing 23 can be shortened suitably.

The switch housing 53 is located at a position equal to or lower than the top face 31a of the holder 31 . . . . Accordingly, the switching mechanism 51 has a relatively small size. Specifically, a height of the switching mechanism 51 is smaller than a height of the treatment housing 23. This can suppress upsizing of the substrate treating apparatus 1 suitably.

The switching mechanism 51 is positioned so as not to overlap the holder 31 in plan view. This can avoid interference between the holder 31 and the switching mechanism 51 easily.

The distance between the central point G and the switching mechanism 51 is larger than three times the radius of the substrate W in plan view. That is, the switching mechanism 51 is located in an area whose distance from the central point G is larger than three times the radius of the substrate W in plan view. This can avoid interference between the holder 31 and the switching mechanism 51 certainly.

The distance between the central point G and the switching mechanism 51 is smaller than five times the radius of the substrate W in plan view. That is, the switching mechanism 51 is located in an area whose distance from the central point G is smaller than five times the radius of the substrate W in plan view. Accordingly, a channel between the switching mechanism 51 and the treatment housing 23 can be shortened effectively. Moreover, the switching mechanism 51 is relatively small in plan view. This can suppress increase in footprint of the substrate treating apparatus 1 suitably.

The exhaust pipes 41 to 43 each extend in the vertical direction Z. Accordingly, installation areas of the exhaust pipes 41 to 43 in plan view can be reduced suitably. This can suppress increase in footprint of the substrate treating apparatus 1 suitably.

The substrate treating apparatus 1 includes the first piping space 44. This can arrange the exhaust pipes 41 to 43 suitably.

The transport mechanism 16 transports a substrate W to the holder 31. The transport mechanism 16 is arranged in the transportation space 12. The transportation space 12 is located adjacent to the treatment housing 23. Accordingly, the transport mechanism 16 can transport a substrate W to the holder 31 easily.

The substrate treating apparatus 1 includes the first piping space 44. This can arrange the exhaust pipes 41 to 43 suitably.

The first piping space 44 is located adjacent to the treatment housing 23. This can arrange the exhaust pipes 41 to 43 close to the treatment housing 23.

The transportation space 12 extends in the front-back direction X. The treatment housing 23 and the first piping space 44 align in the front-back direction X. Accordingly, the transportation space 12, adjacent to the treatment housing 23, and the first piping space 44, adjacent to the treatment housing 23, can be located suitably. This can prevent interference of the transport mechanism 16 with the exhaust pipes 41 to 43 suitably.

The first piping space 44 and the treatment housing 23 align in the front-back direction X. The exhaust pipes 41 to 43 align in the width direction Y. This can arrange the exhaust pipes 41 to 43 close to the treatment housing 23, respectively.

At least part of the switching mechanism 51 is arranged in the first piping space 44. This can arrange the switching mechanism 51 close to the treatment housing 23. Moreover, the switching mechanism 51 can be connected to the exhaust pipes 41 to 43 easily.

The switching mechanism 51 includes the opening and closing portions 61, 62, and 63. The opening and closing portion 61 can move between the position to communicate the treatment housing 23 with the exhaust pipe 41 and the position to block the treatment housing 23 from the exhaust pipe 41. The opening and closing portion 62 can move between the position to communicate the treatment housing 23 with the exhaust pipe 42 and the position to block the treatment housing 23 from the exhaust pipe 42. The opening and closing portion 63 can move between the position to communicate the treatment housing 23 with the exhaust pipe 43 and the position to block the treatment housing 23 from the exhaust pipe 43. The opening and closing portions 61, 62, and 63 are movable independently. Accordingly, the switching mechanism 51 can bring the exhaust pipes 41 to 43 individually into communication with the treatment housing 23. The switching mechanism 51 can block the exhaust pipes 41 to 43 individually from the treatment housing 23.

The switching mechanism 51 includes a switch housing 53. The switch housing 53 is connected to the treatment housing 23. The switch housing 53 accommodates the opening and closing portions 61 to 63. Accordingly, the switch housing 53 can suitably form a channel between the treatment housing 23 and the opening and closing portions 61 to 63.

The switch housing 53 is connected to the treatment housing 23 and the exhaust pipe 41. Accordingly, the switch housing 53 can suitably form a channel between the treatment housing 23 and exhaust pipe 41. Moreover, the switch housing 53 is also connected to the exhaust pipes 42 and 43.

Accordingly, the switch housing 53 can suitably form a channel between the treatment housing 23 and exhaust pipes 42 and 43.

The opening and closing portions 61 to 63 are arranged within one switch housing 53. Accordingly, the channel between the treatment housing 23 and the opening and closing portions 61 to 63 can be suitably made much shorter.

The opening and closing portions 61 to 63 are arranged within one switching space 54. Accordingly, the opening and closing portions 61 to 63 can open and close the openings 41k to 43k of the exhaust pipes 41 to 43 under the same condition. Consequently, a condition of exhausting gas from the treatment housing 23 can be made common easily among the exhaust pipes 41 to 43. For example, variation in exhaust pressure can be suppressed among the exhaust pipes 41 to 43. For example, variation in exhaust flow rates can be suppressed among the exhaust pipes 41 to 43. This achieves enhanced quality of treatments to substrates W in the treatment housings 23 suitably.

The switch housing 53 includes the introducing portion 55. The introducing portion 55 is connected to the treatment housing 23. Accordingly, gas can be introduced easily from the treatment housing 23 to the switch housing 53.

The introducing portion 55 extends in the front-back direction X. As described above, the transportation space 12 extends in the front-back direction X. Accordingly, the transportation space 12, adjacent to the treatment housing 23, and the introducing portion 55, connected to the treatment housing 23, can be located suitably. This can prevent interference of the transport mechanism 16 with the introducing portion 55 suitably.

The switch housing 53 includes the distributing portion 56. The distributing portion 56 is connected to the introducing portion 55. The distributing portion 56 is connected to the exhaust pipes 41 to 43. Accordingly, gas can be exhausted easily from the switch housing 53 to the exhaust pipes 41 to 43 easily.

The distributing portion 56 is connected to the exhaust pipes 41 to 43. The distributing portion 56 accommodates the opening and closing portions 61 to 63. Accordingly, the switching mechanism 51 switches the exhaust path of the treatment housing 23 among the exhaust pipes 41 to 43 easily.

The distributing portion 56 extends in the width direction Y. As described above, the exhaust pipes 41 to 43 align in the width direction Y. In such a manner as above, the distributing portion 56 extends in parallel to the direction where the exhaust pipes 41 to 43 align. Accordingly, the distributing portion 56 can be connected to the exhaust pipes 41 to 43 easily.

The introducing portion 55 is positioned relatively close to the transportation space 12. Specifically, the separation distance between the introducing portion 55 and the transportation space 12 is smaller than the separation distance between the holder 31 and the transportation space 12 in plan view. This can prevent interference easily between the introducing portion 55 and members (e.g., bases 37A to 37C) arranged within the treatment housing 23. Accordingly, gas can be introduced smoothly from the treatment housing 23 to the introducing portion 55. For example, disturbed flow of gas from the treatment housing 23 into the introducing portion 55 caused by the members arranged within the treatment housing 23 can be prevented suitably.

The gas supply pipe 48 supplies gas into the treatment housing 23. The second piping space 46 accommodates the gas supply pipe 48. The second piping space 46 is located adjacent to the treatment housing 23. Accordingly, the gas supply pipe 48 can supply gas to the first treatment housing 23 easily.

The first piping space 44A, the treatment housing 23A, and the second piping space 46 align in this order in the front-back direction X. Accordingly, the first piping space 44 and the second piping space 46 are spaced apart from each other by the treatment housing 23. Consequently, the gas supply pipe 48 provides no limitation in arrangement of the exhaust pipes 41 to 43. That is, enhanced flexibility of the arrangement of the exhaust pipes 41 to 43 can be obtained suitably. For example, this allows the exhaust pipes 41 to 43 to be arranged close to the treatment housing 23 easily.

The following describes the treatment housing 23A as one example. The substrate treating apparatus 1 includes the treatment housing 23A2. The treatment housing 23A2 is located below the treatment housing 23A1. Accordingly, installation areas of the treatment housings 23A1 and 23A2 in plan view can be reduced suitably. This can suppress increase in footprint of the substrate treating apparatus 1 suitably.

The substrate treating apparatus 1 includes the switching mechanism 51A2. The switching mechanism 51A2 switches the exhaust path of the treatment housing 23A2 to one of the exhaust pipes 41A to 43A. Accordingly, the exhaust pipes 41A to 43A exhaust gas within the treatment housing 23A2 in addition to gas within the treatment housing 23A1. This achieves a simplified configuration of the substrate treating apparatus 1.

The switching mechanism 51A2 is positioned at substantially the same level as that of the treatment housing 23A2. Accordingly, a channel between the treatment housing 23A2 and the switching mechanism 51A2 can be shortened suitably. As a result, gas from the treatment housing 23A2 can be exhausted suitably.

The treatment housing 23A2 is located at the position equal to that of the treatment housing 23A1 in plan view. The switching mechanism 51A2 is located at the position equal to that of the switching mechanism 51A1 in plan view. Accordingly, a relative position between the treatment housing 23A2 and the switching mechanism 51A2 is substantially equal to a relative position between the treatment housing 23A1 and the switching mechanism 51A1. Consequently, the channel between the treatment housing 23A2 and the switching mechanism 51A2 is equal in length and shape to the channel between the treatment housing 23A1 and the switching mechanism 51A1. Consequently, a condition of exhausting gas can be made common easily between the treatment housings 23A1 and 23A2. For example, variation in exhaust pressure can be suppressed between the treatment housings 23A1 and 23A2. For example, variation in exhaust flow rates can be suppressed between the treatment housings 23A1 and 23A2. This results in equal quality of treatments to substrates W between the treatment housings 23A1 and 23A2 suitably.

The switching mechanism 51A2 is located at the position equal to that of the switching mechanism 51A1 in plan view. The exhaust pipe 41A extends in the vertical direction Z. Accordingly, the switching mechanisms 51A1 and 51A2 can each be connected to the exhaust pipe 41A easily. Likewise, the exhaust pipes 42A and 43A each extend in the vertical direction Z. Accordingly, the switching mechanisms 51A1 and 51A2 can be connected to the exhaust pipes 42A and 43A, respectively, easily.

Likewise, the substrate treating apparatus 1 includes the treatment housings 23A3 to 23A6. The treatment housings 23A3 to 23A6 are each located below the treatment housing 23A1. This can suppress increase in footprint of the substrate treating apparatus 1 more suitably.

The substrate treating apparatus 1 includes the switching mechanisms 51A3 to 51A6. The switching mechanisms 51A3 to 51A6 switch exhaust paths of the treatment housings 23A3 to 23A6, respectively, to one of the exhaust pipes 41A to 43A. Accordingly, the exhaust pipes 41A to 43A exhaust gas within the treatment housings 23A1 to 23A6, respectively. This achieves a much simplified configuration of the substrate treating apparatus 1.

The treatment housings 23A3 to 23A6 are located at the position equal to that of the treatment housing 23A1 in plan view. The switching mechanisms 51A3 to 51A6 are located at the position equal to that of the switching mechanism 51A1 in plan view. Accordingly, the relative positions between the treatment housings 23A3 to 23A6 and the switching mechanisms 51A3 to 51A6, respectively, are substantially equal to the relative position between the treatment housing 23A1 and the switching mechanism 51A1. This results in equal quality of treatments to substrates W between the treatment housings 23A1 to 23A6 suitably.

The switching mechanisms 51A3 to 51A6 are located at the position equal to that of the switching mechanism 51A1 in plan view. The exhaust pipes 41A to 43A each extend in the vertical direction Z. Accordingly, the switching mechanisms 51A3 to 51A6 can be connected to the exhaust pipes 41A to 43A, respectively, easily.

The pressure sensor 71 measures pressure of gas on the primary side of the switching mechanism 51. The pressure adjustment mechanism 73 adjusts pressure of gas on the primary side of the switching mechanism 51 in accordance with the detection result by the pressure sensor 71. Accordingly, the pressure on the primary side of the switching mechanism 51 can be adjusted suitably. This achieves enhanced quality of treatments to substrates W in the treatment housing 23 suitably.

The pressure adjustment mechanism 73 adjusts the exhaust pressure to be constant, for example. This achieves suppression of change in exhaust pressure when substrates W are treated in the treatment housing 23. This achieves enhanced quality of treatments to substrates W in the treatment housing 23 suitably.

The pressure adjustment mechanisms 73A1 and 73A2 adjust the pressure of gas on the primary side of the switching mechanism 51A1 to be equal to the pressure of gas on the primary side of the switching mechanism 51A2, for example. This can make the exhaust pressure when substrates W are treated in the treatment housing 23A1 to be suitably equal to the exhaust pressure when substrates W are treated in the treatment housing 23A2. Accordingly, quality of treatments to substrates W can be made uniform suitably between the treatment housings 23A1 and 23A2 that align in the vertical direction Z.

The pressure adjustment mechanisms 73A1 to 73A6 adjust the pressure of gas on the primary side of the switching mechanisms 51A1 to 51A6 to be equal to one another, for example. Accordingly, quality of treatments to substrates W can be made uniform suitably among all the treatment housings 23A1 to 23A6 that align in the vertical direction Z.

The pressure adjustment mechanisms 73A1 and 73B1 adjust the pressure of gas on the primary side of the switching mechanism 51A1 to be equal to the pressure of gas on the primary side of the switching mechanism 51B1, for example. Accordingly, quality of treatments to substrates W can be made uniform suitably among the treatment housings 23A1 and 23B1 that are positioned at the same level.

The pressure adjustment mechanisms 73A1, 73B1, 73C1, and 73D1 adjust the pressure of gas on the primary side of the switching mechanisms 51A1, 51B1, 51C1, and 51D1, respectively, to be equal to one another, for example. Accordingly, quality of treatments to substrates W can be made uniform suitably among all the treatment housings 23A1, 23B1, 23C1, and 23D1 that are positioned at the same level.

The pressure adjustment mechanisms 73 adjust the pressure of gas on the primary side of the switching mechanisms 51 to be equal to one another, for example. Accordingly, quality of treatments to substrates W can be made uniform suitably among all the treatment housings 23.

The exhaust pipe 81A is connected to the exhaust pipes 41A and 41B. The exhaust pipe 81A exhausts gas from the exhaust pipes 41A and 41B. In such a manner as above, the two exhaust pipes 41A and 41B are put together into one exhaust pipe 81A. This achieves a simplified configuration of the substrate treating apparatus 1.

Likewise, the exhaust pipe 82A is connected to the exhaust pipes 42A and 42B. The exhaust pipe 82A exhausts gas from the exhaust pipes 42A and 42B. The exhaust pipe 83A is connected to the exhaust pipes 43A and 43B. The exhaust pipe 83A exhausts gas from the exhaust pipes 43A and 43B. This achieves a more simplified configuration of the substrate treating apparatus 1.

The pressure sensor 84 measures pressure of gas within the exhaust pipe 81. The pressure adjustment mechanism 87 adjusts pressure of gas within the exhaust pipe 81 in accordance with the detection result by the pressure sensor 84. Accordingly, the pressure in the exhaust pipe 81 can be adjusted suitably. This achieves more enhanced quality of treatments to substrates W in the treatment housing 23 suitably.

Likewise, the pressure sensors 85 and 86 measure pressure of gas within the exhaust pipes 82 and 83, respectively. The pressure adjustment mechanisms 88 and 89 adjust pressure of gas within the exhaust pipes 82 and 83 in accordance with the detection results by the pressure sensors 85 and 86, respectively. Accordingly, the pressure in the exhaust pipes 82 and 83 can be adjusted suitably. This achieves enhanced quality of treatments to substrates W in the treatment housing 23 suitably.

The following describes the exhaust pipe 81A as one example. The pressure sensor 84A is arranged downstream of the connection position of the exhaust pipe 81A and the exhaust pipe 41A and the connection position of the exhaust pipe 81A and the exhaust pipe 41B. Both gas from the exhaust pipe 41A and gas from the exhaust pipe 41B flow downstream of the connection position of the exhaust pipe 81A and the exhaust pipe 41A and the connection position of the exhaust pipe 81A and the exhaust pipe 41B. Accordingly, the pressure sensor 84A can detect the entire exhaust pressure of the exhaust pipes 41A and 41B suitably.

Likewise, the pressure sensor 85A is arranged downstream of the connection position of the exhaust pipe 82A and the exhaust pipe 42A and the connection position of the exhaust pipe 82A and the exhaust pipe 42B. Accordingly, the pressure sensor 85A can detect the entire exhaust pressure of the exhaust pipes 42A and 42B suitably. The pressure sensor 86A is arranged downstream of the connection position of the exhaust pipe 83A and the exhaust pipe 43A and the connection position of the exhaust pipe 83A and the exhaust pipe 43B. Accordingly, the pressure sensor 86A can detect the entire exhaust pressure of the exhaust pipes 43A and 43B suitably.

The pressure adjustment mechanism 87 adjusts the exhaust pressure to be constant, for example. Likewise, the pressure adjustment mechanisms 88 and 89 adjust the exhaust pressure to be constant. This achieves suppression of change in exhaust pressure when substrates W are treated in the treatment housing 23. This achieves enhanced quality of treatments to substrates W in the treatment housing 23 suitably.

The pressure adjustment mechanisms 87A to 89A adjust the pressure of gas within the exhaust pipe 81A to be equal to the pressure of gas within the exhaust pipe 82A and the pressure of gas within the exhaust pipe 83A. Accordingly, exhaust pressure can be made uniform suitably among the exhaust pipes 41A to 43A and 41B to 43B. This achieves suppression of change in exhaust pressure when the exhaust paths of the treatment housings 23A and 23B are switched. This achieves enhanced quality of treatments to substrates W in the treatment housings 23A and 23B suitably.

The pressure adjustment mechanisms 87A and 87B adjust the pressure of gas within the exhaust pipe 81A to be equal to the pressure of gas within the exhaust pipe 81B, for example. This can suppress variation in exhaust pressure between the exhaust pipes 81A and 81B even when the exhaust pipes 81A and 81B have different lengths. Accordingly, exhaust pressure can be made uniform between the exhaust pipes 41A and 41B and the exhaust pipes 41C and 41D. Consequently, equal quality of treatments to substrates W can be obtained suitably between the treatment housings 23A and 23B and the treatment housings 23C and 23D.

The pressure adjustment mechanisms 87A to 89A, and 87B to 89B adjust the pressure of gas within the exhaust pipes 81A to 83A and 81B to 83B to be equal to one another, for example. This can suppress variation in exhaust pressure between the exhaust pipes 81A to 83A and 81B to 83B even when the exhaust pipes 81A to 83A and 81B to 83B have different lengths. Accordingly, exhaust pressure can be made uniform between the exhaust pipes 41A to 43A, 41B to 43B, 41C to 43C, and 41D to 43D. Consequently, equal quality of treatments to substrates W can be obtained more suitably among the treatment housings 23A, 23B, 23C, and 23D.

The liquid supplying unit 33 can supply the first treating liquid, the second treating liquid, and the third treating liquid. The liquid supplying unit 33 switches a treating liquid to be supplied among the first treating liquid, the second treating liquid, and the third treating liquid. The switching mechanism 51 can switch the exhaust path of the treatment housing 23 among the exhaust pipes 41 to 43 in accordance with the switch of the treating liquid used within the treatment housing 23. When the liquid supplying unit 33 supplies the first treating liquid, the switching mechanism 51 switches the exhaust path of the treatment housing 23 to the exhaust pipe 41. When the liquid supplying unit 33 supplies the second treating liquid, the switching mechanism 51 switches the exhaust path of the treatment housing 23 to the exhaust pipe 42. When the liquid supplying unit 33 supplies the third treating liquid, the switching mechanism 51 switches the exhaust path of the treatment housing 23 to the exhaust pipe 43. As a result, when the liquid supplying unit 33 supplies the first treating liquid, the exhaust pipe 41 exhausts gas in the treatment housing 23. When the liquid supplying unit 33 supplies the second or third treating liquid, the exhaust pipe 41 does not exhaust gas in the treatment housing 23. Consequently, contamination and damages in the exhaust pipe 41 can be suppressed suitably. From the same reason as above, contamination and damages also in the exhaust pipes 42 and 43 can be suppressed suitably. Accordingly, gas flows smoothly within the exhaust pipes 41 to 43. As a result, gas in the treatment housing 23 can be exhausted more suitably.

Moreover, contamination and damages in the exhaust pipes 81 to 83 can be suppressed suitably. Accordingly, gas flows smoothly within the exhaust pipes 81 to 83. As a result, gas in the treatment housing 23 can be exhausted more suitably.

This invention is not limited to the foregoing examples, but may be modified as follows.

In the embodiment, the switching mechanism 51 switches the exhaust path of gas of the treatment housing 23 to one of the exhaust pipes 41 to 43. That is, the switching mechanism 51 performs switch among the three exhaust pipes (specifically, exhaust pipes 41 to 43). However, the present invention is not limited to this. The switching mechanism 51 may perform switch between two exhaust pipes. For example, the exhaust pipe 43 may be omitted. In this case, the switching mechanism 51 switches the exhaust path of the treatment housing 23 to either the exhaust pipes 41 or 42. The switching mechanism 51 switches the exhaust path of the treatment housing 23 between the exhaust pipes 41 and 42. The switching mechanism 51 may perform switch among four or more exhaust pipes. For example, the substrate treating apparatus 1 may include an additional exhaust pipe in addition to the exhaust pipes 41 to 43. In this case, the switching mechanism 51 switches the exhaust path of the treatment housing 23 to one of the exhaust pipes 41 to 43 and the additional exhaust pipe. The switching mechanism 51 switches the exhaust path of the treatment housing 23 among the exhaust pipes 41 to 43 and the additional exhaust pipe.

In the embodiment, the exhaust pipes 41 to 43 are located between the treatment housing 23 and the distributing portion 56 in plan view. However, the present invention is not limited to this. The distributing portion 56 may be located between the exhaust pipes 41 to 43 and the treatment housing 23 in plan view.

Figure 13:
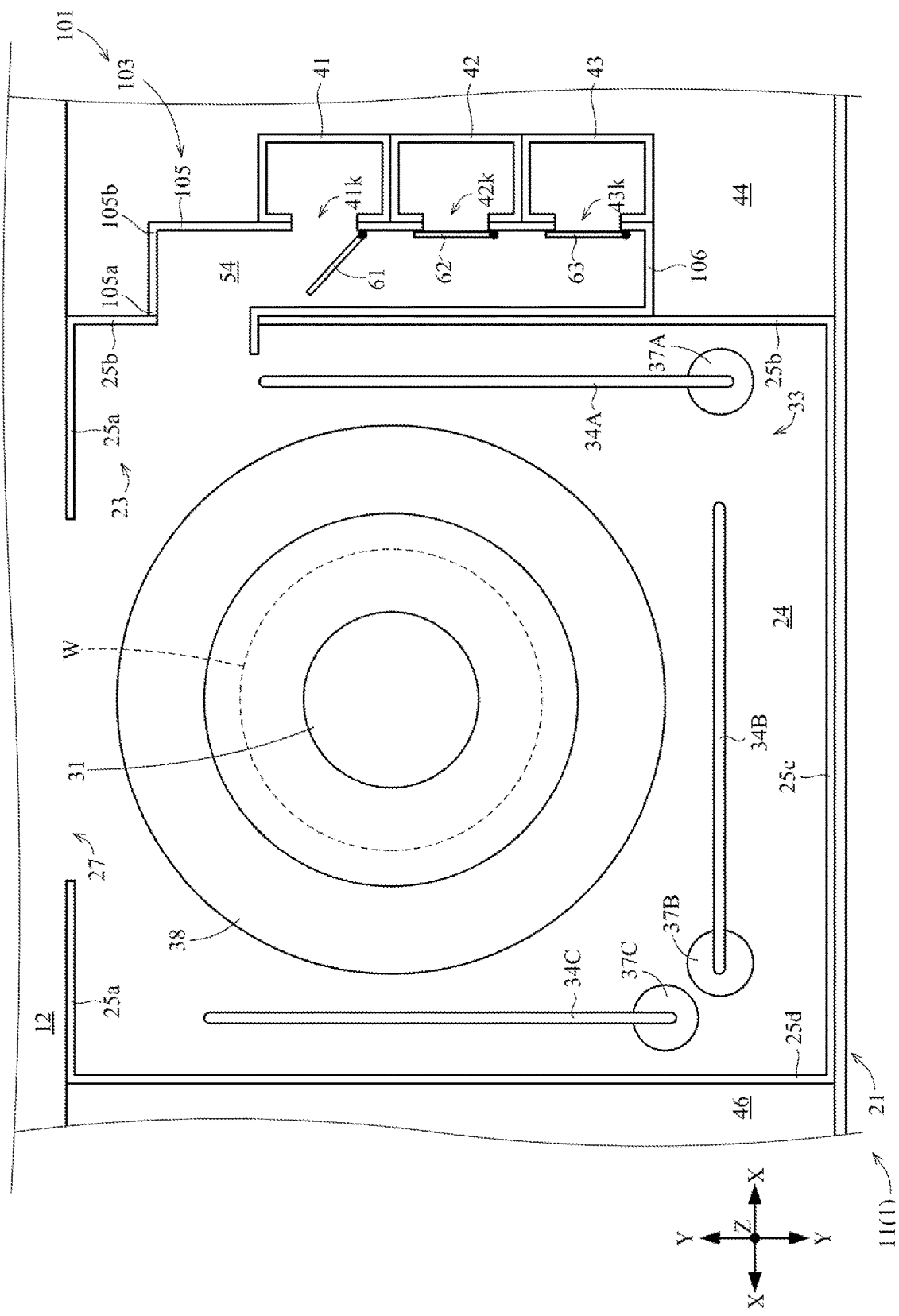
FIG. 13 is a plan view of a treating unit according to one modification.

FIG. 13 is a plan view of a treating unit 21 according to one modification. Like numerals are used to identify like components which are the same as that in the embodiment, and the components will not particularly be described.

The substrate treating apparatus 1 includes a switching mechanism 101. The switching mechanism 101 includes a switch housing 103. The switch housing 103 includes a distributing portion 106. The distributing portion 106 is arranged outside of the treatment housing 23. The distributing portion 106 is arranged in a first piping space 44. The distributing portion 106 contacts the treatment housing 23. The distributing portion 106 is located between the treatment housing 23 and exhaust pipes 41 to 43 in plan view. Specifically, the distributing portion 106 contacts a lateral wall 25b of the treatment housing 23. The distributing portion 106 is located between the lateral wall 25b and the exhaust pipes 41 to 43.

In the embodiment, a part of the switching mechanism 51 (e.g., first end 55a) is located inside of the treatment housing 23. However, the present invention is not limited to this. The switching mechanism 51 may entirely be located outside of the treatment housing 23. Likewise, in the embodiment, a part of the switch housing 53 (e.g., first end 55a) is located inside of the treatment housing 23. However, the present invention is not limited to this. The switch housing 53 may entirely be located outside of the treatment housing 23.

Reference is made to FIG. 13. The switching mechanism 101 includes an introducing portion 105. The introducing portion 105 extends in the front-back direction X. The introducing portion 105 has a first end 105a and a second end 105b. The first end 105a corresponds to an upstream end of the switching space 54. The first end 105a is located on a lateral wall 25b of the treatment housing 23. The first end 105a is connected to the lateral wall 25b of the treatment housing 23. The first end 105a is not located inside of the treatment housing 23. The second end 105b is arranged outside of the treatment housing 23. Accordingly, the distributing portion 105 is entirely arranged outside of the treatment housing 23. As a result, the switch housing 103 is entirely arranged outside of the treatment housing 23. The switching mechanism 101 is entirely arranged outside of the treatment housing 23. Specifically, the outside of the treatment housing 23 corresponds to a first piping space 44.

In the embodiment, a part of the switching mechanism 51 (e.g., first end 55a) is arranged inside of the treatment housing 23. However, the present invention is not limited to this. The switching mechanism 51 may entirely be arranged inside of the treatment housing 23. Likewise, in the embodiment, a part of the switch housing 53 is located inside of the treatment housing 23. However, the present invention is not limited to this. The switch housing 53 may entirely be located inside of the treatment housing 23. In the embodiment, the opening and closing portions 61 to 63 are located outside of the treatment housing 23. However, the present invention is not limited to this. The opening and closing portions 61 to 63 may be located inside of the treatment housing 23.

Figure 14:
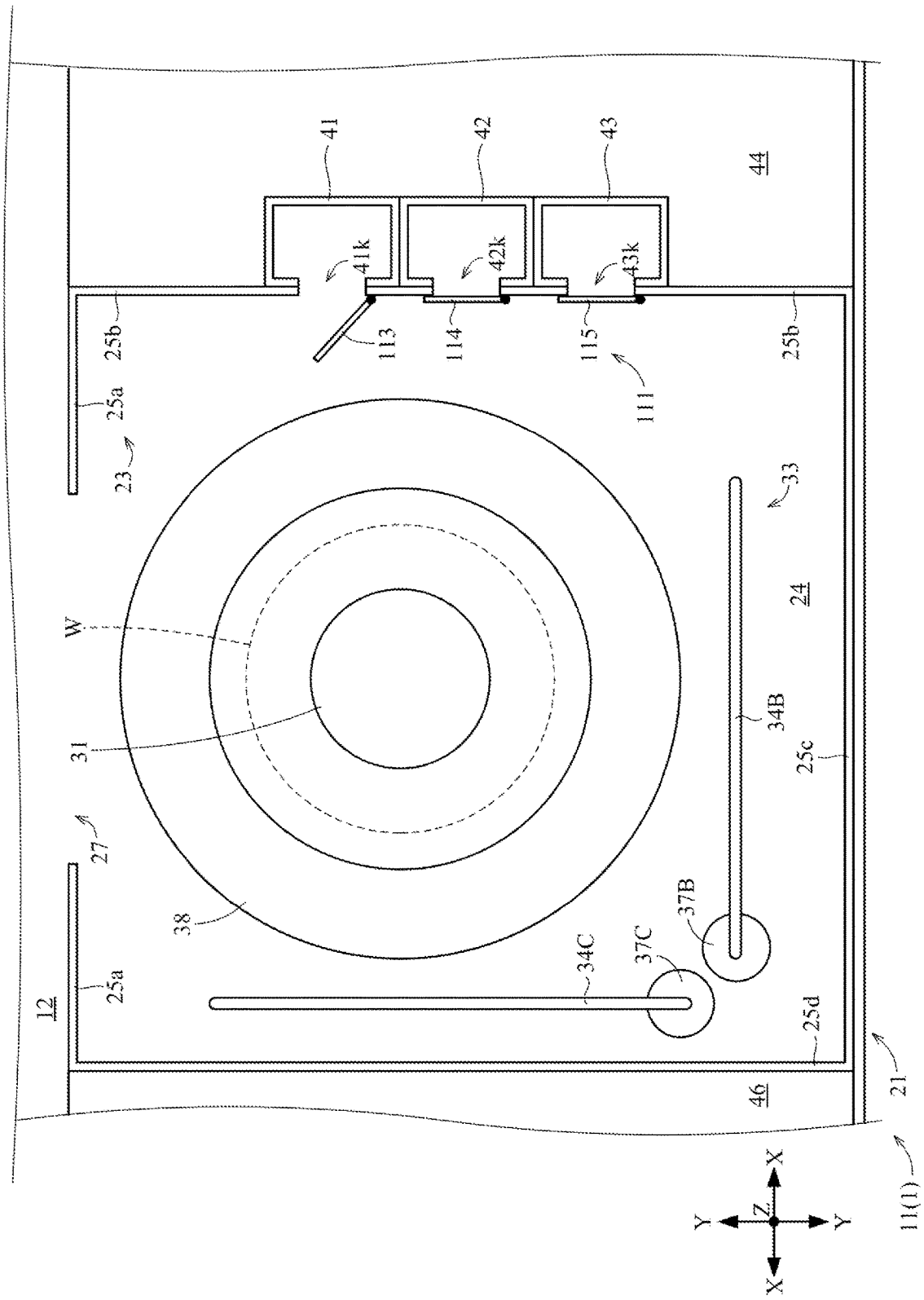
FIG. 14 is a plan view of a treating unit according to another modification.

FIG. 14 is a plan view of a treating unit 21 according to another modification. Like numerals are used to identify like components which are the same as that in the embodiment, and the components will not particularly be described. FIG. 14 schematically illustrates a supplying unit 33 for convenience.

Exhaust pipes 41 to 43 are arranged in a first piping space 44. The exhaust pipes 41 to 43 have openings k1 to k3 each contacting the treatment housing 23 (specifically, lateral wall 25b).

The substrate treating apparatus 1 includes a switching mechanism 111. The switching mechanism 111 includes opening and closing portions 113, 114, and 115. The opening and closing portions 113 to 115 are each arranged inside of the treatment housing 23. The opening and closing portions 113 to 115 are each arranged close to the lateral wall 25b. The opening and closing portions 113 to 115 are positioned so as to face the openings 41k to 43k, respectively.

The opening and closing portions 113 to 115 have the same configurations as those of the opening and closing portions 61 to 63, respectively. The opening and closing portion 113 can move between a position to communicate the treatment housing 23 with the exhaust pipe 41 and a position to block the treatment housing 23 from the exhaust pipe 41. The opening and closing portion 114 can move between a position to communicate the treatment housing 23 with the exhaust pipe 42 and a position to block the treatment housing 23 from the exhaust pipe 42. The opening and closing portion 115 can move between a position to communicate the treatment housing 23 with the exhaust pipe 43 and a position to block the treatment housing 23 from the exhaust pipe 43.

As described above, the switching mechanism 111 is entirely arranged inside of the treatment housing 23.

In the modification illustrated in FIG. 14, the switching mechanism 111 may or may not include a switch housing.

When the switching mechanism 111 includes a switch housing, the switch housing of the switching mechanism 111 may entirely be arranged inside of the treatment housing 23.

In the embodiment, the switching mechanism 51 includes the switch housing 53. However, the present invention is not limited to this. As exemplarily described in the modification of FIG. 14, the switch housing 53 may be omitted appropriately.

In the embodiment, the switch housing 53 is not connected to the cup 38. However, the present invention is not limited to this. The switch housing 53 may be connected to the cup 38. The switch housing 53 may form a channel from inside of the cup 38 to the exhaust pipes 41 to 43.

In the embodiment, the opening and closing portion 61 causes the treatment housing 23 not to be blocked from the exhaust pipes 42 and 43 when the opening and closing portion 61 is at the position to communicate the treatment housing 23 with the exhaust pipe 41. However, the present invention is not limited to this. When the opening and closing portion 61 is at the position to communicate the treatment housing 23 with the exhaust pipe 41, the opening and closing portion 61 may cause the treatment housing 23 to be blocked from the exhaust pipes 42 and 43. Likewise, in the embodiment, the opening and closing portion 62 causes the treatment housing 23 not to be blocked from the exhaust pipe 43 when the opening and closing portion 62 is at the position to communicate the treatment housing 23 with the exhaust pipe 42. However, the present invention is not limited to this. When the opening and closing portion 62 is at the position to communicate the treatment housing 23 with the exhaust pipe 42, the opening and closing portion 62 may cause the treatment housing 23 to be blocked from the exhaust pipe 43.

Figure 15:
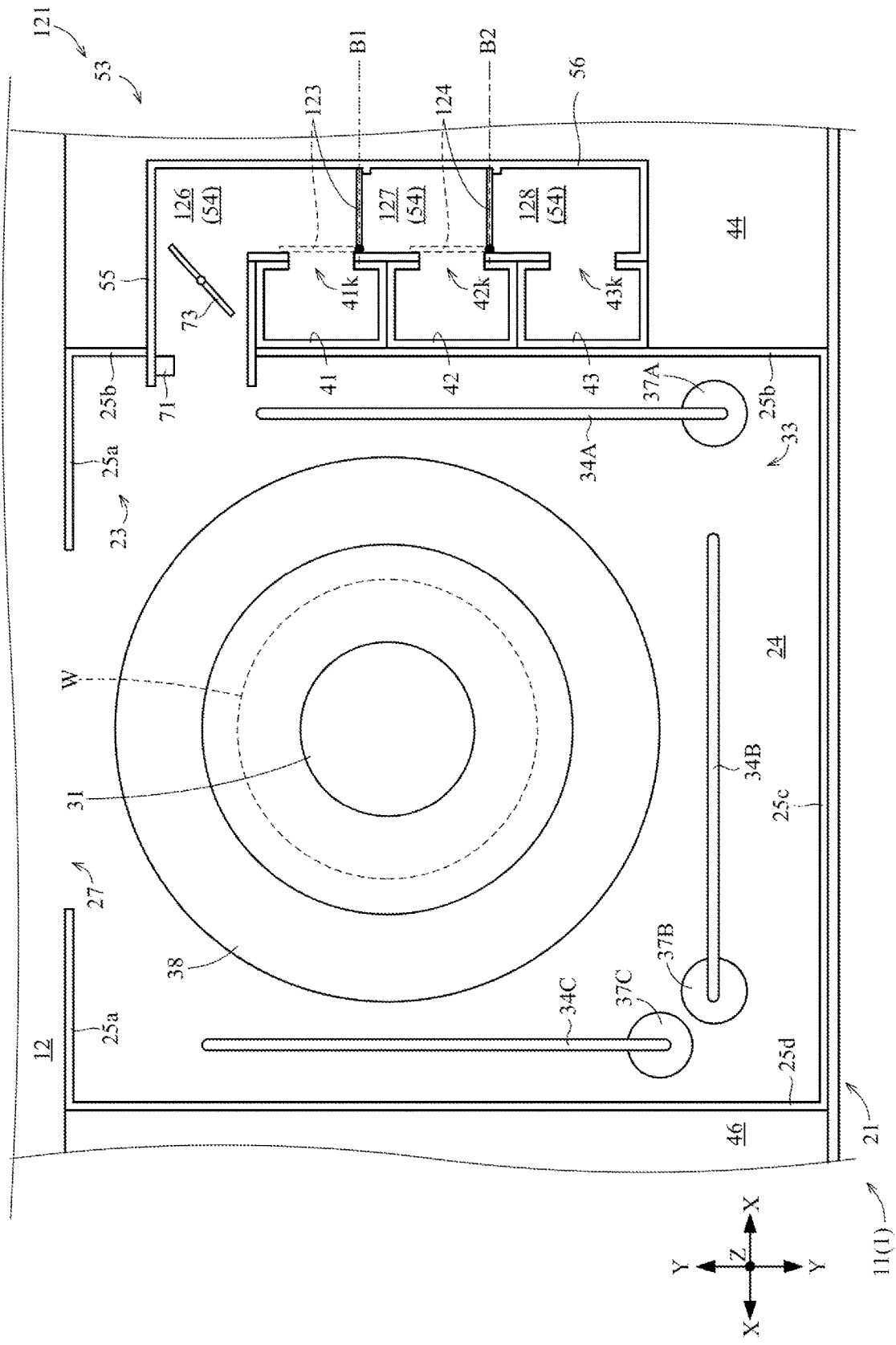
FIG. 15 is a plan view of a treating unit according to another modification.

FIG. 15 is a plan view of a treating unit 21 according to another modification. Like numerals are used to identify like components which are the same as that in the embodiment, and the components will not particularly be described.

The substrate treating apparatus 1 includes a switching mechanism 121. The switching mechanism 121 includes opening and closing portions 123 and 124. The opening and closing portions 123 and 124 are arranged inside of the switch housing 53. That is, the opening and closing portions 123 and 124 are arranged within a switching space 54. The opening and closing portions 123 and 124 are positioned so as to face the openings 41k and 42k, respectively. The opening and closing portion 123 opens and closes the opening 41k. The opening and closing portion 124 opens and closes the opening 42k. Note that the switching mechanism 121 includes no member corresponding to the opening and closing portion 63.

Gas flows through the switching space 54 in one direction. Gas flows from the introducing portion 55 to the distributing portion 56. The openings 41k, 42k, and 43k are each in communication with the switching space 54. A position where the opening 42k is in communication with the switching space 54 is downstream of a position where the opening 41k is in communication with the switching space 54. A position where the opening 43k is in communication with the switching space 54 is downstream of the position where the opening 42k is in communication with the switching space 54.

Here, the switching space 54 is divided into a first section 126, second section 127, and a third section 128 with virtual boundaries B1 and B2. FIG. 15 exemplarily illustrates positions of the boundaries B1 and B2 by alternate long and short dashed lines. The boundary B1 is located downstream of the position where the opening 41k is in communication with the switching space 54 and upstream of the position where the opening 42k is in communication with the switching space 54. The boundary B2 is located downstream of the position where the opening 42k is in communication with the switching space 54 and upstream of the position where the opening 43k is in communication with the switching space 54. The first section 126 is a part of the switching space 54 upstream of the boundary B1. The second section 127 is a part of the switching space 54 downstream of the boundary B1 and upstream of the boundary B2. The third section 128 is a part of the switching space 54 downstream of the boundary B2.

The opening and closing portion 123 can move between a position to communicate the treatment housing 23 with the exhaust pipe 41 and a position to block the treatment housing 23 from the exhaust pipe 41. FIG. 15 illustrates by solid lines the opening and closing portion 123 at the position to communicate the treatment housing 23 with the exhaust pipe 41. FIG. 15 illustrates by dotted lines the opening and closing portion 123 at the position to block the treatment housing 23 from the exhaust pipe 41.

When the opening and closing portion 123 is at the position to communicate the treatment housing 23 with the exhaust pipe 41, the opening and closing portion 123 opens the opening 41k and blocks the first section 126 from the second section 127. That is, when the opening and closing portion 123 causes the treatment housing 23 in communication with the exhaust pipe 41, the opening and closing portion 123 causes the treatment housing 23 to be blocked from the exhaust pipes 42 and 43. When the opening and closing portion 123 is at the position to block the treatment housing 23 from the exhaust pipe 41, the opening and closing portion 123 closes the opening 41k and communicates the first section 126 with the second section 127. That is, when the opening and closing portion 123 causes the treatment housing 23 to be blocked from the exhaust pipe 41, the opening and closing portion 123 does not cause the treatment housing 23 to be blocked from the exhaust pipes 42 and 43.

The opening and closing portion 124 can move between a position to communicate the treatment housing 23 with the exhaust pipe 42 and a position to block the treatment housing 23 from the exhaust pipe 42. FIG. 15 illustrates by solid lines the opening and closing portion 124 at the position to communicate the treatment housing 23 with the exhaust pipe 42. FIG. 15 illustrates by dotted lines the opening and closing portion 124 at the position to block the treatment housing 23 from the exhaust pipe 42.

When the opening and closing portion 124 is at the position to communicate the treatment housing 23 with the exhaust pipe 42, the opening and closing portion 124 opens the opening 42k and blocks the second section 127 from the third section 128. That is, when the opening and closing portion 124 causes the treatment housing 23 in communication with the exhaust pipe 42, the opening and closing portion 124 causes the treatment housing 23 to be blocked from the exhaust pipe 43. When the opening and closing portion 124 is at the position to block the treatment housing 23 from the exhaust pipe 42, the opening and closing portion 124 closes the opening 42k and communicates the second section 127 with the third section 128. That is, when the opening and closing portion 124 causes the treatment housing 23 to be blocked from the exhaust pipe 42, the opening and closing portion 124 does not cause the treatment housing 23 to be blocked from the exhaust pipe 43.

When the switching mechanism 121 switches the exhaust path of the treatment housing 23 to the exhaust pipe 41, the opening and closing portion 123 moves to the position to communicate the treatment housing 23 with the exhaust pipe 41. The opening and closing portion 124 may move either to the position to communicate the treatment housing 23 with the exhaust pipe 42 or to the position to block the treatment housing 23 from the exhaust pipe 42. In other words, the opening and closing portion 124 may open the opening 42k or may close the opening 42k.

When the switching mechanism 121 switches the exhaust path of the treatment housing 23 to the exhaust pipe 42, the opening and closing portion 123 moves to the position to block the treatment housing 23 from the exhaust pipe 41. The opening and closing portion 124 moves to the position to communicate the treatment housing 23 with the exhaust pipe 42.

When the switching mechanism 121 switches the exhaust path of the treatment housing 23 to the exhaust pipe 43, the opening and closing portion 123 moves to the position to block the treatment housing 23 from the exhaust pipe 41. The opening and closing portion 124 moves to the position to block the treatment housing 23 from the exhaust pipe 42.

With this modification, the member corresponding to the opening and closing portion 63 may be omitted. In other words, the number of opening and closing portions 123 and 124 is less by one than the number of exhaust pipes 41 to 43. This achieves a simplified configuration of the switching mechanism 121.

When the switching mechanism 121 switches the exhaust path of the treatment housing 23 to the exhaust pipe 41, flow of gas into the second section 127 and the third section 128 can be prevented and stagnated gas within the second section 127 and the third section 128 can be avoided suitably. As a result, gas in the treatment housing 23 can be exhausted more suitably.

When the switching mechanism 121 switches the exhaust path of the treatment housing 23 to the exhaust pipe 42, flow of gas into the third section 128 can be prevented and stagnated gas within the third section 128 can be avoided suitably. As a result, gas in the treatment housing 23 can be exhausted more suitably.

With the embodiments, the rotation axis A1 of the opening and closing portion 61 passes through the first end of the opening and closing portion 61. However, the present invention is not limited to this. The position of the rotation axis A1 of the opening and closing portion 61 is variable appropriately.

Figure 16:
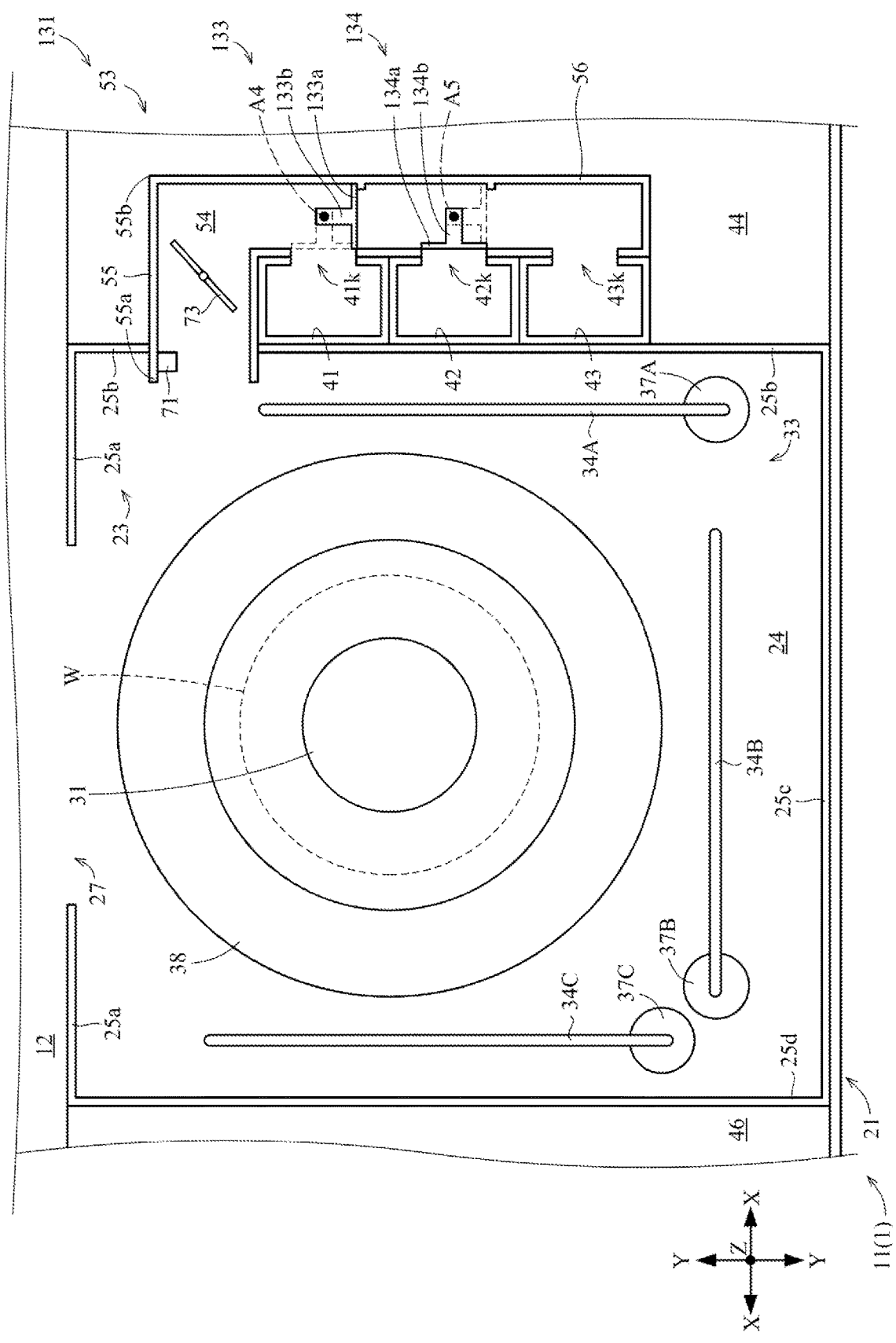
FIG. 16 is a plan view of a treating unit according to another modification.

FIG. 16 is a plan view of a treating unit 21 according to another modification. Like numerals are used to identify like components which are the same as that in the embodiment, and the components will not particularly be described.

The substrate treating apparatus 1 includes a switching mechanism 131. The switching mechanism 131 includes opening and closing portions 133 and 134. The opening and closing portions 133 and 134 are arranged inside of the switch housing 53. The opening and closing portions 133 and 134 are positioned so as to face the openings 41k and 42k, respectively. The opening and closing portion 133 opens and closes the opening 41k. The opening and closing portion 134 opens and closes the opening 42k. Note that the switching mechanism 131 includes no member corresponding to the opening and closing portion 63.

The opening and closing portion 133 have substantially a T-shape in plan view. The opening and closing portion 133 includes a plate portion 133a and a base portion 133b. The plate portion 133a has a flat plate shape substantially vertical. The base portion 133b is connected to a center portion of the plate portion 133a in plan view. The base portion 133b protrudes from the plate portion 133a in the horizontal direction. The opening and closing portion 133 swings around a rotation axis A4. The rotation axis A4 is an imaginary line parallel to the vertical direction Z. The rotation axis A4 passes through the base portion 133b. The rotation axis A4 does not pass through the plate portion 133a. The opening and closing portion 133 swings around the rotation axis A4.

The opening and closing portion 134 has the same configuration as that of the opening and closing portion 133. That is, the opening and closing portion 134 includes a plate portion 134a and a base portion 134b. The opening and closing portion 134 swings around a rotation axis A5.

The opening and closing portion 133 can move between a position to communicate the treatment housing 23 with the exhaust pipe 41 and a position to block the treatment housing 23 from the exhaust pipe 41. FIG. 16 illustrates by solid lines the opening and closing portion 133 at the position to communicate the treatment housing 23 with the exhaust pipe 41. FIG. 16 illustrates by dotted lines the opening and closing portion 133 at the position to block the treatment housing 23 from the exhaust pipe 41.

The opening and closing portion 134 can move between a position to communicate the treatment housing 23 with the exhaust pipe 42 and a position to block the treatment housing 23 from the exhaust pipe 42. FIG. 16 illustrates by dotted lines the opening and closing portion 134 at the position to communicate the treatment housing 23 with the exhaust pipe 42. FIG. 16 illustrates by solid lines the opening and closing portion 134 at the position to block the treatment housing 23 from the exhaust pipe 42.

The opening and closing portions 133 and 134 have the same functions as that of the opening and closing portions 123 and 124 shown in FIG. 15. For example, when the opening and closing portion 133 is at the position to communicate the treatment housing 23 with the exhaust pipe 41, the opening and closing portion 133 causes the treatment housing 23 to be blocked from the exhaust pipes 42 and 43. When the opening and closing portion 134 is at the position to communicate the treatment housing 23 with the exhaust pipe 42, the opening and closing portion 134 causes the treatment housing 23 to be blocked from the exhaust pipe 43.

In the embodiment, the liquid supplying unit 33 supplies the first treating liquid, the second treating liquid, and the third treating liquid. That is, the number of types of treating liquids that the liquid supplying unit 33 can supply is three. However, the present invention is not limited to this. The number of types of treating liquids that the liquid supplying unit 33 can supply may be less than three. The number of types of treating liquids that the liquid supplying unit 33 can supply may be more than three.

For example, the liquid supplying unit 33 can supply a fourth treating liquid. The fourth treating liquid is classified to a rinse liquid, for example. The fourth treating liquid contains at least one selected from deionized water, carbonated water, electrolytic ionized water, hydrogenated water, ozone water, and diluted hydrochloric acid water, for example.

In the embodiment, the treating unit 21 may further include a treatment gas supplying unit. The treatment gas supplying unit is arranged inside of the treatment housing 23. The treatment gas supplying unit supplies a treatment gas to a substrate W held by the holder 31. The treatment gas supplying unit supplies at least one type of treatment gas. The treatment gas is, for example, gas other than cleaned air.

When the treating unit 21 includes the treatment gas supplying unit, the switching mechanism 51 may operate as under. The switching mechanism 51 may switch the exhaust path of the treatment housing 23 in accordance with switch between use and disuse of the treatment gas within the treatment housing 23. When the treatment gas used in the treatment housing 23 is switched between a plurality of types of treatment gas, the switching mechanism 51 may switch the exhaust path of the treatment housing 23 in accordance with switch of the types of treatment gas. The switching mechanism 51 may switch the exhaust path of the treatment housing 23 in accordance with switch between supply of the treating liquid and supply of the treatment gas.

In the embodiment, the liquid supplying unit 33 supplies the first treating liquid, the second treating liquid, and the third treating liquid in this order to a substrate W held by the holder 31. However, the present invention is not limited to this. The order of supplying the first treating liquid, the second treating liquid, and the third treating liquid may be changed appropriately.

In the embodiment, the number of treatment housings 23 arranged at substantially the same height position is four. However, the present invention is not limited to this. The number of treatment housings 23 arranged at substantially the same height position may be less than or more than four. In the embodiment described above, the number of treatment housings 23 that align in the vertical direction Z is six. However, the present invention is not limited to this. The number of treatment housings 23 that align in the vertical direction Z may be less than or more than six.

In the embodiment, the substrate treating apparatus 1 includes two transportation spaces 12A and 12B. That is, the number of transportation spaces 12 is two. However, the present invention is not limited to this. For example, the number of transportation spaces 12 may be one. For example, the transportation space 12B may be omitted. For example, the number of transportation spaces 12 may be three or more.

In the embodiment, the number of transport mechanisms 16 arranged in one transportation space 12 is one. However, the present invention is not limited to this. For example, the number of transport mechanisms 16 arranged in one transportation space 12 may be two or more.

In the embodiment, the first piping space 44A is located forward of the treatment housing 23A. The second piping space 46A is located rearward of the treatment housing 23A. However, the present invention is not limited to this. A relative position among the treatment housing 23A, the first piping space 44A, and the second piping space 46A may be changed appropriately.

Figure 17:
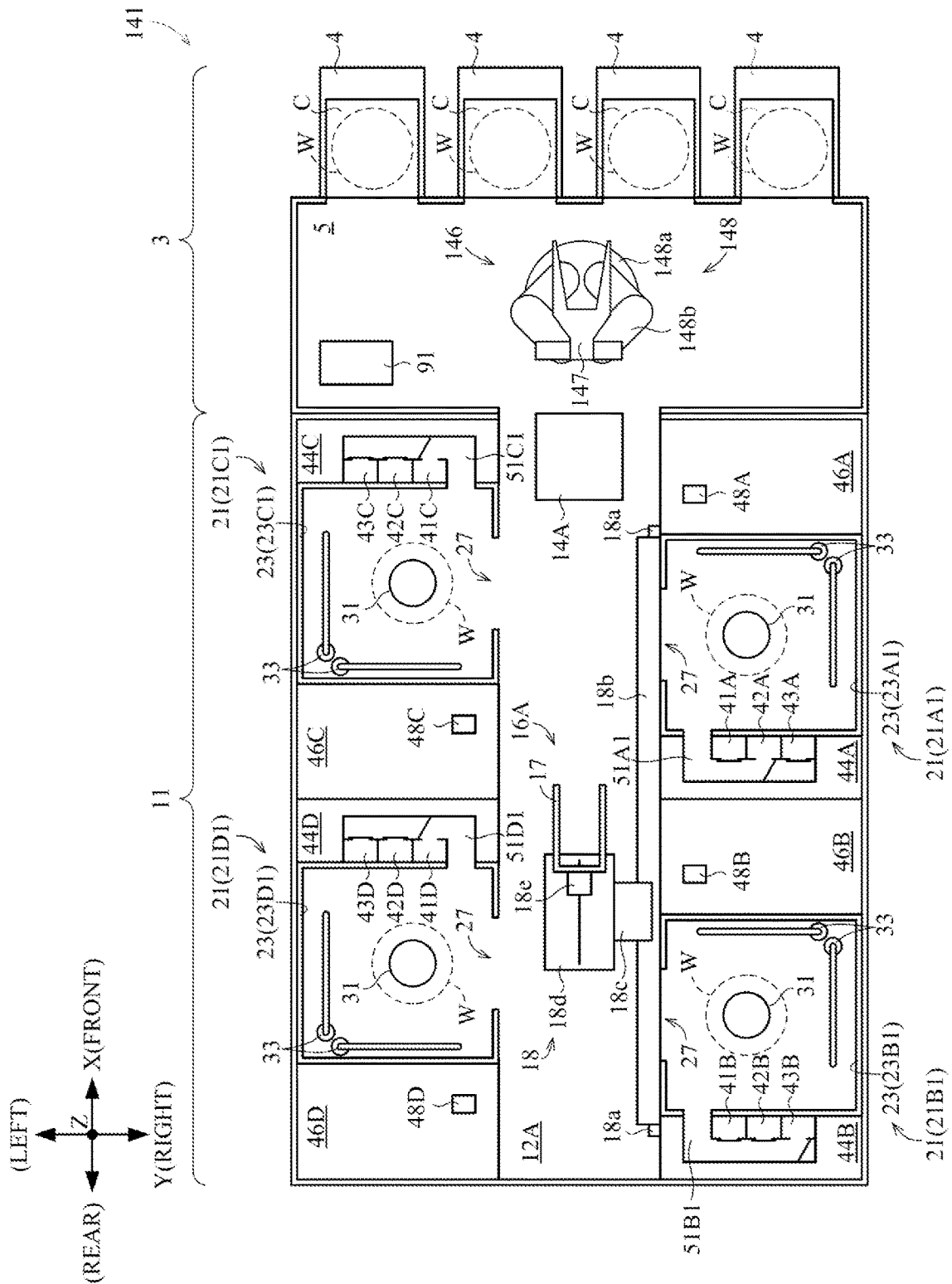
FIG. 17 is a plan view showing an interior of a substrate treating apparatus according to one modification.

FIG. 17 is a plan view showing an interior of a substrate treating apparatus 141 according to another modification. Like numerals are used to identify like components which are the same as that in the embodiment, and the components will not particularly be described.

In the substrate treating apparatus 141, the first piping space 44A is located rearward of the treatment housing 23A. The second piping space 46A is located forward of the treatment housing 23A.

Moreover, in the substrate treating apparatus 141, the first piping space 44B is located rearward of the treatment housing 23B. The second piping space 46B is located forward of the treatment housing 23B. The first piping space 44C is located forward of the treatment housing 23C. The second piping space 46C is located rearward of the treatment housing 23C. The first piping space 44D is located forward of the treatment housing 23D. The second piping space 46D is located rearward of the treatment housing 23D.

Also, in the substrate treating apparatus 141, a relative position among the treatment housing 23B, the first piping space 44B, and the second piping space 46B is substantially the same as a relative position among the treatment housing 23A, the first piping space 44A, and the second piping space 46A. A relative position among the treatment housing 23C, the first piping space 44C, and the second piping space 46C is substantially the same as a relative position among the treatment housing 23A, the first piping space 44A, and the second piping space 46A. A relative position among the treatment housing 23D, the first piping space 44D, and the second piping space 46D is substantially the same as a relative position among the treatment housing 23A, the first piping space 44A, and the second piping space 46A.

In the embodiment, the exhaust pipes 41A to 43A are located forward of the treatment housing 23A. However, the present invention is not limited to this.

Reference is made to FIG. 17. In the substrate treating apparatus 141, the exhaust pipes 41A to 43A are located rearward of the treatment housing 23A.

Moreover, in the substrate treating apparatus 141, the exhaust pipes 41B to 43B are located rearward of the treatment housing 23B. The exhaust pipes 41C to 43C are located forward of the treatment housing 23C. The exhaust pipes 41D to 43D are located forward of the treatment housing 23D.

In the embodiment, the configuration of the transport mechanism 6 in the indexer 3 is exemplified. However, the present invention is not limited to this. The configuration of the transport mechanism 6 may be changed appropriately.

Reference is made to FIG. 17. The indexer 3 includes a transport mechanism 146. The transport mechanism 146 includes a hand 147 and a hand driving unit 148. The hand 147 holds one substrate W horizontally. The hand driving unit 148 is coupled to the hand 147. The hand driving unit 148 moves the hand 147. The hand driving unit 148 moves the hand 147 in the front-back direction X, width direction Y, and vertical direction Z.

The hand driving unit 148 includes a first driving unit 148a and a second driving unit 148b. The second driving unit 148b is supported on the first driving unit 148a. The first driving unit 148a moves the second driving unit 148b in the vertical direction Z. The first driving unit 148a also rotates the second driving unit 148b around a rotation axis parallel to the vertical direction Z. However, the first driving unit 148a does not move the second driving unit 148b in the horizontal direction. The first driving unit 148a is itself immovable in the horizontal direction. The second driving unit 148b moves in the horizontal direction relative to the first driving unit 148a. The second driving unit 148b is formed with an articulated arm, for example. The second driving unit 148b is connected to the hand 147. The hand driving unit 148 with such a construction can move the hand 147 in parallel in the vertical direction Z. The hand 147 is movable in a direction parallel to any horizontal direction. The hand 147 is rotatable in a horizontal plane.

In the embodiment, the configuration of the transport mechanism 16 in the treating block 11 is exemplified. However, the present invention is not limited to this. The configuration of the transport mechanism 16 may be changed appropriately. For example, the transport mechanism 16 may be configured in the same manner as the transport mechanism 146 described above.

As shown in FIG. 8, the opening and closing portion 61 is substantially rectangular in front view in the embodiment.

However, the present invention is not limited to this. The shape of the opening and closing portion 61 may be changed appropriately. Likewise, the shapes of the opening and closing portions 62 and 63 may be changed appropriately.

Figure 19A:
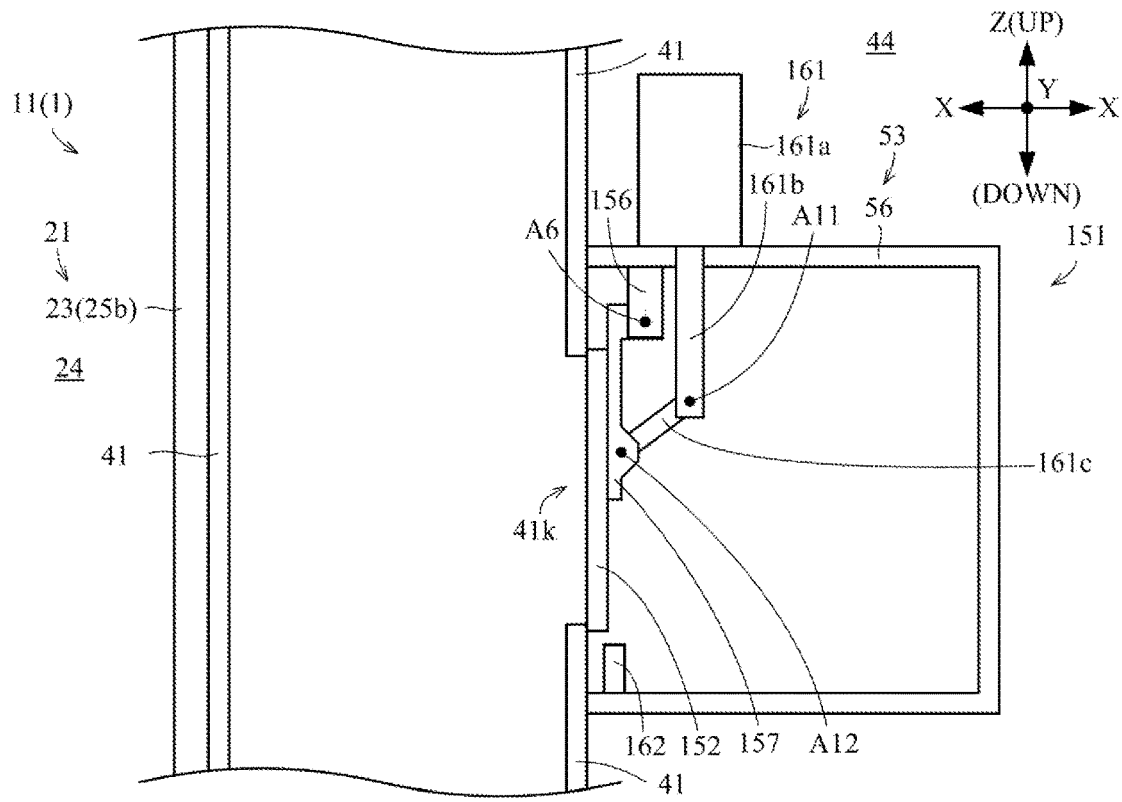
FIG. 19A is a side view of the switching mechanism according to the modification.
Figure 19B:
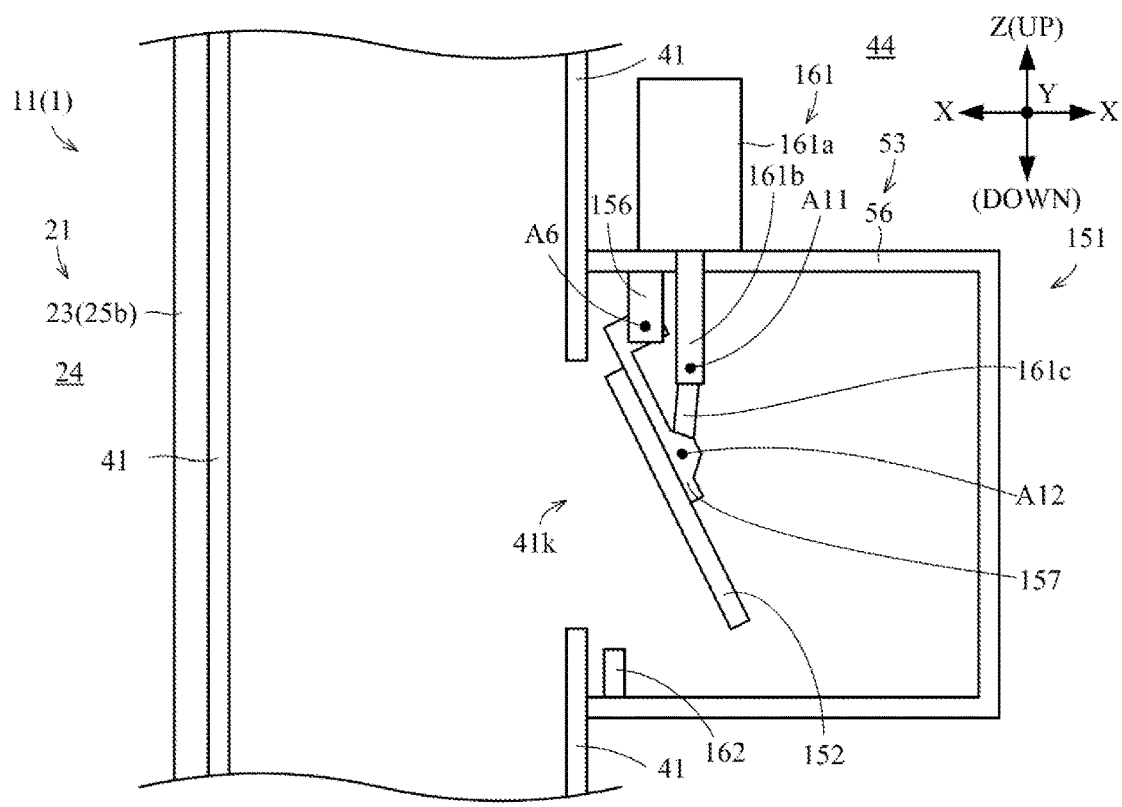
FIG. 19B is a side view of the switching mechanism according to the modification.

FIG. 18 is a front view of a switching mechanism according to the modification. FIGS. 19A and 19B are each a side view of the switching mechanism according to the modification. Like numerals are used to identify like components which are the same as that in the embodiment, and the components will not particularly be described.

Reference is made to FIG. 18. The substrate treating apparatus 1 includes a switching mechanism 151. The switching mechanism 151 includes opening and closing portions 152, 153, and 154. The opening and closing portions 152 to 154 are each arranged inside of the switch housing 53. The opening and closing portions 152 to 154 each have a substantially circular shape.

The opening and closing portion 152 can swing around a rotation axis A6. The rotation axis A6 is a horizontal imaginary line. The rotation axis A6 is parallel to the width direction Y. The rotation axis A6 is located above the opening and closing portion 152. The rotation axis A6 does not pass through the center of the opening and closing portion 152. The opening and closing portion 152 swings around the rotation axis A6, thereby moving between a position to communicate the treatment housing 23 with the exhaust pipe 41 and a position to block the treatment housing 23 from the exhaust pipe 41. Likewise, the opening and closing portions 153 and 154 can swing around rotation axes A7 and A8, respectively.

In FIG. 18, the opening and closing portion 152 is located at the position to block the treatment housing 23 from the exhaust pipe 41. Likewise, the opening and closing portions 153 and 154 are located at positions to block the treatment housing 23 from the exhaust pipes 42 and 43, respectively.

In FIG. 19A, the opening and closing portion 152 is located at the position to block the treatment housing 23 from the exhaust pipe 41. The opening and closing portion 152 closes the opening 41k of the exhaust pipe 41. In FIG. 19B, the opening and closing portion 152 is located at the position to communicate the treatment housing 23 with the exhaust pipe 41. The opening and closing portion 152 opens the opening 41k.

Reference is made to FIGS. 19A and 19B. The opening and closing portion 152 is supported on the switch housing 53. The opening and closing portion 152 is supported on the distributing portion 56. Specifically, the switching mechanism 151 includes a stay 156 and an attachment member 157. The stay 156 is fixed to the switch housing 53. The stay 156 is fixed to the distributing portion 56. The attachment member 157 is supported by the stay 156. The attachment member 157 is rotatable around the rotation axis A6 relative to the stay 156. The attachment member 157 is fixed to the opening and closing portion 152.

Reference is made to FIG. 18. Similar to the opening and closing portion 152, the opening and closing portions 153 and 154 are fixed to attachment members 158 and 159, respectively.

In the embodiment, no mechanism is specifically exemplified that is configured to move the opening and closing portions 61 to 63. Then, the mechanism configured to move the opening and closing portion 152 is exemplified with reference to FIGS. 19A and 19B.

The treating block 11 includes a driving unit 161 configured to move the opening and closing portion 152. Here, the driving unit 161 is not a component of the switching mechanism 151.

The driving unit 161 includes an actuator 161a. The actuator 161a generates power for moving the opening and closing portion 152. The actuator 161a is, for example, an air cylinder, a hydraulic pressure cylinder, or an electric motor. The actuator 161a is located outside of the switch housing 53. The actuator 161a is located in the first piping space 44. The actuator 161a is located on the switch housing 53. The actuator 161a is located on the distributing portion 56.

The driving unit 161 includes a rod 161b. The rod 161b is coupled to the actuator 161a. The rod 161b extends downward from the actuator 161a. The rod 161b penetrates the switch housing 53. At least part of the rod 161b is located inside of the switch housing 53. The actuator 161a moves the rod 161b in the vertical direction Z.

The driving unit 161 includes a link 161c. The link 161c is located inside of the switch housing 53. The link 161c couples the rod 161b with the attachment member 157. The link 161c is rotatable around an axis A11 relative to the rod 161b. The link 161c is rotatable around an axis A12 relative to the attachment member 157. The axes A11 and A12 are each a horizontal imaginary line. The axes A11 and A12 are each parallel to the width direction Y.

When the actuator 161a moves the rod 161b in the vertical direction Z, the opening and closing portion 152 rotates around the rotation axis A6. When the actuator 161a moves the rod 161b upward, the opening and closing portion 152 moves to the position to communicate the treatment housing 23 with the exhaust pipe 41. When the actuator 161a moves the rod 161b downward, the opening and closing portion 152 moves to the position to block the treatment housing 23 from the exhaust pipe 41.

In the embodiment, leakage of gas within the exhaust path of the treatment housing 23 may additionally be detected. For example, leakage of gas from the opening and closing portions 61 to 63 may be detected.

Reference is made to FIGS. 18, 19A, and 19B. The treating block 11 includes wind speed sensors 162, 163, and 164. The wind speed sensor 162 is located close to the opening and closing portion 152. The wind speed sensor 162 is located inside of the switch housing 53, for example. The wind speed sensor 162 is located inside of the distributing portion 56, for example. It is preferred that, when the rotation axis A6 is located above the opening and closing portion 152, the wind speed sensor 162 is located below the opening and closing portion 152. Likewise, the wind speed sensors 163 and 164 are located close to the opening and closing portions 153 and 154, respectively.

The wind speed sensor 162 detects a wind speed of gas (specifically, moving rate of gas) close to the opening and closing portion 152. Likewise, the wind speed sensors 163 and 164 detect wind speeds of gas close to the opening and closing portions 153 and 154, respectively. The wind speed sensors 162 to 164 are, for example, a thermal anemometer.

The wind speed sensor 162 may additionally detect a wind direction of gas (specifically, moving direction of gas) close to the opening and closing portion 152. Likewise, the wind speed sensors 163 and 164 may additionally detect wind directions of gas close to the opening and closing portions 153 and 154, respectively.

The controller 91 is communicatively connected to the wind speed sensors 162 to 164, which illustration is omitted. The controller 91 obtains detection results from the wind speed sensors 162 to 164.

The controller 91 determines presence or absence of leakage of gas from the opening and closing portion 152 in accordance with a detection result from the wind speed sensor 162. Here, the leakage of gas from the opening and closing portion 152 corresponds to leakage of gas through the opening and closing portion 152 from the treatment housing 23 to the exhaust pipe 41 when the opening and closing portion 152 is located at the position to block the treatment housing 23 from the exhaust pipe 41.

Specifically, the controller 91 calculates a wind speed of gas close to the opening and closing portion 152 in accordance with the detection result from the wind speed sensor 162. The calculated wind speed of gas close to the opening and closing portion 152 is referred to as an "actual measurement value".

When the opening and closing portion 152 is located at the position to block the treatment housing 23 from the exhaust pipe 41, the controller 91 monitors whether or not the actual measurement value meets a predetermined condition. Here, the predetermined condition is, for example, that the actual measurement value is less than a first reference value set in advance. The predetermined condition is, for example, that change of the actual measurement value per a unit time is less than a second reference value. Then, if the actual measurement value does not meet the predetermined condition when the opening and closing portion 152 is located at the position to block the treatment housing 23 from the exhaust pipe 41, the controller 91 determines that leakage of gas from the opening and closing portion 152 occurs.

Here, it is preferred that at least either the first reference value or the second reference value is, for example, a variable. At least either the first reference value or the second reference value can be varied, for example, in accordance with the positions of the other opening and closing portions 153 and 154. At least either the first reference value or the second reference value can be varied, for example, in accordance with the position of the opening and closing portion 152 belonging to the other switching mechanism 151. At least either the first reference value or the second reference value can be varied, for example, in accordance with the positions of the opening and closing portions 152, 153, and 154 belonging to the other switching mechanism 151. This can cause the controller 91 to determine presence or absence of the leakage of gas from the opening and closing portion 152 accurately even when the wind speed of gas close to the opening and closing portion 152 is susceptible to disturbance.

Alternatively, at least either the first reference value or the second reference value may be a constant.

Likewise, the controller 91 determines presence or absence of leakage of gas from the opening and closing portions 153 and 154 in accordance with detection results from the wind speed sensors 163 and 164, respectively.

With this modification, it can be monitored suitably whether or not the exhaust path of the treatment housing 23 is switched normally among the exhaust pipes 41 to 43.

Moreover, wind speed sensors 162 to 164 can detect the minute flow of gas suitably. Accordingly, it can be monitored accurately whether or not the exhaust path of the treatment housing 23 is switched normally among the exhaust pipes 41 to 43.

In this modification, also when the controller 91 detects the leakage of gas within the exhaust path, the controller 91 may execute at least either alarm issue or stop of operation of the liquid supplying unit 33. When issuing an alarm, the controller 91 can inform a user of the substrate treating apparatus 1 of the leakage of gas within the exhaust path rapidly. When stopping the operation of the liquid supplying unit 33, the controller 91 can suppress an amount of ingredients derived from the treating liquid and contained in the gas within the treatment housing 23 rapidly. In either case, contamination and damages in the exhaust pipes 41 to 43 can be suppressed suitably. For example, generation of crystals (salt) inside of the exhaust pipes 41 to 43 can suitably be prevented. For example, accumulation of crystals inside of the exhaust pipes 41 to 43 can suitably be prevented.

With the modifications shown in FIGS. 18, 19A, and 19B, the wind speed sensors 162 to 164 are located inside of the switch housing 53. However, the present invention is not limited to this.

For example, the wind speed sensor 162 may be located inside of the exhaust pipe 41. Even when the wind speed sensor 162 is located inside of the exhaust pipe 41, a suitable reference value in the predetermined condition can be set in advance. Consequently, the controller 91 can determine presence or absence of leakage of gas from the opening and closing portion 152 suitably. Likewise, such arrangement is also applicable to the wind speed sensors 163 and 164.

For example, the wind speed sensor 162 may be located inside of the treatment housing 23. Even when the wind speed sensor 162 is located inside of the treatment housing 23, a suitable reference value in the predetermined condition can be set in advance. Consequently, the controller 91 can determine presence or absence of leakage of gas from the opening and closing portion 152 suitably. Likewise, such arrangement is also applicable to the wind speed sensors 163 and 164.

Figure 20A:
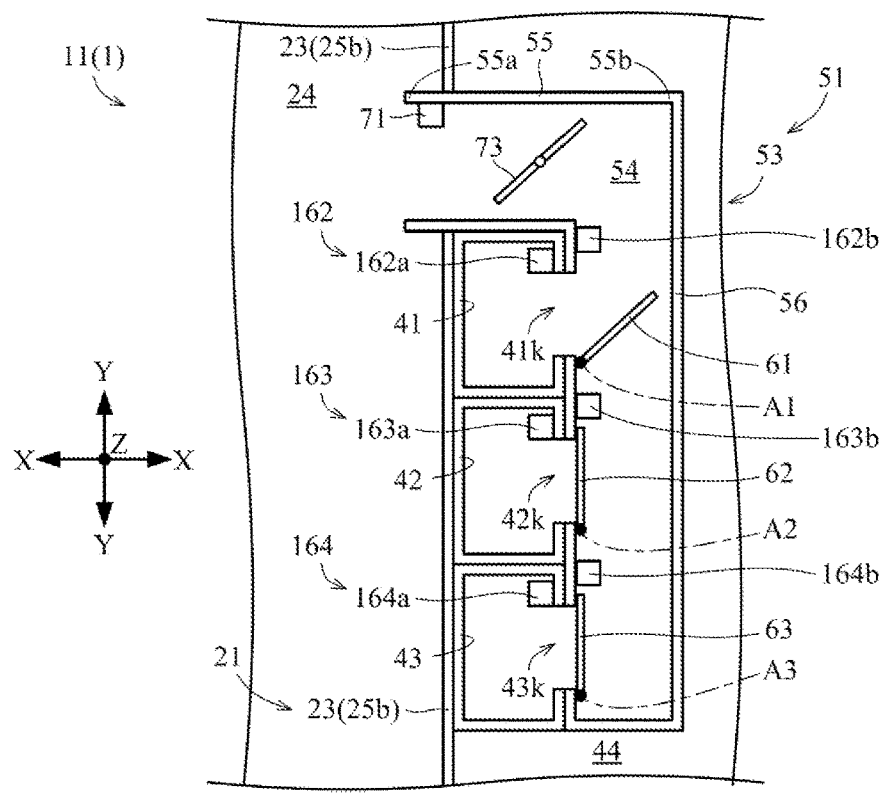
FIG. 20A is a plan view of an arrangement example of one wind speed sensor according to the modification.
Figure 20B:
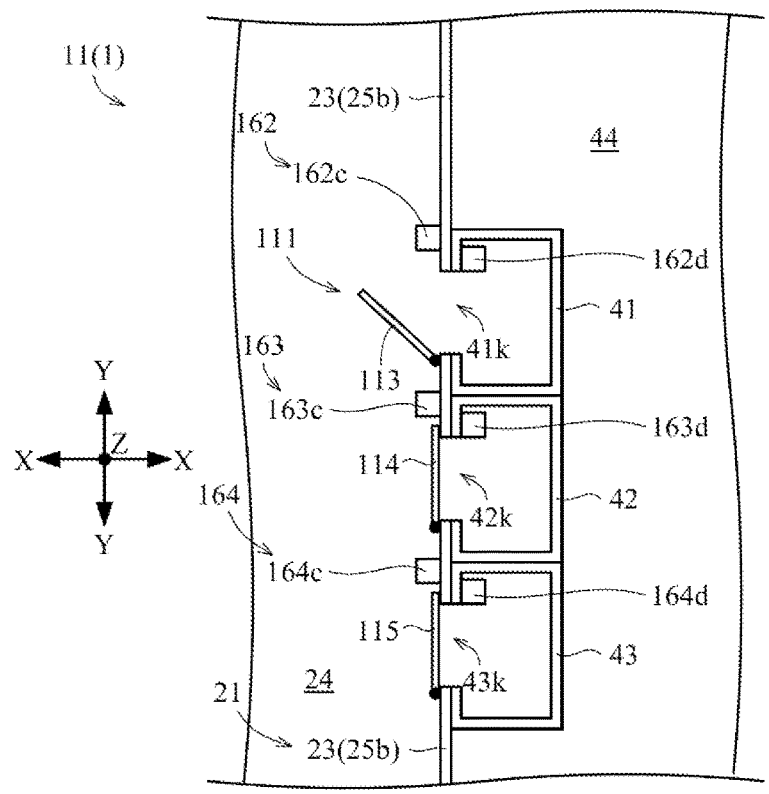
FIG. 20B is a plan view of an arrangement example of another wind speed sensor according to the modification.
Figure 21A:
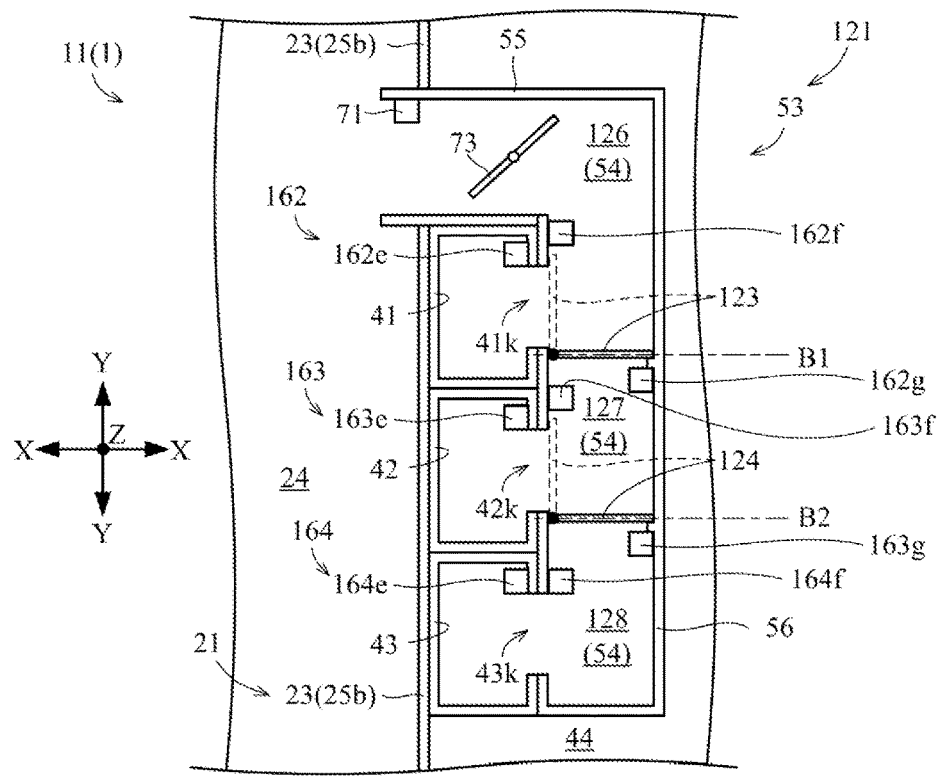
FIG. 21A is a plan view of an arrangement example of another wind speed sensor according to the modification.
Figure 21B:
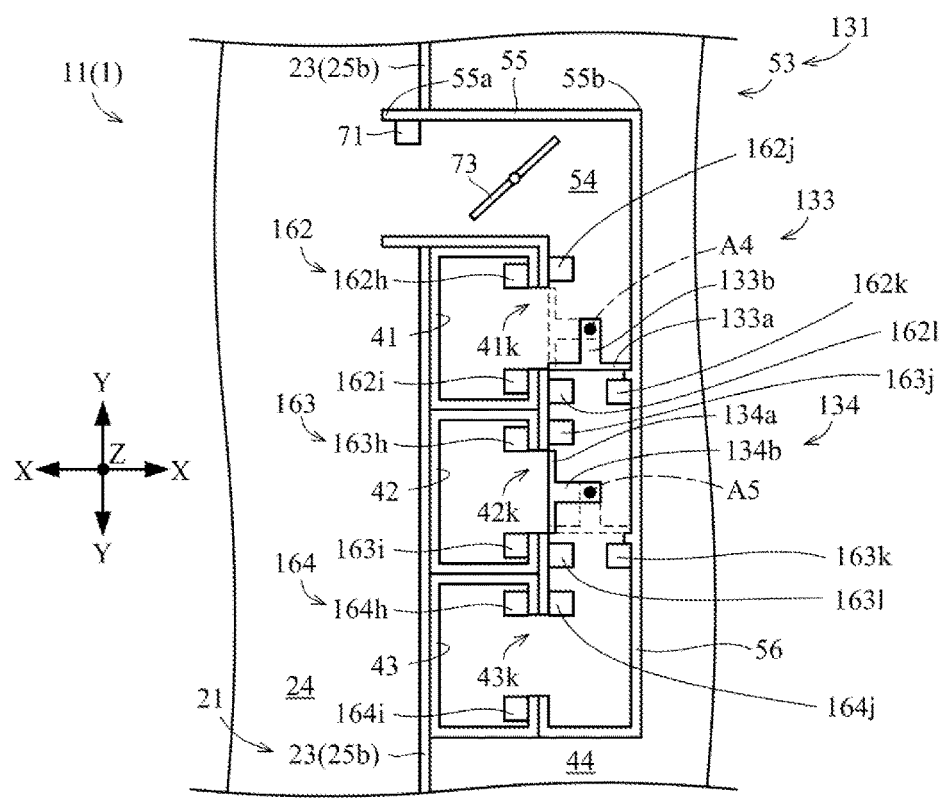
FIG. 21B is a plan view of an arrangement example of another wind speed sensor according to the modification.

The following exemplifies arrangement of the wind speed sensors 162 and 164 with reference to drawings. FIG. 20A is a plan view of an arrangement example of another wind speed sensor added to FIG. 6. FIG. 20B is a plan view of an arrangement example of another wind speed sensor added to FIG. 13. FIG. 21A is a plan view of an arrangement example of another wind speed sensor added to FIG. 15. FIG. 21B is a plan view of an arrangement example of another wind speed sensor added to FIG. 16. Like numerals are used to identify like components which are the same as that in the embodiment, and the components will not particularly be described.

Reference is made to FIG. 20A. The wind speed sensor 162 includes at least either a wind speed sensor 162a or 162b. The wind speed sensors 162a and 162b are each located close to the opening and closing portion 61. The wind speed sensor 162a is located inside of the exhaust pipe 41. The wind speed sensor 162a is located close to the opening 41k. The wind speed sensor 162b is located inside of the switch housing 53. Likewise, the wind speed sensor 163 includes at least either a wind speed sensor 163a or 163b. The wind speed sensor 164 includes at least either a wind speed sensor 164a or 164b.

Reference is made to FIG. 20B. The wind speed sensor 162 includes at least either a wind speed sensor 162c or 162d. The wind speed sensors 162c and 162d are each located close to the opening and closing portion 113. The wind speed sensor 162c is located inside of the treatment housing 23. The wind speed sensor 162d is located inside of the exhaust pipe 41. The wind speed sensor 162d is located close to the opening 41k. Likewise, the wind speed sensor 163 includes at least either a wind speed sensor 163c or 163d. The wind speed sensor 164 includes at least either a wind speed sensor 164c or 164d.

Reference is made to FIG. 21A. The wind speed sensor 162 includes at least any of a wind speed sensors 162e, 162f, and 162g. The wind speed sensors 162e to 162g are each located close to the opening and closing portion 123. The wind speed sensor 162e is located inside of the exhaust pipe 41. The wind speed sensor 162e is located close to the opening 41k. The wind speed sensors 162f and 162g are each located inside of the switch housing 53. As described above, when the opening and closing portion 123 is located at the position to communicate the treatment housing 23 with the exhaust pipe 41, the opening and closing portion 123 blocks the first section 126 from the second section 127. At this time, the wind speed sensor 162g is provided for detecting leakage of gas from the opening and closing portion 123. When the opening and closing portion 123 is located at the position to communicate the treatment housing 23 with the exhaust pipe 41, the wind speed sensor 162g can detect an amount of gas that the opening and closing portion 123 leaks from the first section 126 to the second section 127 suitably. Likewise, the wind speed sensor 163 includes at least any of wind speed sensors 163e, 163f, and 163g. The wind speed sensor 163g is provided for the similar reason as the wind speed sensor 162g. The wind speed sensor 164 includes at least either wind speed sensor 164e or 164f.

Reference is made to FIG. 21B. The wind speed sensor 162 includes at least any of wind speed sensors 162h, 162i, 162j, 162k, and 162l. The wind speed sensors 162h to 162l are each located close to the opening and closing portion 133. The wind speed sensors 162h and 162i are located inside of the exhaust pipe 41. The wind speed sensors 162h and 162i are located close to the opening 41k. The wind speed sensors 162j to 162l are each located inside of the switch housing 53. As described above, when the opening and closing portion 133 is located at the position to communicate the treatment housing 23 with the exhaust pipe 41, the opening and closing portion 133 causes the treatment housing 23 to be blocked from the exhaust pipes 42 and 43. At this time, the wind speed sensors 162k and 162l is provided for detecting leakage of gas from the opening and closing portion 133. When the opening and closing portion 133 is located at the position to communicate the treatment housing 23 with the exhaust pipe 41, the wind speed sensors 162k and 162l can detect an amount of gas that the opening and closing portion 133 leaks from the treatment housing 23 to the exhaust pipes 42 and 43, respectively, suitably. Likewise, the wind speed sensor 163 includes at least any of wind speed sensors 163h, 163i, 163j, 163k, and 163l. The wind speed sensors 163k and 163l are provided for the similar reason as the wind speed sensors 162k and 162l. The wind speed sensor 164 includes at least any of wind speed sensors 164h, 164i, and 164j.

The embodiments and the modifications described above may be variable appropriately by replacing or combining the unit of the embodiments and modifications with other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus, comprising:
a first treatment housing;
a first holder arranged inside of the first treatment housing and configured to hold a substrate;
a first liquid supplying unit arranged inside of the first treatment housing, the first liquid supplying unit including a first nozzle, the first nozzle including a distal end including an outlet and the first liquid supplying unit configured to supply a treating liquid to the substrate held by the first holder from the outlet of the first nozzle;
a first exhaust pipe arranged laterally of the first treatment housing and configured to exhaust gas;
a second exhaust pipe arranged laterally of the first treatment housing and configured to exhaust gas;
a first switching mechanism positioned at a level equal to that of the first treatment housing and configured to switch an exhaust path of the first treatment housing to either the first exhaust pipe or the second exhaust pipe;
a transportation space extending in a first horizontal direction and located adjacent to the first treatment housing;
a transport mechanism arranged in the transportation space and configured to transport a substrate to the first holder; and
a first piping space located adjacent to the first treatment housing and configured to accommodate the first exhaust pipe and the second exhaust pipe, wherein
the first treatment housing and the first piping space align in the first direction, and
the first exhaust pipe and the second exhaust pipe align in a second horizontal direction orthogonal to the first direction,
wherein the first switching mechanism includes:
a first opening and closing portion that is movable between a position to communicate the first treatment housing with the first exhaust pipe and a position to block the first treatment housing from the first exhaust pipe;
a second opening and closing portion that is movable independently of the first opening and closing portion between a position to communicate the first treatment housing with the second exhaust pipe and a position to block the first treatment housing from the second exhaust pipe; and
a switch housing that is connected to the first treatment housing and accommodates the first opening and closing portion and the second opening and closing portion;
the first treatment housing and the switch housing are in contact with each other and are directly connected; and
the first exhaust pipe and the second exhaust pipe are located nearby the first treatment housing,
wherein the switch housing includes
an introducing portion that is connected to the first treatment housing, and extends in the first direction, and
a distributing portion that is connected to the introducing portion, extends in the second direction, is connected to both the first exhaust pipe and the second exhaust pipe, and accommodates both the first opening and closing portion and the second opening and closing portion.

2. The substrate treating apparatus according to claim 1, wherein
the switch housing is positioned at a level equal to or lower than an upper end of the first holder.

3. The substrate treating apparatus according to claim 1, wherein
the switch housing is positioned so as not to overlap the first holder in plan view.

4. The substrate treating apparatus according to claim 1, wherein
the first exhaust pipe extends in a vertical direction, and the second exhaust pipe extends in the vertical direction.

5. The substrate treating apparatus according to claim 1, wherein
at least part of the switch housing is arranged in the first piping space.

6. The substrate treating apparatus according to claim 1, wherein
a separation distance between the introducing portion and the transportation space is smaller than a separation distance between the first holder and the transportation space in plan view.

7. The substrate treating apparatus according to claim 1, further comprising:
a gas supply pipe configured to supply gas to the first treatment housing, and
a second piping space adjacent to the first treatment housing and configured to accommodate the gas supply pipe, wherein
the first piping space, the first treatment housing, and the second piping space align in this order in the first direction.

8. The substrate treating apparatus according to claim 1, further comprising:
a second treatment housing located below the first treatment housing;
a second holder arranged inside of the second treatment housing and configured to hold a substrate;
a second liquid supplying unit arranged inside of the second treatment housing, the second liquid supplying unit including a second nozzle, the second nozzle including a distal end including an outlet and the second liquid supplying unit configured to supply a treating liquid to the substrate held by the second holder from the outlet of the second nozzle;
a second switching mechanism positioned at a level equal to that of the second treatment housing and configured to switch an exhaust path of the second treatment housing to either the first exhaust pipe or the second exhaust pipe; and
wherein the second switching mechanism includes:
a third opening and closing portion that is movable between a position to communicate the second treatment housing with the first exhaust pipe and a position to block the second treatment housing from the first exhaust pipe;
a fourth opening and closing portion that is movable independently of the third opening and closing portion between a position to communicate the second treatment housing with the second exhaust pipe and a position to block the second treatment housing from the second exhaust pipe; and
a second switch housing that is connected to the second treatment housing and accommodates the third opening and closing portion and the fourth opening and closing portion.

9. The substrate treating apparatus according to claim 8, wherein
the second treatment housing is located at a position equal to that of the first treatment housing in plan view,
the second switching mechanism is located at a position equal to that of the first switching mechanism in plan view,
the first exhaust pipe extends in a vertical direction,
the second exhaust pipe extends in the vertical direction, and
the first exhaust pipe and the second exhaust pipe are located adjacent to the second treatment housing.

10. The substrate treating apparatus according to claim 1, further comprising:
a third treatment housing positioned at a level equal to that of the first treatment housing;
a third holder arranged inside of the third treatment housing and configured to hold a substrate;
a third liquid supplying unit arranged inside of the third treatment housing, the third liquid supplying unit including a third nozzle, the third nozzle including a distal end including an outlet and the third liquid supplying unit configured to supply a treating liquid to the substrate held by the third holder from the outlet of the third nozzle;
a third exhaust pipe arranged laterally of the third treatment housing and configured to exhaust gas;
a fourth exhaust pipe arranged laterally of the third treatment housing and configured to exhaust gas;
a third switching mechanism positioned at a level equal to that of the third treatment housing and configured to switch an exhaust path of the third treatment housing to either the third exhaust pipe or the fourth exhaust pipe; and
wherein the third switching mechanism includes:
a fifth opening and closing portion that is movable between a position to communicate the third treatment housing with the third exhaust pipe and a position to block the third treatment housing from the third exhaust pipe;
a sixth opening and closing portion that is movable independently of the fifth opening and closing portion between a position to communicate the third treatment housing with the fourth exhaust pipe and a position to block the third treatment housing from the fourth exhaust pipe; and
a third switch housing that is connected to the third treatment housing and accommodates the fifth opening and closing portion and the sixth opening and closing portion.

11. The substrate treating apparatus according to claim 10, further comprising:
a first pressure sensor configured to measure pressure of gas on a primary side of the first switching mechanism;
a first pressure adjustment mechanism configured to adjust the pressure of gas on the primary side of the first switching mechanism in accordance with a detection result by the first pressure sensor;
a third pressure sensor configured to measure pressure of gas on a primary side of the third switching mechanism; and
a third pressure adjustment mechanism configured to adjust the pressure of gas on the primary side of the third switching mechanism in accordance with a detection result by the third pressure sensor.

12. The substrate treating apparatus according to claim 11, wherein
the first pressure adjustment mechanism and the third pressure adjustment mechanism adjust the pressure of gas on the primary side of the first switching mechanism to be equal to the pressure of gas on the primary side of the third switching mechanism.

13. The substrate treating apparatus according to claim 10, further comprising:
a fifth exhaust pipe that is connected to the first exhaust pipe and the third exhaust pipe, and is configured to exhaust gas in the first exhaust pipe and gas in the third exhaust pipe; and
a sixth exhaust pipe that is connected to the second exhaust pipe and the fourth exhaust pipe, and is configured to exhaust gas in the second exhaust pipe and gas in the fourth exhaust pipe.

14. The substrate treating apparatus according to claim 13, further comprising:
- a fifth pressure sensor configured to measure pressure of gas in the fifth exhaust pipe;
- a fifth pressure adjustment mechanism configured to adjust the pressure of gas in the fifth exhaust pipe in accordance with a detection result by the fifth pressure sensor;
- a sixth pressure sensor configured to measure pressure of gas in the sixth exhaust pipe; and
- a sixth pressure adjustment mechanism configured to adjust the pressure of gas in the sixth exhaust pipe in accordance with a detection result by the sixth pressure sensor.

15. The substrate treating apparatus according to claim 14, wherein
- the fifth pressure sensor is arranged downstream of a connecting position of the first exhaust pipe and the fifth exhaust pipe, and a connecting position of the third exhaust pipe and the fifth exhaust pipe; and
- the sixth pressure sensor is arranged downstream of a connecting position of the second exhaust pipe and the sixth exhaust pipe, and a connecting position of the fourth exhaust pipe and the sixth exhaust pipe.

16. The substrate treating apparatus according to claim 10, wherein
- the third exhaust pipe and the fourth exhaust pipe are located nearby the third treatment housing.

17. The substrate treating apparatus according to claim 1,
- the first liquid supplying unit is capable of supplying a first treating liquid and a second treating liquid;
- the first opening and closing portion switches the exhaust path of the first treatment housing to the first exhaust pipe when the first liquid supplying unit supplies the first treating liquid; and
- the second opening and closing portion switches the exhaust path of the first treatment housing to the second exhaust pipe when the first liquid supplying unit supplies the second treating liquid.

18. The substrate treating apparatus according to claim 1, wherein
the switch housing penetrates the first treatment housing.

19. The substrate treating apparatus according to claim 1, wherein
the first exhaust pipe and the second exhaust pipe are located between the first treatment housing and the distributing portion in plan view.

* * * * *